United States Patent
Karashima et al.

(10) Patent No.: US 7,242,823 B2
(45) Date of Patent: Jul. 10, 2007

(54) OPTICAL TRANSMISSION CHANNEL BOARD, BOARD WITH BUILT-IN OPTICAL TRANSMISSION CHANNEL, AND DATA PROCESSING APPARATUS

(75) Inventors: Seiji Karashima, Osaka (JP); Seiichi Nakatani, Osaka (JP); Yasuhiro Sugaya, Osaka (JP); Toshiyuki Asahi, Osaka (JP); Takashi Ichiryu, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/041,101

(22) Filed: Jan. 21, 2005

(65) Prior Publication Data

US 2005/0196095 A1  Sep. 8, 2005

(30) Foreign Application Priority Data

Jan. 22, 2004 (JP) ............................. 2004-014863
Jan. 22, 2004 (JP) ............................. 2004-014966
Jan. 22, 2004 (JP) ............................. 2004-014968

(51) Int. Cl.
 *G02B 6/12* (2006.01)
 *H01L 29/00* (2006.01)
(52) U.S. Cl. ............................. 385/14; 385/49; 257/499
(58) Field of Classification Search ................. 385/14, 385/49
See application file for complete search history.

(56) References Cited

U.S. PATENT DOCUMENTS

| 5,195,154 | A | * | 3/1993 | Uchida .................. 385/88 |
| 5,621,837 | A | | 4/1997 | Yamada et al. |
| 6,233,376 | B1 | * | 5/2001 | Updegrove .................. 385/14 |
| 6,360,043 | B1 | * | 3/2002 | Bostock et al. .............. 385/49 |
| 6,389,202 | B1 | * | 5/2002 | Delpiano et al. ............. 385/49 |
| 6,438,281 | B1 | * | 8/2002 | Tsukamoto et al. ........... 385/14 |
| 6,574,379 | B2 | * | 6/2003 | Miyazaki ........................ 385/1 |
| 6,905,569 | B2 | * | 6/2005 | Kim et al. .................. 156/293 |
| 2002/0131727 | A1 | * | 9/2002 | Reedy et al. ................. 385/88 |
| 2004/0206988 | A1 | * | 10/2004 | Glebov ....................... 257/244 |
| 2004/0264837 | A1 | * | 12/2004 | Ogawa ......................... 385/14 |
| 2005/0196094 | A1 | * | 9/2005 | Glebov et al. ................ 385/14 |
| 2005/0196095 | A1 | * | 9/2005 | Karashima et al. ........... 385/14 |

FOREIGN PATENT DOCUMENTS

| JP | 08-078657 | 3/1996 |
| JP | 2000-066034 | 3/2000 |
| JP | 2000-340907 | 12/2000 |
| JP | 2003-322740 | 11/2003 |
| JP | 2004-146621 | 5/2004 |

* cited by examiner

*Primary Examiner*—Michelle Connelly-Cushwa
*Assistant Examiner*—Rhonda S. Peace
(74) *Attorney, Agent, or Firm*—RatnerPrestia

(57) ABSTRACT

An optical transmission board is provided. The optical transmission board includes an optical transmission channel, a retention board for retaining the optical transmission channel and circuit patterns. The circuit patterns are formed on the retention board and a part of the circuit patterns is used as an electric circuit. The optical transmission channel is positionally regulated by the part of the circuit patterns.

8 Claims, 45 Drawing Sheets

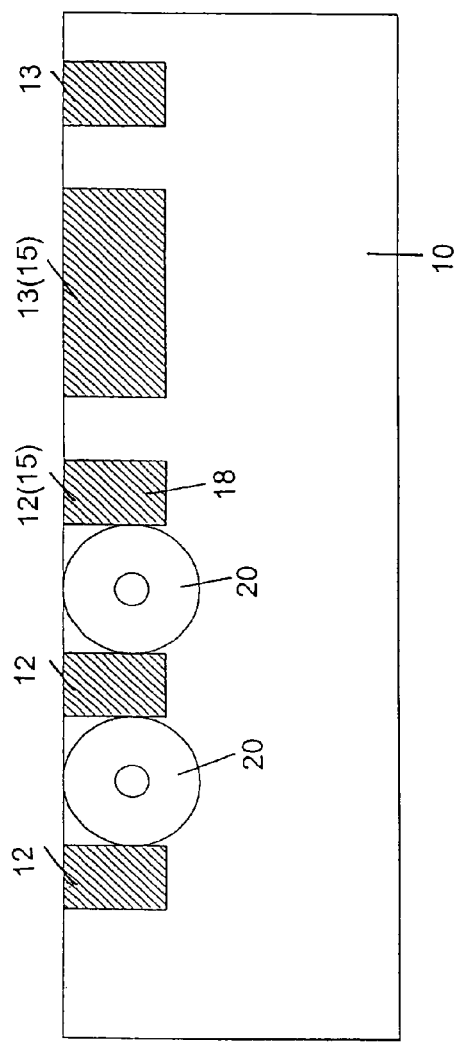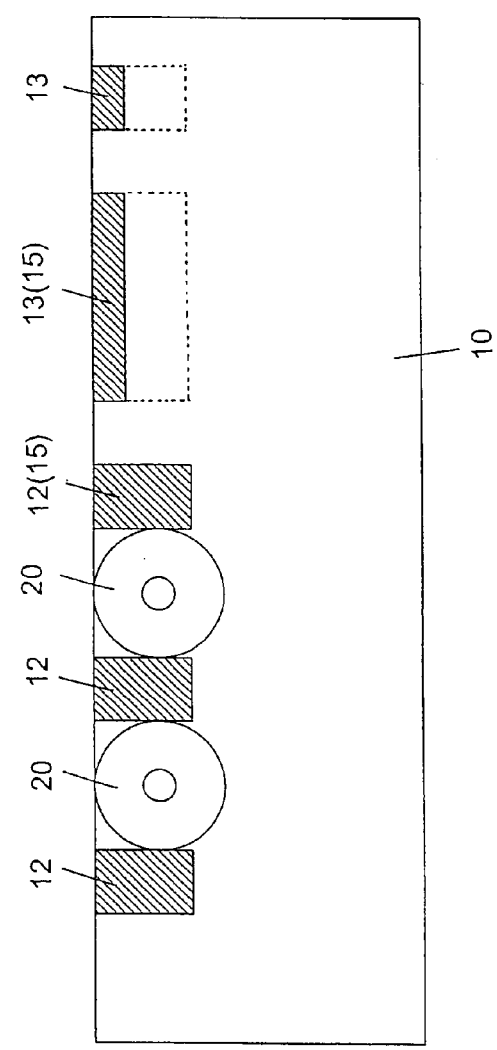

OPTICAL TRANSMISSION CHANNEL BOARD, BOARD WITH BUILT-IN OPTICAL TRANSMISSION CHANNEL, AND DATA PROCESSING APPARATUS

BACKGROUND OF THE INVENTION

1. Field of the Invention

The present invention relates to a fabrication method for an optical transmission channel board, an optical transmission channel board, a board with built-in optical transmission channel, a fabrication method for a board with built-in optical transmission channel, and a data processing apparatus.

2. Related Art of the Invention

With recent progress in optical communications and optical information processing, optical circuit mounting technology permitting high-density and economical integration of optical components is increasingly important, and so is the role that optical modules play. An example of a prior art optical module is shown in FIG. 50 (see JP-A-H8-78657).

As shown in FIG. 50, a prior art optical module 1000 comprises a Si substrate (Si terrace) 1101, optical fibers 1102, and a semiconductor laser (optical element) 1105. Guide grooves (V grooves) 1104 a formed in the Si substrate 1101. Each optical fiber 1102 is fixed along each guide groove 1104. Electric wirings 1106 and positioning reference planes (positioning markers) 1103a, 1103b, and 1103c are formed in the Si substrate 1101. Using these positioning reference planes 1103a, 1103b, and 1103c, the semiconductor laser 1105 is mounted on the Si substrate 1101, and connected to the electric wirings 1106. That is, in the optical module 1000, the optical fibers 1102 and the semiconductor laser (LD) 1105 are integrated on the Si substrate 1101. This module is driven through the electric wirings 1106. In the configuration shown in FIG. 50, the guide grooves 1104 can be fabricated with sufficient accuracy on the basis of the good workability of the Si substrate 1101. This permits easy integration of the optical fibers 1102 with the optical element such as the semiconductor laser (LD) 1105 and a photo detector (PD).

FIG. 51 shows another optical module 2000 in which an optical waveguide 1126 in place of an optical fiber is formed on a Si substrate 1101 (see JP-A-H8-78657).

In the optical module 2000 shown in FIG. 51, the optical waveguide 1126 formed on the Si substrate 1101 is optically connected to an opto-semiconductor element 1127 mounted via solder bumps 1128 in a recess formed on the Si substrate 1101.

The mounting hierarchy in a communication system apparatus 3000 for performing optical communications is described below with reference to FIG. 52. The communication system apparatus 3000 shown in FIG. 52 is constructed according to a method called bookshelf mounting. This method has an advantage in economical efficiency and packaging density, and hence is used generally.

Further description is given below.

A component of the communication system apparatus 3000 is a semiconductor element (LSI chip) 130. A plurality of semiconductor elements 130 are used and constitute an MCM (multi-chip module) 1131. The MCM 1131 is mounted on a board (printed circuit board) 1133, so that a board assembly is obtained. A plurality of board assemblies are accommodated in a sub-rack 1135. A plurality of sub-racks 1135 are accommodated in a cabinet 1137, so that the communication system apparatus 3000 is constructed.

The mounting hierarchy of bookshelf mounting is classified into six levels. That is, level 0 indicates a distance within a chip (~1 mm). Level 1 indicates a distance between chips (~1 cm). Level 2 indicates a distance within a board (~10 cm). Level 3 indicates a distance within a sub-rack (~1 m). Level 4 indicates a distance between sub-racks (~10 m). Level 5 indicates a distance between apparatuses or systems (~100 m) (each quantity between parentheses indicates a transmission distance). Among these levels, in the range of transmission distance exceeding 1 m (level 3, level 4, or higher), optical fibers have an advantage as a transmission medium. Thus, the combination of an optical module (such as one shown in FIG. 50) and an optical fiber is used advantageously. In contrast, transmission within a board (level 2) is performed generally using a copper circuit pattern on the printed circuit board. That is, such transmission is performed using electricity, not using light.

On the other hand, JP-A-2000-340907 discloses a wiring board (printed circuit board) that has built-in optical fibers. The wiring board disclosed in JP-A-2000-340907 is shown in FIGS. 53, 54(a), and 54(b).

The wiring board 4000 shown in FIG. 53 comprises an insulating board 1201. The insulating board 1201 is composed of a plurality of insulating layers 1202. Wiring circuit layers 1203 are formed on the insulating layers 1202. Wiring circuit layers 1203 located on different layers are connected through via hole conductors 1204. Optical waveguide bodies 1205 having a fiber shape (such as optical fibers) are embedded in an insulating layer 1202a selected from a plurality of the insulating layers.

As shown in the plan view of FIG. 54(a), the optical waveguide bodies 1205 having a fiber shape are embedded inside an insulating board 1201, so that an optical waveguide circuit is constructed in which optical signals can be transmitted through these optical waveguide bodies 1205. FIG. 54(b) is a sectional view taken along line X-X' in FIG. 54(a). The inside of the insulating board 1201 of FIG. 54(a) is illustrated as a schematic diagram for general description purpose, and is not necessarily in agreement with the sectional view of FIG. 53.

As shown in FIGS. 54(a) and 54(b), an optical connector 1206 is integrally attached to an end of the optical waveguide circuit in one side of the insulating board 1201. Optical-to-electric signal conversion elements 1207 capable of converting an optical signal into an electric signal is attached in the inside or side portions of the insulating board 1201. Electric signals converted from the optical signals by the optical-to-electric signal conversion elements 1207 are electrically transferred through the wiring circuit layers 1208 (corresponding to the wiring circuits 1203 shown in FIG. 53) and the via hole conductors 1204 arranged inside the insulating board 1201, to an electronic element or the electric connector 1209 mounted on the insulating board 1201.

JP-A-2000-66034 discloses an optical wiring board permitting the wiring of a large number of optical fibers.

The optical wiring board disclosed in JP-A-2000-66034 is shown in FIG. 55. In the optical wiring board 5000 of FIG. 55, one or two or more optical fibers 1311 are mounted on the board using the technique of a picture drawn with a single stroke of a pencil. In the optical wiring board 5000, the optical fibers 1311 are stacked in a certain part.

The optical wiring board 5000 shown in the figure has a four-layer structure. The optical fibers 1311 are arranged on boards 1312 and 1312'. End portions 1313 of the optical fibers 1311 are arranged in line on the same plane, while end portions 1314 are multi-layered.

When an optical module such as the optical module 1000 shown in FIG. 50 is to be fabricated, in a prior art fabrication method, the electric wirings 1106 are fabricated on the board 1101 by etching or the like, and then the guide grooves 1104 are fabricated by machining or the like. As such, the fabrication processes for the electric wirings 1106 and for the guide grooves 1104 are completely separated. This has caused complicated fabrication processes, and hence caused an increase in time and cost.

Further, at a glance of the optical module 1000 of FIG. 50, the module might seem to be fabricated easily. Nevertheless, in practice, centering is necessary between each of the optical fibers 1102 and the optical element 1105. This centering process is notably complicated. The "centering" described here indicates the process of aligning the optical axes of each optical transmission channel (optical fiber) and the optical element (such as semiconductor laser).

For example, when the optical fibers 1102 are single-mode fibers, only a discrepancy in the submicron order is allowable between each optical fiber 1102 and the optical element 1105. Nevertheless, considering the deviation (tolerance) occurring in the fabrication of the guide grooves (V grooves) 104 in the Si substrate 101 and the deviation (tolerance) occurring in the fabrication of the optical element positioning reference planes 1103a, 1103b, and 1103c formed together with the electric wirings 1106, it is concluded that the mounting of the optical element 1105 merely based on the alignment with the optical element positioning reference planes 1103a, 1103b, and 1103c is insufficient because the discrepancy can exceed the tolerance between each optical fiber 1102 and the optical element 1105. Thus, the centering is unavoidable.

Also in the configuration of FIG. 51, electric wirings (not shown) located under the solder bumps 1128 are fabricated in a separate process from that for the optical waveguide 1126. Thus, a similar problem a rises concerning the discrepancy between the optical fiber 1102 and the optical element 1105.

Even if the problem of discrepancy between the optical fiber 1102 and the optical element 1105 could not arise in the optical module 2000 shown in FIG. 51, a higher cost is caused in the fabrication of the optical waveguide 1126 on the Si substrate 1101 in comparison with the case that an optical fiber 1102 is used. Thus, another problem arises concerning economical efficiency.

From the perspective of economical efficiency, the use of copper circuit patterns of a printed circuit board is advantageous, for example, in the within-the-board transmission (level 2) in the communication system apparatus 3000 shown in FIG. 52. Nevertheless, this causes a problem that the upper limit is reduced in the transmission speed. This is because despite that GHz-level transmission is achieved in optical interconnection, merely MHz-level transmission is achieved in electric interconnection.

Further, in the wiring board 4000 shown in FIGS. 53 and 54, centering is necessary between each optical waveguide body 1205 embedded in the insulating board 1201 and each optical-to-electric signal conversion element 1207. This centering process is complicated, and hence increases the cost.

Furthermore, in the within-the-board transmission in the communication system apparatus 3000 shown in FIG. 52, if the electric interconnection were replaced with optical interconnection in order that the problem of transmission speed could be resolved, an unacceptably large number of optical fibers or optical waveguides would need to be arranged on the board. Thus, another problem would arise concerning the actual device structure. More specifically, the board surface would be filled with optical fibers or the like. This causes a difficulty in the handling, as well as an increase in the board size and in the rate of failure such as disconnection in the optical fibers or the like.

Thus, in order that a large number of optical fibers or optical transmission channels should be arranged with in a limited region, the optical fibers or the optical transmission channels could be constructed in multi-stage. Nevertheless, the method for this multi-stage construction is a difficult problem to be devised in the case of the actual configuration of the optical modules 1000 and 2000 shown in FIGS. 50 and 51. A new way of thinking is necessary for solving this problem. That is, in the optical module 1000 shown in FIG. 50, the guide grooves (V grooves) 1104 are formed in the Si substrate 1101 so that the optical fibers 1102 are fixed in the guide grooves 1104. Thus, the configuration of single-stage arrangement is unavoidable in principle. On the other hand, in the optical module 2000 shown in FIG. 51, the optical waveguide 1126 is formed on the Si substrate 1101. Thus, similarly, the configuration of single-stage arrangement is unavoidable in principle.

Further, the wiring board 4000 shown in FIGS. 53 and 54 is disclosed in the case that a single insulating layer 1202a is used and that the optical waveguide bodies 1205 are embedded therein. In contrast, if a plurality of such layers were to be provided in the configuration, a new problem would arise in the method of attaching the optical-to-electric signal conversion elements 1207. In addition, JP-A-2000-340907 does not disclose the case that the optical waveguide bodies 1205 presently embedded in the insulating board 1201 are arranged in a different hierarchy from that of the optical-to-electric signal conversion elements 1207. Accordingly, no disclosure or indication is provided concerning the method for precisely adjusting their positions for their optical connection. Further, although the optical wiring board 5000 shown in FIG. 55 is a board with built-in optical fibers, no disclosure or indication is provided concerning the configuration that optical-to-electric signal conversion elements 1207 are attached directly to all the optical fibers of the optical wiring board 5000. Thus, it should be notably difficult to precisely adjust the positions for optical connection.

With considering the above-mentioned problems in the prior art, a purpose of the present invention is to provide: a fabrication method for an optical transmission channel board which can be fabricated in a simpler fabrication process; such an optical transmission channel board; and a data processing apparatus employing this optical transmission channel board. Another purpose of the present invention is to provide a fabrication method for an optical transmission channel board which needs no centering process or merely a simpler centering process; such an optical transmission channel board; and a data processing apparatus employing this optical transmission channel board.

Yet another purpose of the present invention is to provide a fabrication method for an optical transmission channel board which can be fabricated at a lower cost.

Another purpose of the present invention is to provide a board with built-in optical transmission channel on which an optical element (such as a semiconductor laser) can be mounted, and on which a large number of optical transmission channels (such as optical fibers) can be mounted efficiently. At the same time, a purpose of the present invention is to provide a data processing apparatus employing such a board with built-in optical transmission channel and a fabrication method for such a board with built-in optical transmission channel.

SUMMARY OF THE INVENTION

The 1$^{st}$ aspect of the present invention is a fabrication method for an optical transmission channel board comprising:

a first step of forming on a substrate a layer containing an electrically conductive material; and a second step of patterning said layer containing an electrically conductive material formed on said substrate, and thereby forming circuit patterns at least a part of which is used as an electric circuit and at least a part of which positionally regulates an optical transmission channel.

The 2$^{nd}$ aspect of the present invention is the fabrication method for an optical transmission channel board according to the 1$^{st}$ aspect of the present invention, wherein said circuit pattern which positionally regulates said optical transmission channel forms guide walls for performing the regulation.

The 3$^{rd}$ aspect of the present invention is the fabrication method for an optical transmission channel board according to the 1$^{st}$ aspect of the present invention, wherein said second step of forming said circuit patterns is a step of forming circuit patterns a part of which is used as an optical element marker for positioning an optical element mounted on said optical transmission channel board.

The 4$^{th}$ aspect of the present invention is the fabrication method for an optical transmission channel board according to the 3$^{rd}$ aspect of the present invention, wherein said second step of forming said circuit patterns is a step of forming circuit patterns used as two or all selected from said electric circuit, said guide walls, and said optical element marker.

The 5$^{th}$ aspect of the present invention is the fabrication method for an optical transmission channel board according to the 1$^{st}$ aspect of the present invention, further comprising an A step of stacking after said second step a guide layer onto said circuit pattern which positionally regulates said optical transmission channel.

The 6$^{th}$ aspect of the present invention is the fabrication method for an optical transmission channel board according to the 1$^{st}$ aspect of the present invention, further comprising a B step of machining after said second step an upper part of said circuit pattern used as said electric circuit.

The 7$^{th}$ aspect of the present invention is the fabrication method for an optical transmission channel board according to the 6$^{th}$ aspect of the present invention, further comprising a C step of stacking after said first step a layer composed of a material different from that of said layer containing said electrically conductive material, onto said layer containing said electrically conductive material, wherein said B step is a step of machining said layer composed of the different material.

The 8$^{th}$ aspect of the present invention is the fabrication method for an optical transmission channel board according to the 2$^{nd}$ aspect of the present invention, further comprising:

a third step of arranging an optical transmission channel on the basis of said circuit pattern used as guide walls;

a fourth step of forming a retention board for retaining an optical transmission channel on said substrate, in such a manner that said circuit pattern and said optical transmission channel are covered; and a fifth step of removing said substrate from said retention board.

The 9$^{th}$ aspect of the present invention is the fabrication method for an optical transmission channel board according to the 1$^{st}$ aspect of the present invention, wherein said second step is a step of etching said layer containing said electrically conductive material by using a mask corresponding to said circuit patterns, and thereby forming said circuit patterns.

The 10$^{th}$ aspect of the present invention is the fabrication method for an optical transmission channel board according to the 2$^{nd}$ aspect of the present invention, wherein said optical transmission channel is an optical fiber, and wherein a length of said guide walls measured in a perpendicular direction relative to a surface of said retention board is greater than a radius of said optical fiber.

The 11$^{th}$ aspect of the present invention is the fabrication method for an optical transmission channel board according to the 10$^{th}$ aspect of the present invention, wherein said guide walls are formed with predetermined spacing such that said optical transmission channel substantially contacts with said guide walls.

The 12$^{th}$ aspect of the present invention is the fabrication method for an optical transmission channel board according to the 4$^{th}$ aspect of the present invention, further comprising a sixth step of mounting an optical element on said circuit pattern such that said optical element is arranged above said optical transmission channel, wherein said optical element is a laser element or a photo receiving element.

The 13$^{th}$ aspect of the present invention is an optical transmission channel board comprising:

an optical transmission channel;

a retention board for retaining said optical transmission channel; and circuit patterns which are formed on said retention board and a part of which is used as an electric circuit; wherein said optical transmission channel is positionally regulated by said part of circuit patterns.

The 14$^{th}$ aspect of the present invention is the optical transmission channel board according to the 13$^{th}$ aspect of the present invention, wherein said optical transmission channel is arranged between guide walls formed under said circuit pattern.

The 15$^{th}$ aspect of the present invention is the optical transmission channel board according to the 13$^{th}$ aspect of the present invention, wherein said circuit patterns are formed in a predetermined thickness along a thickness direction of said retention board, and wherein said optical transmission channel is arranged in middle of said circuit pattern serving as guide walls.

The 16$^{th}$ aspect of the present invention is the optical transmission channel board according to the 14$^{th}$ or the 15$^{th}$ aspect of the present invention, wherein said optical transmission channel is arranged such as to contact substantially with said guide walls.

The 17$^{th}$ aspect of the present invention is the optical transmission channel board according to the 13$^{th}$ aspect of the present invention, wherein said optical transmission channel is embedded in said retention board, while an uppermost part of said optical transmission channel is substantially arranged in plane with an upper surface of said retention board.

The 18$^{th}$ aspect of the present invention is the optical transmission channel board according to the 13$^{th}$ aspect of the present invention, wherein said circuit pattern has a portion lower than an upper surface of said retention board.

The 19$^{th}$ aspect of the present invention is the optical transmission channel board according to the 18$^{th}$ aspect of the present invention, wherein said portion lower than an upper surface of said retention board is a land part.

The 20th aspect of the present invention is the optical transmission channel board according to the 13th aspect of the present invention, wherein said optical transmission channel is an optical fiber.

The 21st aspect of the present invention is a data processing apparatus comprising:

an optical transmission channel board according to the 13th aspect of the present invention;

at least one semiconductor element selected from a memory LSI and a logic LSI mounted on said optical transmission channel board; and a laser element and/or a photo receiving element mounted on said part of circuit patterns; wherein said optical transmission channel board has a plurality of said optical transmission channels.

The 22nd aspect of the present invention is a fabrication method for an optical transmission channel board comprising:

a first step of embedding, on a retention board, circuit patterns formed by patterning a layer containing an electrically conductive material, wherein at least a part of said circuit patterns is used as an electric circuit, while at least a part of said circuit patterns is used as an optical transmission channel marker; and a second step of removing said circuit pattern for an optical transmission channel marker from said retention board, and thereby fabricating a groove for said optical transmission channels on said retention board.

The 23rd aspect of the present invention is a fabrication method for an optical transmission channel board comprising:

a first step of embedding, on a retention board, circuit patterns formed by patterning a layer containing an electrically conductive material, wherein at least a part of said circuit patterns is used as an electric circuit, while at least a part of said circuit patterns is used as an optical transmission channel marker; and a second step of removing a part of board portion located between adjustment portions of said circuit pattern, and thereby fabricating a groove for said optical transmission channel on said retention board.

The 24th aspect of the present invention is a fabrication method for an optical transmission channel board according to the 22nd or the 23rd aspect of the present invention, wherein said first step of embedding said circuit patterns is a step of forming a circuit pattern used as an optical element marker for positioning an optical element.

The 25th aspect of the present invention is the fabrication method for an optical transmission channel board according to the 24th aspect of the present invention, wherein said first step of embedding said circuit patterns is a step of forming circuit patterns a part of which is used as said electric circuit and said optical element marker, or alternatively apart of which is used as said optical element marker and said optical transmission channel marker.

The 26th aspect of the present invention is the fabrication method for an optical transmission channel board according to the 24th aspect of the present invention, wherein said first step of embedding said circuit patterns is a step of forming circuit patterns a part of which is used as two or all selected from said electric circuit, said optical element marker, and said optical transmission channel marker.

The 27th aspect of the present invention is the fabrication method for an optical transmission channel board according to the 24th aspect of the present invention, wherein said second step is a step of fabricating said groove by etching using a mask corresponding to said part of board portion.

The 28th aspect of the present invention is the fabrication method for an optical transmission channel board according to the 22nd or the 23rd aspect of the present invention, wherein said layer containing an electrically conductive material is composed of a composite material containing resin and inorganic filler.

The 29th aspect of the present invention is the fabrication method for an optical transmission channel board according to the 22nd or the 23rd aspect of the present invention, wherein said first step is a step of forming said circuit patterns by etching said layer containing an electrically conductive material by using a mask corresponding to said circuit patterns.

The 30th aspect of the present invention is the fabrication method for an optical transmission channel board according to the 22nd or the 23rd aspect of the present invention, further comprising a third step of arranging an optical transmission channel in said groove.

The 31st aspect of the present invention is the fabrication method for an optical transmission channel board according to the 30th aspect of the present invention, further comprising a fourth step of mounting an optical element in said circuit pattern such that said optical element is arranged above said optical transmission channel, wherein said optical element is at least any one of a laser element and a photo receiving element.

The 32nd aspect of the present invention is the fabrication method for an optical transmission channel board according to any one of the 1st, 22nd, and the 23rd aspects of the present invention, wherein said optical transmission channel is an optical fiber.

The 33rd aspect of the present invention is a board with built-in optical transmission channel comprising:

a board;

circuit patterns formed on said board and including a plurality of wirings; and a plurality of optical transmission channels embedded in said board; wherein at least a certain plurality of said optical transmission channels are arranged in a thickness direction of said board, and wherein in a vicinity of an end portion of each of said optical transmission channels, an optical element electrically connected to said circuit pattern can be optically connected to said optical transmission channel.

The 34th aspect of the present invention is the board with built-in optical transmission channel according to the 33rd aspect of the present invention, wherein said board is a multilayered board containing a plurality of sub-boards, and wherein in each of said sub-boards, a single optical transmission channel or a plurality of said optical transmission channels are arranged in said thickness direction.

The 35th aspect of the present invention is the board with built-in optical transmission channel according to the 34th aspect of the present invention, wherein a certain plurality of said optical transmission channels are arranged also in a direction substantially perpendicular to said thickness direction.

The 36th aspect of the present invention is the board with built-in optical transmission channel according to the 33rd aspect of the present invention, wherein a plurality of said optical transmission channels are arranged in said thickness direction within a layer of said board.

The 37th aspect of the present invention is the board with built-in optical transmission channel according to the 36th aspect of the present invention, wherein a certain plurality of said optical transmission channels are arranged also in a direction substantially perpendicular to said thickness direction.

The 38th aspect of the present invention is the board with built-in optical transmission channel according to the 33rd aspect of the present invention, wherein said optical transmission channels are embedded between a plurality of said wirings.

The 39th aspect of the present invention is the board with built-in optical transmission channel according to the 33rd aspect of the present invention, wherein each of said optical transmission channels is an optical fiber.

The 40th aspect of the present invention is the board with built-in optical transmission channel according to the 34th aspect of the present invention, wherein said board is composed of a composite material containing resin and inorganic filler.

The 41st aspect of the present invention is the board with built-in optical transmission channel according to the 33rd aspect of the present invention, wherein said optical element is a vertical-cavity surface-emitting laser.

The 42nd aspect of the present invention is the board with built-in optical transmission channel according to the 41st aspect of the present invention, where in a light-emitting surface of said vertical-cavity surface-emitting laser and a surface of said board are mutually opposing, and wherein a plurality of light emission points are arranged in said light-emitting surface.

The 43rd aspect of the present invention is the board with built-in optical transmission channel according to the 33rd aspect of the present invention, wherein said end portion of each of said optical transmission channels is cut substantially into an angle of 45°.

The 44th aspect of the present invention is the board with built-in optical transmission channel according to the 34th aspect of the present invention, wherein said vicinity of said end portion of each of said optical transmission channels is provided with an inclined surface for optically connecting said end portion of said optical transmission channel with said optical element.

The 45th aspect of the present invention is the data processing apparatus comprising:

a board with built-in optical transmission channel according to the 33rd aspect of the present invention;

said optical element arranged on said board with built-in optical transmission channel; and a semiconductor element mounted on said board with built-in optical transmission channel.

The 46th aspect of the present invention is a fabrication method for a board with built-in optical transmission channel comprising:

a first step of forming all or a part of circuit patterns;

a second step of forming guiding means for positioning an optical transmission channel, wherein said forming in said second step is carried out using said circuit patterns or alternatively at the same time as the formation of at least a part of said circuit patterns;

a third step of embedding said optical transmission channel using said guiding means, and thereby forming a sub-board; and a fourth step of preparing a plurality of sub-boards mentioned above, and then stacking a plurality of said sub-boards.

The 47th aspect of the present invention is a fabrication method for a board with built-in optical transmission channel comprising:

a first step of forming all or a part of circuit patterns;

a second step of forming guiding means for positioning an optical transmission channel, wherein said forming in said second step is carried out using said circuit patterns or alternatively at the same time as the formation of at least a part of said circuit patterns; and a third step of embedding a plurality of above-mentioned optical transmission channels using said guiding means, and thereby forming a board; wherein in said third step, a certain plurality of said optical transmission channels are arranged in a thickness direction of said board.

The 48th aspect of the present invention is the fabrication method for a board with built-in optical transmission channel according to the 46th or the 47th aspect of the present invention, wherein said first step and said second step are substantially simultaneously carried out, and wherein said guiding means is formed at the same time as the formation of a predetermined wiring included in said circuit patterns.

The 49th aspect of the present invention is the fabrication method for a board with built-in optical transmission channel according to the 46th or the 47th aspect of the present invention, wherein said optical transmission channel is an optical fiber one end face of which is an inclined surface, and wherein said optical fiber is embedded such that said inclined surface is arranged in a direction opposite to a surface of said board where an optical element electrically connected to said circuit pattern is mounted.

An example of a board with built-in optical transmission channel according to the present invention described above comprises: circuit patterns formed on a board; and a plurality of optical transmission channels embedded in the board, wherein a plurality of the optical transmission channels are arranged in the thickness direction of the board. Thus, an optical element can be mounted above the vicinity of the end portion of each optical transmission channel, so that a large number of optical transmission channels can be arranged efficiently. This arrangement realizes a fabrication method for a board with built-in optical transmission channel permitting optical connection with an optical element and realizing efficient arrangement of a large number of optical transmission channels.

An aspect of the present invention provides: an optical transmission channel board which can be fabricated in a simpler fabrication process; its fabrication method; and a data processing apparatus employing this optical transmission channel board.

Another aspect of the present invention provides: an optical transmission channel board which simplifies a centering process between an optical element and an optical transmission channel end fewer, or does not need a centering process; its fabrication method; and a data processing apparatus employing an optical transmission channel board. Yet another aspect of the present invention provides the advantage of permitting optical connection with an optical element and realizing efficient arrangement of a large number of optical transmission channels.

BRIEF DESCRIPTION OF THE DRAWINGS

FIG. 10(a) is a sectional view showing a modification of an optical transmission channel board 100 according to the present invention.

FIG. 10(b) is a sectional view showing a modification of an optical transmission channel board 100 according to the present invention.

DESCRIPTION OF REFERENCE NUMERALS

Figure 1:
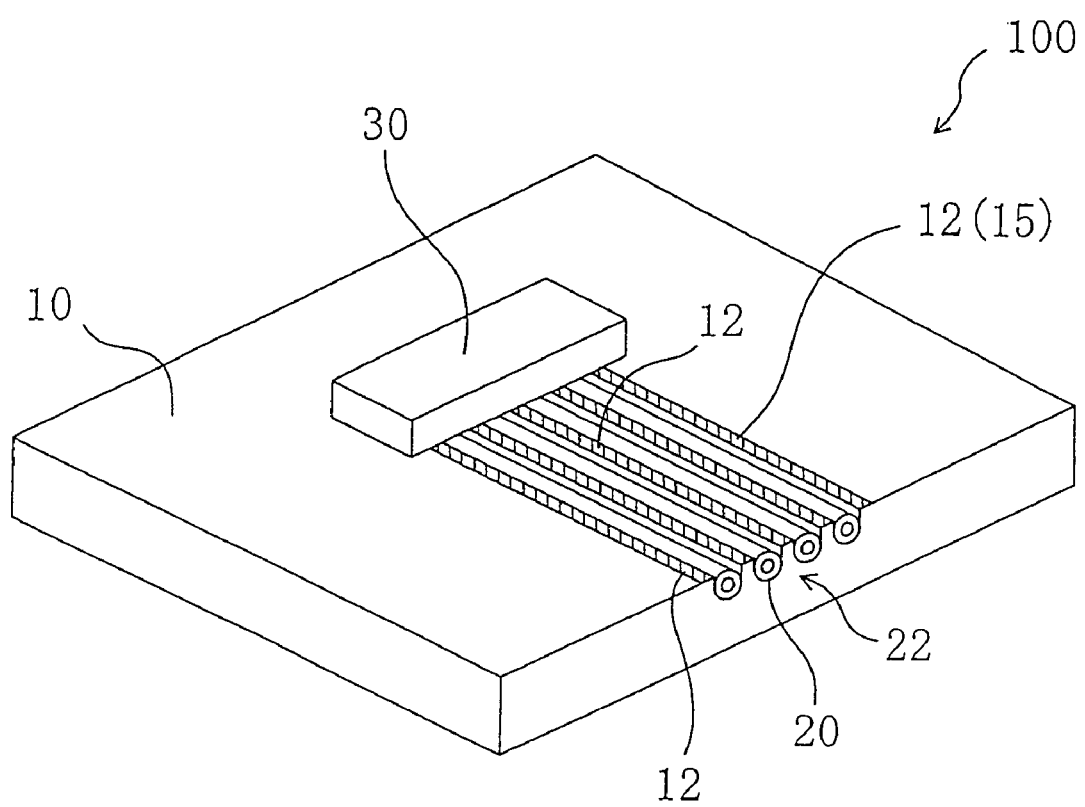
FIG. 1 is a perspective view schematically showing a configuration of an optical transmission channel board 100 according to Embodiment 1 of the present invention.

10 Board
11 Reflection surface
12 Wiring
13 Wiring
15 Circuit pattern
16, 17 Guide layer
18 Guide wall
20 Optical fiber
21 End face
22 Groove
23 Branching section
25 Light (optical signal)
26 Level difference
28 Land
30 Optical element
32 Connection member
34 Interposer
36 Mirror
37 Stopper
40 Carrier sheet
42 Metal layer
50, 51, 52, 53 Mask
60 Edge emitting type element
100 Optical transmission channel board
110 Board
111 Reflection surface
112 Wiring (groove-use wiring)
113 Wiring
120 Optical fiber
121 End face
122 Groove
123 Branching section
125 Light (optical signal)
130 Optical element
131 Electronic components
132 Connection member
134 Interposer
140 Carrier sheet
142 Metal layer
150, 51 Mask
200 Optical transmission channel board
210 Board
210a, 210b Sub-board
211 Reflection surface
212 Wiring
213 Wiring
215 Circuit pattern
216, 217 Guide layers
218 Guide wall
220 Optical transmission channel (optical fiber)
221 End face
222 Groove
223 Branching section
225 Light (optical signal)
227 Optical connector
230 Optical element
232 Connection member
234 Interposer
235 MCM
236 Via hole (interlayer connection member)
237 Electric input and output section
240 Carrier sheet
242 Metal layer
250, 251, 252, 253 Mask
300 Board with built-in optical fiber
1000 Optical module
2000 Optical module
3000 Communication system apparatus
4000 Wiring board
5000 Optical wiring board

PREFERRED EMBODIMENTS OF THE INVENTION

Embodiments of the present invention are described below with reference to the drawings. For the simplicity of description of the drawings, components having substantially the same function are designated by like reference numerals. It should be noted that the present invention is not limited to the embodiments described below.

Embodiment 1

An optical transmission channel board according to Embodiment 1 and its fabrication method are described below with reference to FIGS. 1-4.

FIG. 1 is a perspective view schematically showing the configuration of an optical transmission channel board 100 of Embodiment 1.

As shown in FIG. 1, the optical transmission channel board 100 of Embodiment 1 comprises: a board 10; and circuit patterns 15 including a plurality of wirings 12 formed on the board 10. A plurality of optical fibers 20 are arranged between each the wiring 12 of the circuit patterns 15, respectively. An optical transmission channel of the present invention indicates an optical fiber 20 of Embodiment 1. Thus, Embodiment 1 is described for the case of optical fibers. However, an "optical transmission channel" in the present specification indicates a line-shaped member capable of transmitting light. This holds also in the other embodiments described below.

When viewed from the above of the board 10 (viewed from the normal direction of the board 10), the optical fibers 20 are arranged between the wirings 12 such as to contact substantially with the wirings 12. More specifically, the optical fibers 20 are arranged in grooves 22 formed between the wirings 12, and hence are built in the board 10. In other words, the grooves 22 formed between the wirings 12 serve as mounting sections for the optical fibers 20. Further, in Embodiment 1, the upper most portions of the optical fibers 20 are substantially in plane with the upper surfaces of the circuit patterns 15 and the wirings 12. A method for aligning them in plane is described later in a fabrication method for the optical transmission channel board 100.

In the optical transmission channel board (board with built-in optical fiber) 100 shown in FIG. 1, an optical element 30 is mounted with reference to a marker (an optical element marker, hereafter) for positioning the optical element. The optical element is electrically connected to the wirings 12, and optically connected to the optical fibers 20. Although the optical element marker is not shown in the figure, a typical marker is composed of positioning reference planes 1103a, 1103b, and 1103c used in the prior art of FIG. 50. The optical element 30 is a laser element such as a semiconductor laser, or alternatively a photo receiving element such as a photo-diode. In Embodiment 1, the optical element 30 is arranged such as to substantially contact with the upper portions of the optical fibers 20.

In Embodiment 1, the board 10 serving as an example of a retention board of the present invention is composed of a composite material containing resin (such as a thermosetting resin and a thermoplastic resin) and inorganic filler. In this example, a thermosetting resin is used as the resin of the composite material. The board 10 may be composed only of thermosetting resin without inorganic filler. The thermosetting resin is an epoxy resin or the like. When added, the inorganic filler is $Al_2O_3$, $SiO_2$, MgO, BN, AlN, or the like. Various physical properties (such as the thermal expansion coefficient) can be controlled when the inorganic filler is added. Thus, the board 10 is preferably formed of a composite material containing inorganic filler. In Embodiment 1, inorganic filler of 100 weight units or more (preferably 140-180 weight units) is contained relative to the thermosetting resin of 100 weight units.

The role of inorganic filler is as follows. When $Al_2O_3$, BN, or AlN is added as inorganic filler, the thermal conductivity of the board 10 is improved. Further, when an appropriate inorganic filler is selected, the thermal expansion coefficient can be adjusted. In case that the thermal expansion coefficient is rather increased by the resin component, the addition of $SiO_2$, AlN, or the like can decrease the thermal expansion coefficient. In an appropriate case, when MgO is added, the thermal conductivity is improved while the thermal expansion coefficient is increased. Further, when $Si_2O$ (especially, amorphous $SiO_2$) is added, the thermal expansion coefficient is decreased while the dielectric constant is reduced.

A fabrication method for an optical transmission channel board according to Embodiment 1 is described below.

An optical transmission channel board 100 of Embodiment 1 is fabricated using a transfer method. More specifically, a metal layer formed on a supporting board is patterned so that circuit patterns 15 are formed that include: a plurality of wirings 12, other wirings 13, and wirings used as an optical element marker. Then, optical fibers 20 are arranged between the wirings 12 of the circuit patterns 15. After that, a material containing resin is deposited on the supporting board so as to cover the circuit patterns 15 and the optical fibers 20. Then, when the supporting board is removed, the circuit patterns 15 are exposed on the surface so that the optical transmission channel board 100 of Embodiment 1 is obtained.

The above-mentioned fabrication method for an optical transmission channel board is described below in further detail with reference to FIGS. 2-4.

Figure 2A:
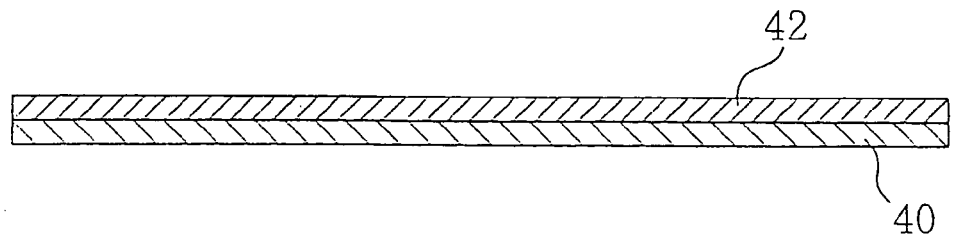
FIG. 2(a) is a diagram illustrating a fabrication method for an optical transmission channel board 100 according to Embodiment 1 of the present invention.

As shown in FIG. 2(a), prepared first is a carrier sheet (transfer formation material) 40 on which a metal layer 42 serving as an example of a layer containing an electrically conductive material of the present invention is formed. The metal layer 42 is composed of copper or the like. The carrier sheet 40 serving as an example of a substrate of the present invention is composed of a metallic foil (a copper or aluminum foil), a resin sheet, or the like. The thickness values of the metal layer 42 and the carrier sheet 40 are approximately 3-50 μm and approximately 25-200 μm, respectively.

Figure 2B:
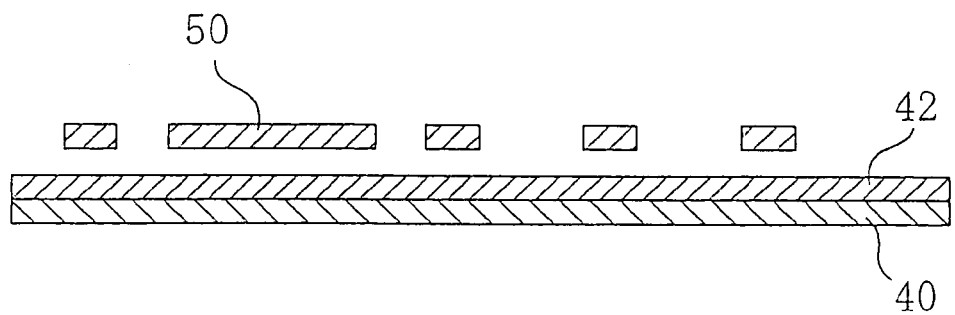
FIG. 2(b) is a diagram illustrating a fabrication method for an optical transmission channel board 100 according to Embodiment 1 of the present invention.

Then, as shown in FIG. 2(b), a mask 50 corresponding to the circuit patterns 15 is placed above the metal layer 42. The metal layer 42 is then etched. As a result, as shown in FIG. 2(c), circuit patterns 15 are formed that include: the wirings 12 located in the surrounding portion of the optical fibers 20; other wirings 13; and the wiring used as an optical element marker.

After the patterning by the above-mentioned etching, walls for guiding the optical fibers 20 to be arranged are formed in at least a part of the circuit patterns 15. In Embodiment 1, the guide walls are formed on top of the wirings 12.

Figure 2C:
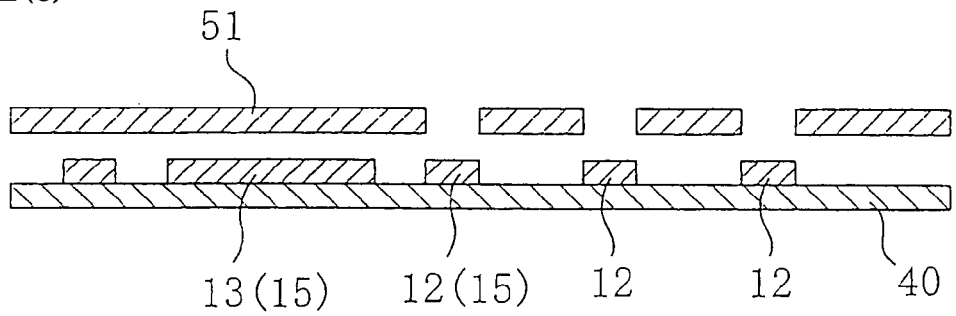
FIG. 2(c) is a diagram illustrating a fabrication method for an optical transmission channel board 100 according to Embodiment 1 of the present invention.
Figure 2D:
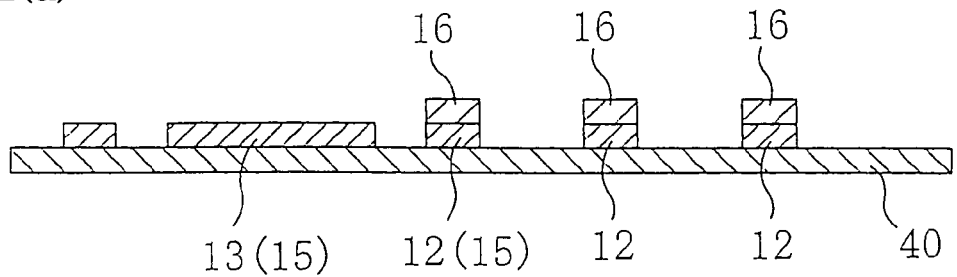
FIG. 2(d) is a diagram illustrating a fabrication method for an optical transmission channel board 100 according to Embodiment 1 of the present invention.

More specifically, as shown in FIG. 2(c), a mask 51 having an opening in the portions corresponding to the wirings 12 is arranged above the carrier sheet 40. Then, as shown in FIG. 2(d), a guide layer 16 serving as a layer constituting the guide walls is deposited on the wirings 12. In an example, the guide layer 16 is composed of metal, and formed by sputtering. Vapor deposition, plating, a deposition method, or the like may be used in place of sputtering. The reason why the sputtering is used in the formation of the guide layer 16 in Embodiment 1 is that this method provides a preferable fabrication accuracy.

Figure 3A:
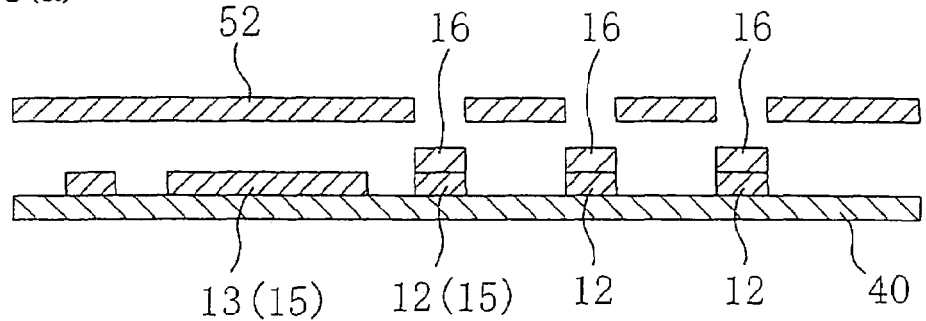
FIG. 3(a) is a diagram illustrating a fabrication method for an optical transmission channel board 100 according to Embodiment 1 of the present invention.

In case that the height of the guide walls for supporting the optical fibers 20 is insufficient even after the guide layer 16 is formed, a mask 52 is arranged above the guide layer 16 as shown in FIG. 3(a), and then another guide layer 17 is deposited on the guide layer 16 serving as a base. The mask 52 may be the same as the previous mask 51. The material constituting the guide layer 17 may be the same as, or different from, the material constituting the guide layer 16. The material constituting the guide layers 16 and 17 is not limited to a metal, and may be another material (such as ceramics). The method of deposition to be used is not limited to sputtering, and may be another technique such as a flame deposition method.

Figure 3B:
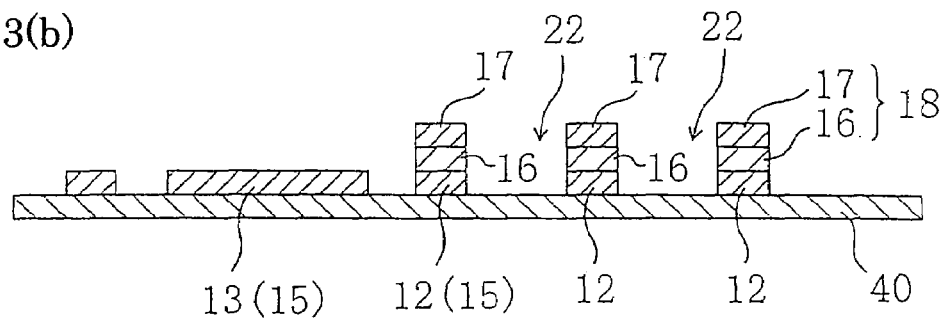
FIG. 3(b) is a diagram illustrating a fabrication method for an optical transmission channel board 100 according to Embodiment 1 of the present invention.

As such, as shown in FIG. 3(b), guide walls 18 constructed from the guide layer 16 and the guide layer 17 is formed on the wirings 12. The guide walls 18 constitute grooves 22 (optical fiber mounting sections) in which the optical fibers 20 are to be mounted. In Embodiment 1, the total thickness of the wiring 12 and the guide wall 18 (guide layers 16 and 17) is greater than the radius of the optical fiber 20 arranged between the guide walls 18. This configuration ensures the optical fibers 20 to contact substantially with the guide walls 18, and hence reduces mounting discrepancy.

Figure 3C:
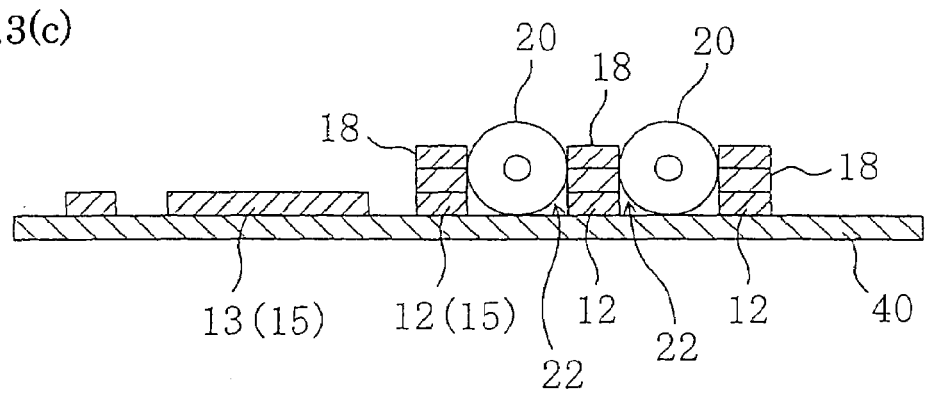
FIG. 3(c) is a diagram illustrating a fabrication method for an optical transmission channel board 100 according to Embodiment 1 of the present invention.

Then, as shown in FIG. 3(c), the optical fibers 20 are arranged between the guide walls 18 (between the wirings 12) That is, the optical fibers 20 are inserted into the grooves 22 formed between the guide walls 18 (or the wirings 12).

The guide walls 18 have such spacing that the optical fibers 20 substantially contact with the guide walls 18 when arranged therebetween. A slight excess in the spacing is allowable. More specifically, this excess is preferably 0.1 µm or less between each optical fiber 20 and each of the right and left guide walls 18. The optical fibers 20 are arranged such as to contact with the carrier sheet 40.

Figure 3D:
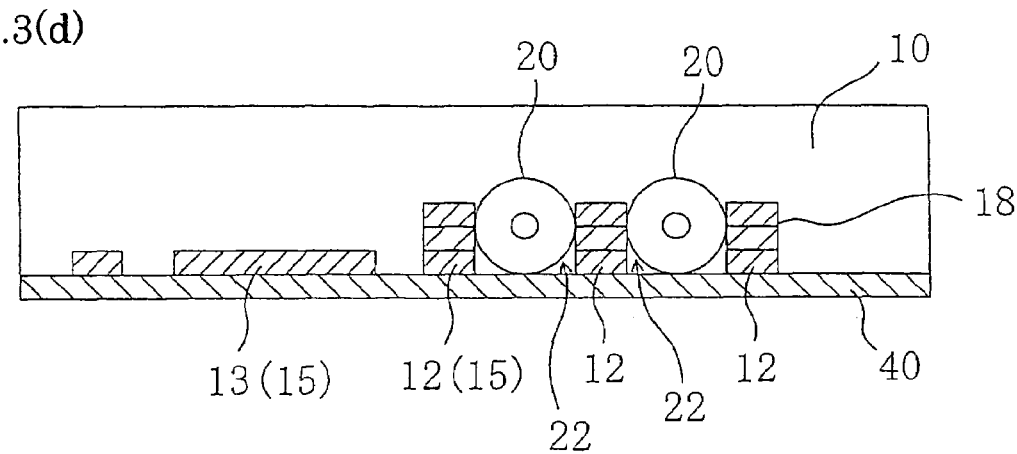
FIG. 3(d) is a diagram illustrating a fabrication method for an optical transmission channel board 100 according to Embodiment 1 of the present invention.

Then, as shown in FIG. 3(d), a material containing resin is deposited on the carrier sheet 40 so that a board (insulating board) 10 is formed. This deposition is performed such that the circuit patterns 15 and the optical fibers 20 are covered. That is, the material constituting the board 10 covers: the circuit patterns 15 including the wirings 12 and 13; the guide walls 18; and the optical fibers 20. In Embodiment 1, the material constituting the board 10 is deposited in a thickness of three times or more of the radius of the optical fiber 20. The thickness of the board 10 can be 0.18-0.4 mm or the like.

Figure 4A:
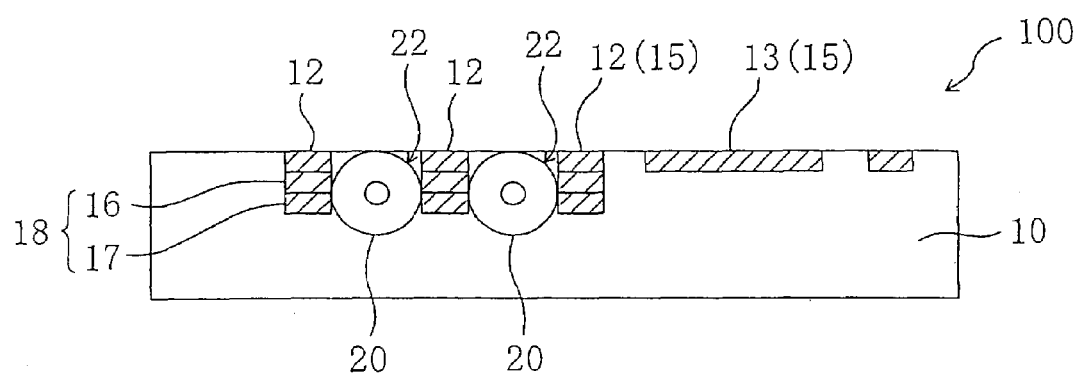
FIG. 4(a) is a process sectional view illustrating a fabrication method for an optical transmission channel board 100 according to Embodiment 1 of the present invention.

Then, as shown in FIG. 4(a), the board 10 is reversed and the carrier sheet 40 is removed. As a result, an optical transmission channel board 100 of Embodiment 1 is obtained. That is, the circuit patterns 15 on the carrier sheet 40 are separated so that the transfer is completed. The board 10 may be reversed after the removal of the carrier sheet 40.

In the fabrication method of Embodiment 1, the circuit patterns 15 and the optical fibers 20 simultaneously contact with the carrier sheet 40 in the state of FIG. 3(d). Thus, in the state of FIG. 4(a), the upper surface of the circuit patterns 15 and the uppermost parts of the optical fibers 20 are substantially in plane. Further, the resin surface (more specifically, the surface of the composite material) of the board 10 is substantially in plane with the upper surface of the circuit patterns 15 and the uppermost parts of the optical fibers 20.

Further, according to the fabrication method of Embodiment 1, the optical fibers 20 can be simply embedded (built) in the board 10. Further, in comparison with the case that the optical fibers 20 are provided on the surface of the board 10, the optical fibers 20 are protected more appropriately.

Figure 4B:
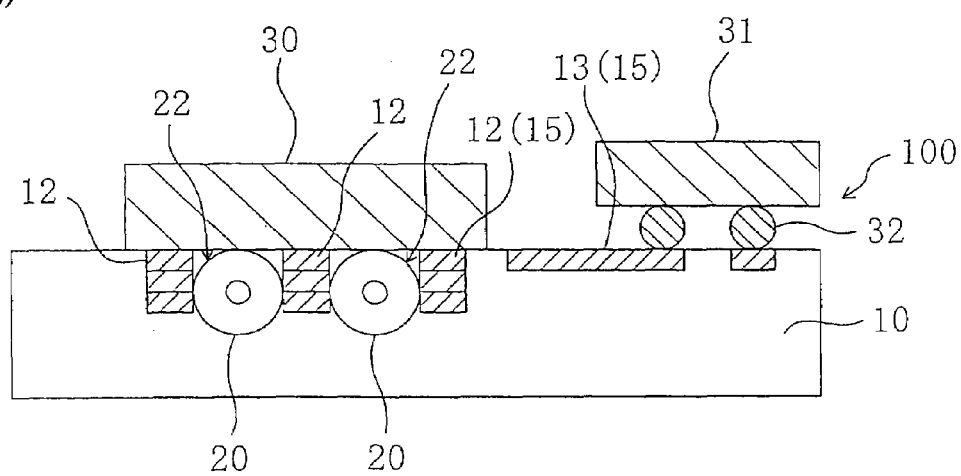
FIG. 4(b) is a diagram illustrating a fabrication method for an optical transmission channel board 100 according to Embodiment 1 of the present invention.

After that, as shown in FIG. 4(b), when an optical element 30 and an electronic component 31 are mounted on the circuit patterns 15 exposed in the surface of the board 10, an optical module is obtained.

The optical element 30 is a semiconductor laser or the like, and is arranged such as to substantially contact with the top of the optical fibers 20 in Embodiment 1. The phrase "arranged above an optical transmission channel" according to the present invention includes the state "arranged such as to substantially contact with the top of an optical transmission channel (optical fiber 20)". The optical element 30 may be a photo receiving element (such as a photo-diode). The electronic component 31 mounted on the portion of the wirings 13 among circuit patterns 15 is a semiconductor element (such as a logic LSI) In the example shown in FIG. 4(b), the electronic component (semiconductor element) 31 is electrically connected to the wirings 13 through solder balls 32.

Figure 5:
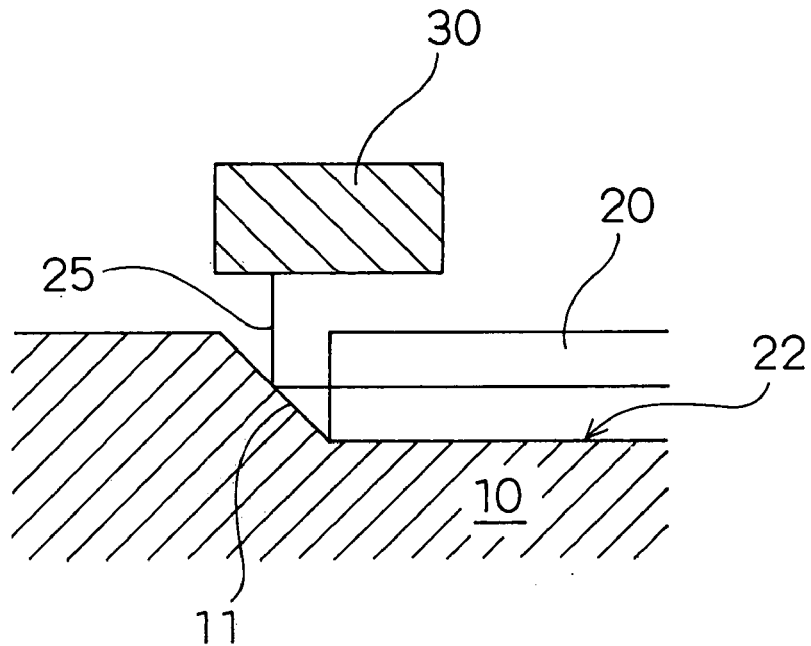
FIG. 5 is a sectional view illustrating optical connection between an optical element 30 and an optical fiber 20 according to Embodiment 1 of the present invention.

The optical element 30 and the optical fibers 20 can be optically connected, for example, as shown in the schematic sectional view of FIG. 5. That is, as shown in FIG. 5, a reflection surface (inclined surface) 11 is formed in a part of board 10, so that optical connection by light (an optical signal) 25 is established between the optical element 30 and the optical fibers 20 via the reflection surface 11. In an example, the reflection surface 11 is obtained by fabricating an inclined surface in the board 10, and then forming a metal layer (such as an Au layer) on the surface of the inclined surface. Alternatively, an optical component (mirror) having a reflection surface 11 may be placed on the board 10.

Figure 6:
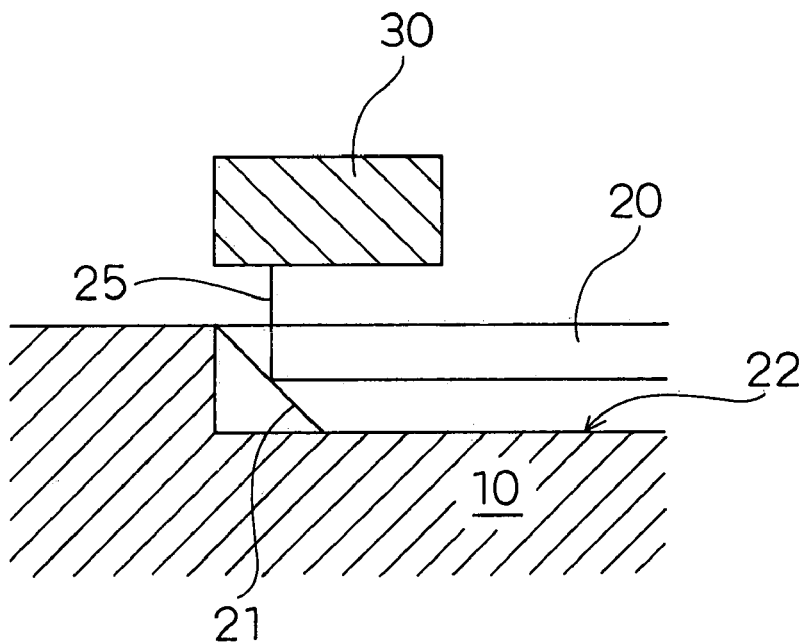
FIG. 6 is a sectional view illustrating optical connection between an optical element 30 and an optical fiber 20 according to Embodiment 1 of the present invention.
Figure 7:
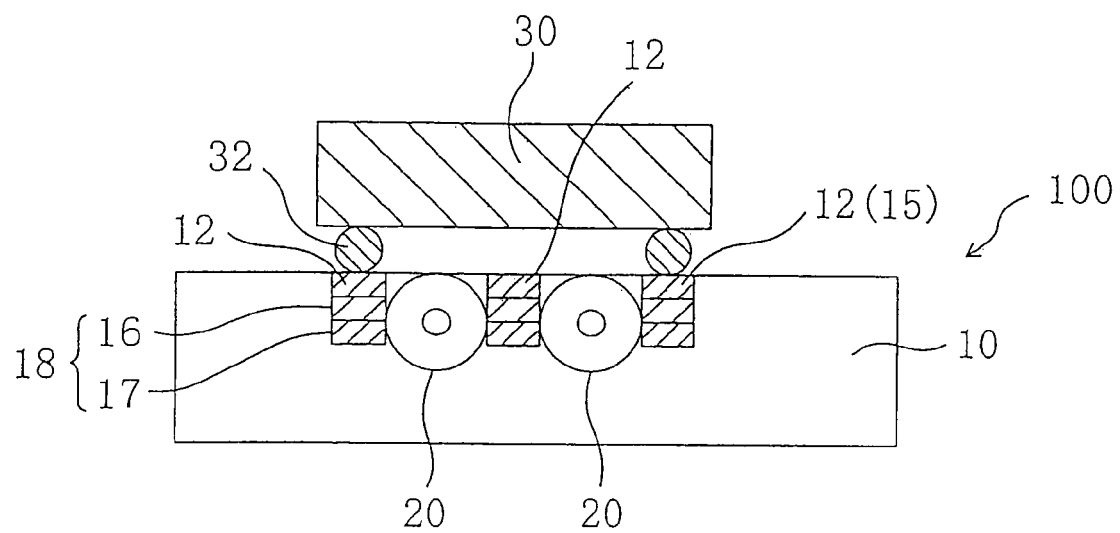
FIG. 7 is a sectional view schematically showing a configuration in which an optical element 30 is mounted on an optical transmission channel board 100 according to Embodiment 1 of the present invention.

Further alternatively, as shown in the schematic sectional view of FIG. 6, an end face 21 of the optical fiber 20 may be cut aslant (such as a 45° cut) so that the light 25 should be reflected in the end face 21. This permits optical connection between the optical element 30 and the optical fiber 20. In the configuration shown in FIGS. 5 and 6, a transparent medium may be present in the path of the light 25 between the optical element 30 and the optical fiber 20. The transparent medium is air, glass, transparent resin, or the like. The transparent resin is a material which permits optical connection between the optical element 30 and the optical fiber 20 and which transmits light of a wavelength of 850 nm, 1330 nm, and 1550 nm or the like. More specifically, the transparent resin is composed of polyimide, epoxy aramid, or the like. Alternatively, an optical component (such as a lens) may be arranged between the optical element 30 and the optical fiber 20. The configurations of FIGS. 5 and 6 where the optical element 30 and the optical fiber 20 are not in close contact with each other are different from those of FIGS. 1 and 4(b), and corresponds to the configuration of FIG. 7 described later.

When the optical element 30 is mounted on the portion of the wirings 12 in the circuit patterns 15, pad sections may be formed on the wirings 12 so that element terminals of the optical element 30 may be connected to the pad sections by wire bonding. Nevertheless, such wire bonding connection is disadvantageous in high speed characteristics. Thus, as an example shown in FIG. 7, the connection between the optical element 30 and the wirings 12 is preferably realized by flip chip mounting or the like using connection members (such as bumps and solder balls) 32. In this case, lands are formed in the portions of the wirings 12 with which the connection members 32 contact.

As described above, in Embodiment 1, the wirings 13 and the wirings 12 are simultaneously fabricated as the circuit patterns 15 by using a single mask. The guide walls 18 for positioning the optical fibers 20 are formed with reference to the wirings 12. That is, in Embodiment 1, the wirings 12 and the portions between the guide walls 18 used for positioning the optical fibers (correspond to the previous guide grooves 104) are fabricated as the circuit patterns 15 in the same process. This simplifies the fabrication process in comparison with the prior art.

In Embodiment 1, the optical element marker (not shown) included in the circuit patterns 15 corresponds to the positioning reference planes 103a, 103b, and 103c for positioning the previous optical element. The portions between the guide walls 18 for positioning the optical fibers 20 correspond to the previous guide grooves 104. The wirings 12 included in the circuit patterns 15 serve as a reference in the forming of the guide walls 18. That is, the optical element marker for positioning the optical element 30 and the guide walls 18 for positionally regulating the optical fibers 20 are formed using the same mask 50. Thus, the optical element marker and the guide walls are aligned automatically. This resolves the problem of centering, and permits optical connection between the optical element 30 and the optical fibers 20.

In a possible case that a centering process is to be performed in the optical transmission channel board 100 of Embodiment 1 in order to further improve the optical connection, rough centering has already been achieved with a precision better than that of the prior art configuration. Thus, fine centering solely is sufficient.

A first step of the present invention corresponds to the step shown in FIG. 2(a), for example. A second step of the present invention corresponds to the step shown in FIGS. 2(b)-2(c), for example. An A step of the present invention corresponds to the step shown in FIGS. 2(d)-3(b) 2, for example. A third step of the present invention corresponds to the step shown in FIG. 3(c), for example. A fourth step of the present invention corresponds to the step shown in FIG. 3(d), for example. A fifth step of the present invention corresponds to the step shown in FIG. 4(a) for example. A sixth step of the present invention corresponds to the step shown in FIG. 4(b), for example.

A part of circuit patterns used as an electric circuit of the present invention corresponds to the wirings 13 of Embodiment 1. A part of circuit patterns for positionally regulating an optical transmission channel of the present invention corresponds to the wirings 12 of Embodiment 1.

The function of the optical element marker may be performed by a part of circuit patterns for positioning an optical transmission channel. The function may be performed by a circuit pattern for an electric circuit. The wirings 12 for positioning an optical transmission channel may be used as an electric circuit.

Figure 8A:
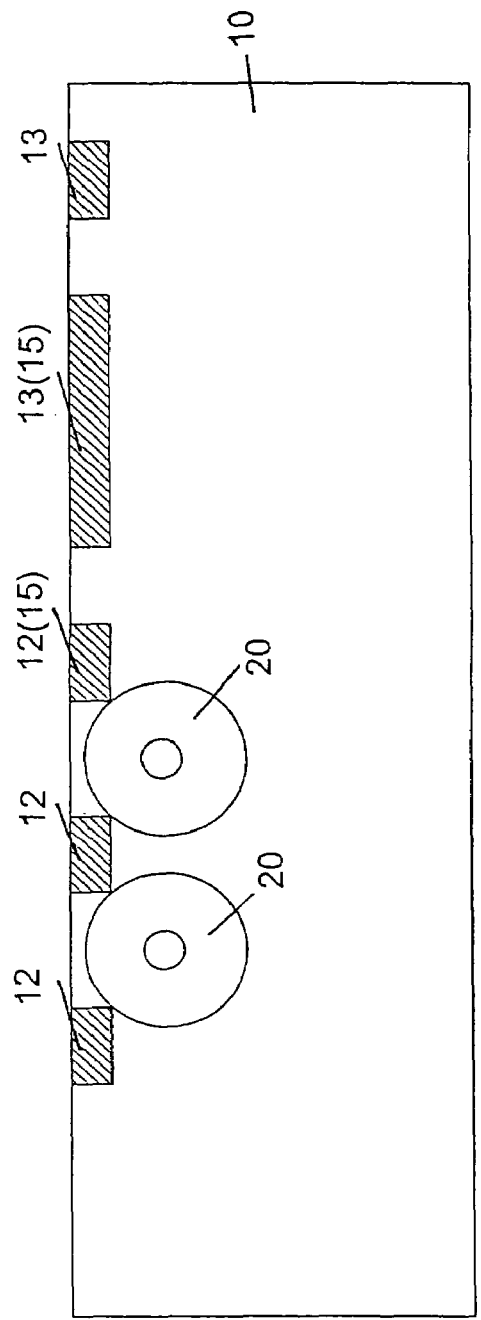
FIG. 8(a) is a sectional view showing a modification of an optical transmission channel board 100 according to the present invention.
Figure 8B:
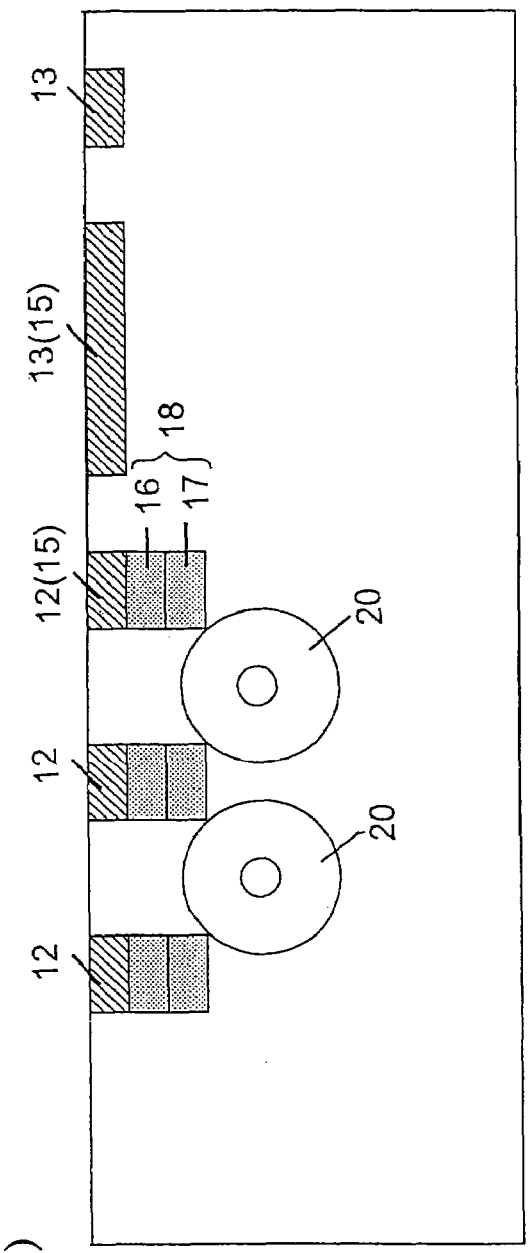
FIG. 8(b) is a sectional view showing a modification of an optical transmission channel board 100 according to the present invention.

In Embodiment 1, the upper surface of the board 10 and the uppermost portions of the optical fibers 20 are substantially in plane, and arranged so as to contact with the guide walls 18. However, as shown in FIG. 8(a), the spacing between the wirings 12 may be smaller than the diameter of the optical fiber 20 so that the upper surface of the board 10 may be out of plane with the uppermost portions of the optical fibers 20. Further, the guide walls 18 may be formed such as to contact with the optical fibers in a manner shown in FIG. 8(b).

Figure 9A:
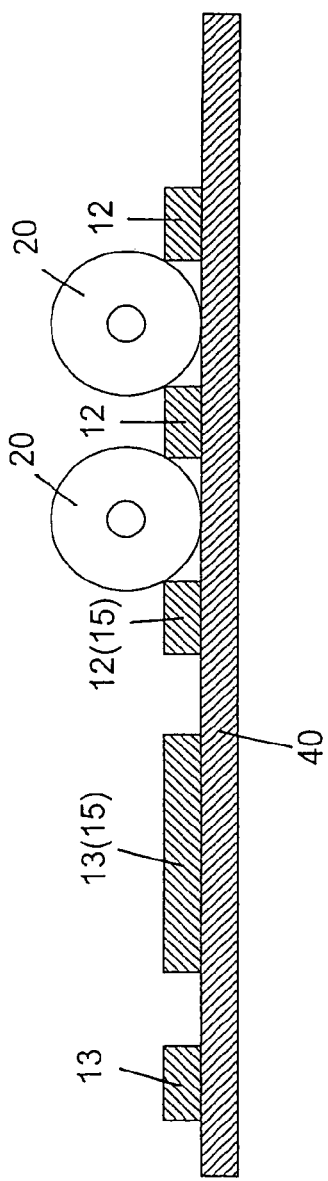
FIG. 9(a) is a sectional view showing a modification of an optical transmission channel board 100 according to the present invention.
Figure 9B:
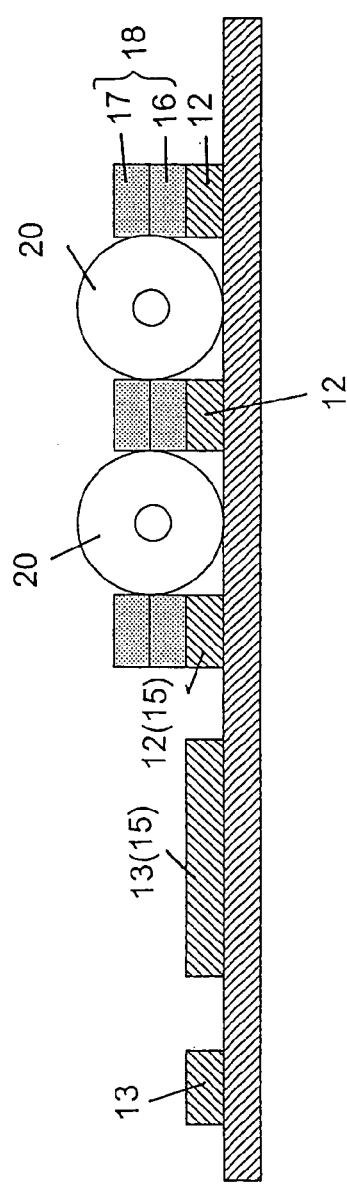
FIG. 9(b) is a sectional view showing a modification of an optical transmission channel board 100 according to the present invention.

Alternatively, as shown in FIG. 9(a), a carrier sheet 40 may serve as a retention board without the use of a board 10. In this case, optical fibers 20 are arranged between wirings 12 so that the board is use as an optical transmission channel board. Further, guide walls 18 may be provided as shown in FIG. 9(b) so that optical fibers 20 may be arranged. The optical fibers 20 may be arranged such as to contact or not contact with the retention board (carrier sheet 40).

In Embodiment 1, the guide layers 16 and 17 are stacked. However, as shown in FIG. 10(a), a layer containing an electrically conductive material may have a thickness permitting the positioning of an optical fiber, so that guide walls 18 may be formed solely by wirings 12.

Figure 11:
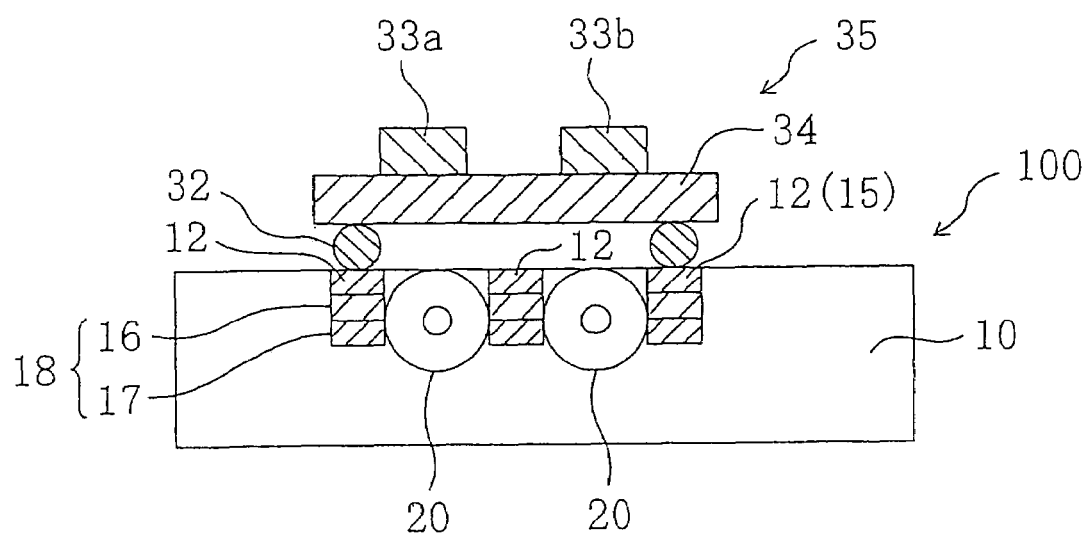
FIG. 11 is a sectional view schematically showing a configuration in which an MCM 35 is mounted on an optical transmission channel board 100 according to Embodiment 1 of the present invention.

As shown in FIG. 11, the optical fibers 20 may be optically connected to optical elements within an MCM (multi-chip module) 35, in place of a single discrete optical element 30. In this example, a plurality of electronic components 33a and 33b are mounted on an interposer 34 so that an MCM 35 is constructed. At least one of the electronic components 33a and 33b is an optical element. Both electronic components 33a and 33b may be laser elements (semiconductor lasers), or may be photo receiving elements (photo-diodes). Alternatively, they may be a combination of a laser element and a photo receiving element. In an example, an opening is formed in a part of the interposer 34 corresponding to the optical path between the optical elements and the optical fibers. An optical component (such as a lens) may be arranged in the position of the opening. The optical elements 33a and 33b may be mounted on the back side of the interposer 34.

In the prior art, position adjustment has been necessary between the grooves 22, the interposer 34, and the electronic components 33a and 33b corresponding to the optical fibers 20. However, according to the fabrication method of Embodiment 1, the optical fibers 20 are positioned on the basis of the positions of the grooves 22 formed by the wirings 12. Further, the interposer 34 is positioned by the optical element marker formed using the same mask as that used in the formation of the wirings 12. This simplifies the position adjustment between the optical fibers 20 and the interposer 34, and hence simplifies the centering process in comparison with the prior art.

Figure 12:
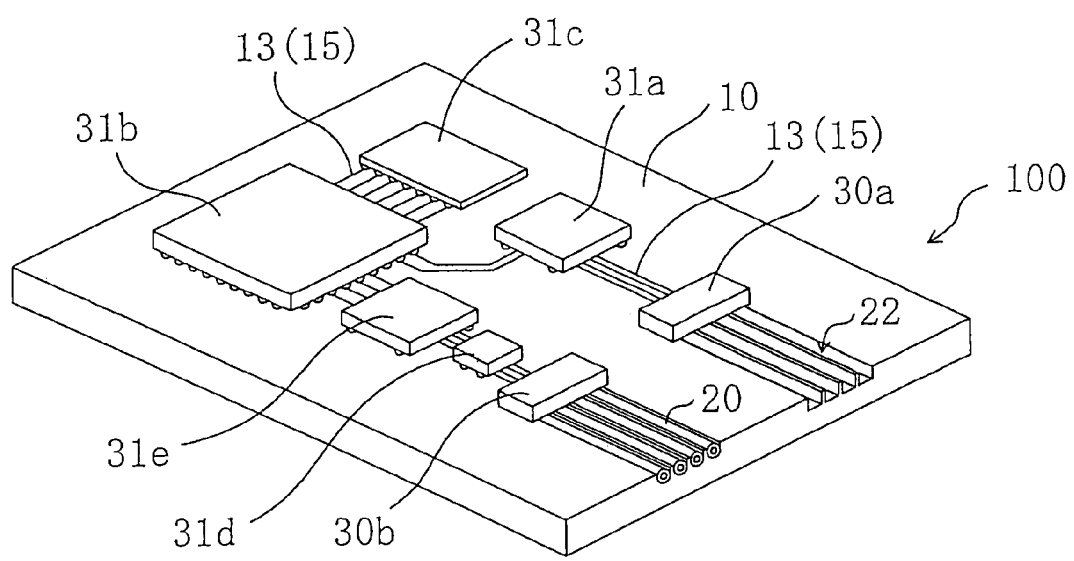
FIG. 12 is a perspective view schematically showing a configuration of an optical module (data processing apparatus) employing an optical transmission channel board 100 according to Embodiment 1 of the present invention.

In the optical transmission channel board 100 of Embodiment 1, the wirings 12 and the other wirings (such as 13) are formed simply by a transfer method. Thus, even electronic components other than optical elements (semiconductor elements) can be mounted similarly to the case of a typical printed circuit board. FIG. 12 shows an optical module in which electronic components 31 (31a, 31b, 31c, 31d, 31e) in addition to optical elements 30a and 30b are mounted on an optical transmission channel board 100. The optical module shown in FIG. 12 can be used as a data processing apparatus. This module is described below in further detail.

The optical element 30a is a laser element, and may be a vertical-cavity surface-emitting laser (VCSEL). On the other hand, the optical element 30b is a photo receiving element, and may be a photo-diode element having a plurality of photo-receiving sections. For the simplicity of understanding the configuration of Embodiment 1, grooves 22 are shown without optical fibers 20 to be optically connected to the optical element 30a.

The laser element 30a is connected to a driver IC 31a. The driver IC 31a is connected to an LSI chip (such as a logic LSI like an image processing LSI) 31b. The LSI chip 31b is connected to a memory chip 31c. The photo receiving element 30b is connected to the LSI chip 31b via an amplifier (preamplifier) 31d and an amplifier 31e. The electronic components 31 are mutually connected through the wirings 13 in the circuit patterns 15.

The problem of centering is resolved by the configuration of optical element markers for positioning the wirings 12 and the optical elements. Thus, the wirings 13 may be formed on the board 10 separately in a step other than a transfer process (for example, in an independent and later step). However, from the perspective of fabrication procedure, cost, and the like, it is efficient to fabricate the wirings 13 in the same step as that of the wirings 12 and the optical element markers similarly to the fabrication method of Embodiment 1.

The optical module (data processing apparatus) shown in FIG. 12 can perform optical transmission through the optical fibers 20. Thus, mass data can be transmitted at a high speed. Further, this module fabricated by the method of Embodiment 1 has a low fabrication cost.

That is, the circuit patterns 15 (including the wirings 12) and the grooves 22 are formed integrally. This simplifies the fabrication process, and reduces the fabrication cost which has been increased by a larger tolerance discrepancy in the prior art. Thus, the cost can be reduced in optical modules presently used in optical communications (such as the Internet and telephone). This accelerates the spread of such optical modules.

Figure 52:
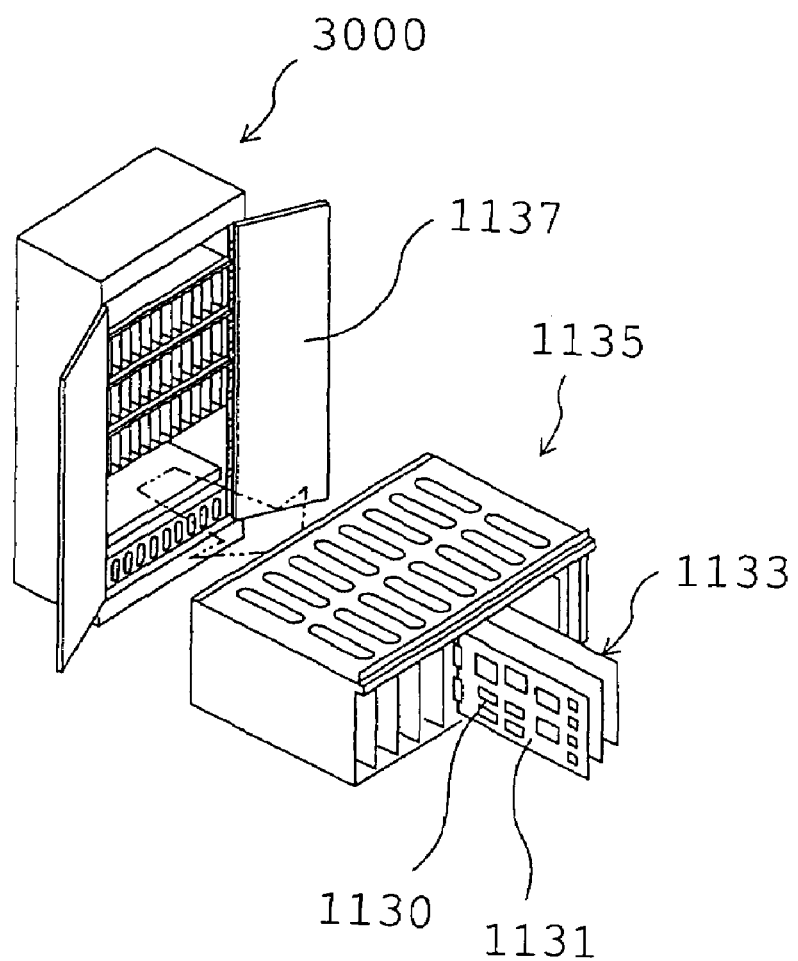
FIG. 52 is a perspective view illustrating the mounting hierarchy of a prior art communication system apparatus 3000 for performing optical communications.
Figure 53:
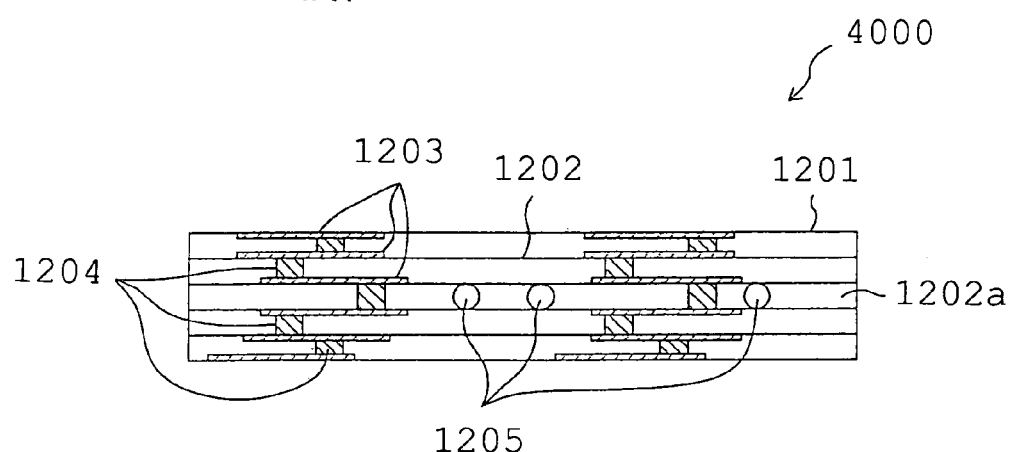
FIG. 53 is a sectional view showing a prior art wiring board 4000.
Figure 54A:
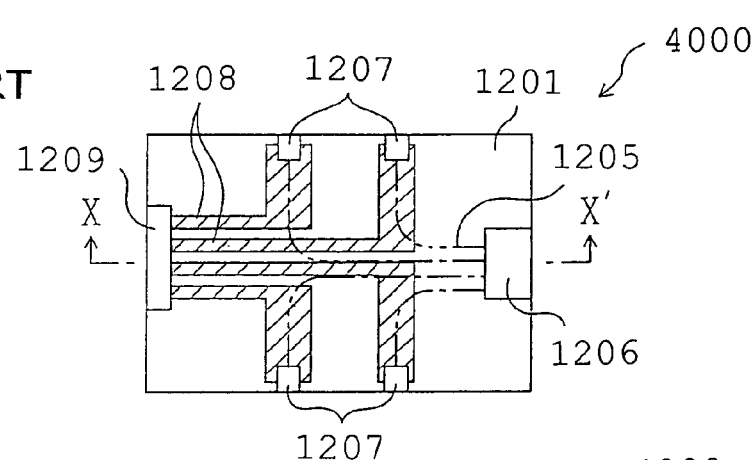
FIG. 54(a) is a plan view showing a prior art wiring board 4000.
Figure 54B:
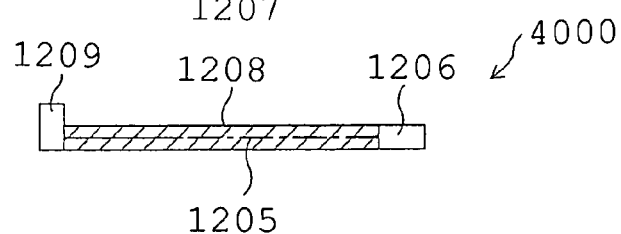
FIG. 54(b) is a sectional view taken along line X-X' in FIG. 54(a).
Figure 55:
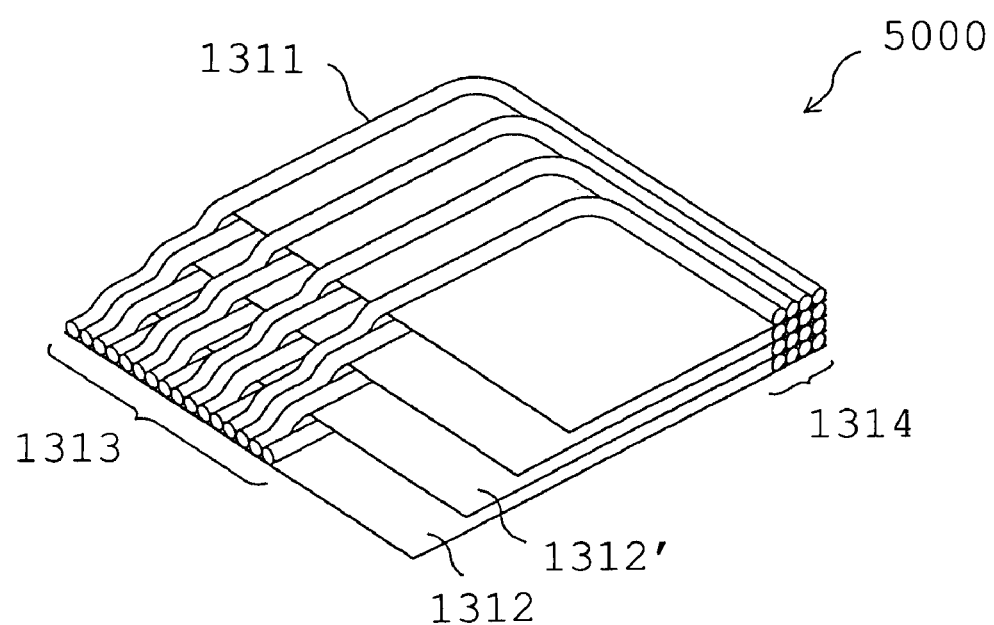
FIG. 55 is a perspective view showing a prior art light wiring board 5000.

Further, the cost reduction permits the use of economical optical transmission in within-the-board transmission (level 2) in the communication system apparatus 3000 shown in FIG. 52. This improves the speed of within-the-board transmission. As such, the present invention is applicable to the bookshelf type communication system apparatus 3000 shown in FIG. 52. Similarly, the optical transmission channel board or optical module 100 of the present invention may be used as a main apparatus such as a next-generation high performance optical I/O module and a data processing apparatus (like an image processing apparatus).

Embodiment 2

A fabrication method for an optical transmission channel board according to Embodiment 2 is described below. FIGS. 13(a)-13(e) are sectional views of an optical transmission channel board used for describing a fabrication method for an optical transmission channel board according to Embodiment 2.

Figure 13A:
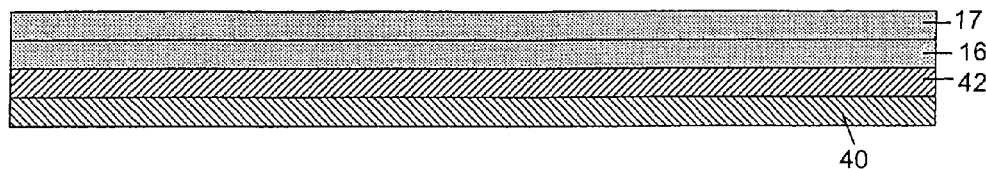
FIG. 13(a) is a diagram illustrating a fabrication method for an optical transmission channel board 100 according to Embodiment 2 of the present invention.
Figure 13B:
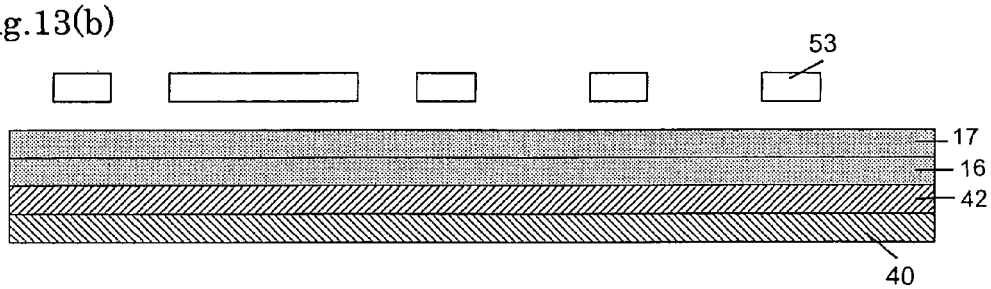
FIG. 13(b) is a diagram illustrating a fabrication method for an optical transmission channel board 100 according to Embodiment 2 of the present invention.

First, starting from the state shown in FIG. 2(a), guide layers 16 and 17 are stacked on a metal layer 42 so that the state shown in FIG. 13(a) is achieved. Then, as shown in FIG. 13(b), these layers (17, 16, 42) are etched using a mask 53 for defining the shape of circuit patterns 15. As a result, circuit patterns 15 are formed that include: wirings 12 for constituting grooves 22; other wirings 13; and an optical element marker for positioning an optical element.

Figure 13C:
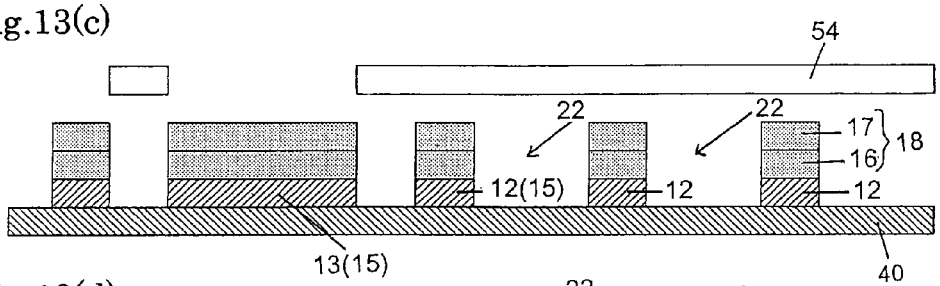
FIG. 13(c) is a diagram illustrating a fabrication method for an optical transmission channel board 100 according to Embodiment 2 of the present invention.
Figure 13D:
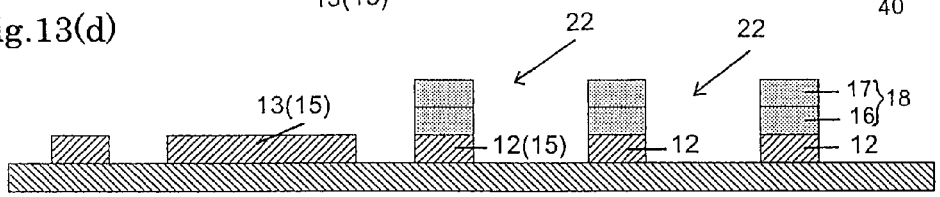
FIG. 13(d) is a diagram illustrating a fabrication method for an optical transmission channel board 100 according to Embodiment 2 of the present invention.
Figure 13E:
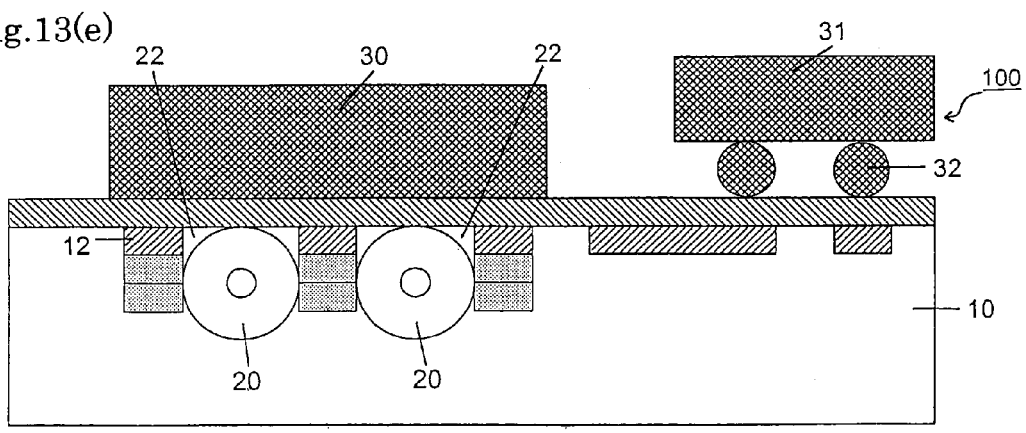
FIG. 13(e) is a diagram illustrating a fabrication method for an optical transmission channel board 100 according to Embodiment 2 of the present invention.

Then, as shown in FIG. 13(c), the guide layers 16 and 17 on top of the wirings 13 are etched using a mask 54 for defining the shape of the wiring 13 portion. As a result of this etching, guide walls 18 and wirings 13 are formed as shown in FIG. 13(d) This configuration is similar to that of FIG. 3(b) in Embodiment 1. After that, when processes similar to those of FIG. 3(c) and its subsequent are performed, an optical transmission channel board 100 or optical module shown in FIG. 13(e) is obtained.

That is, in Embodiment 1, the guide layers 16 and 17 have been stacked after the formation of the wirings 12. In contrast, in Embodiment 2, the wirings 12 are formed after the stacking of the guide layers 16 and 17.

A layer composed of a material different from a layer containing an electrically conductive material according to the present invention corresponds to each of the guide layers 16 and 17 of Embodiment 2. In place of these two layers which may be composed of mutually different materials, a single layer may be used that has a predetermined thickness. Alternatively, more than two layers may be stacked. That is, it is sufficient that the optical fibers 20 can be positioned.

A "C" step of the present invention corresponds to the step shown in FIG. 13(a), for example. A "B" step of the present invention corresponds to the step shown in FIGS. 13(c)-13(d) for example.

The mask 54 of Embodiment 2 has a shape corresponding to the wirings 13. However, it is sufficient that at least the portion constituting the guide walls 18 (corresponding to the wirings 12) is covered.

In Embodiment 2, the guide layers 16 and 17 on top of the wirings 13 are removed. However, these layers need not be removed, and may be kept embedded in the board 10.

In Embodiment 2, the guide layers 16 and 17 are stacked. However, as shown in FIG. 10(b), the layer containing an electrically conductive material may have a thickness sufficient for positioning the optical fibers, so that the guide walls 18 may be formed only by the wirings 12. In this case, an unnecessary portion (indicated by a dotted line in the figure) of the thickness of the wirings 13 serving as a circuit pattern used as an electric circuit of the present invention may be removed. This portion corresponds to the upper portion of the wirings 13, since the optical transmission channel board 100 is retained upside down during the fabrication.

Figure 14A:
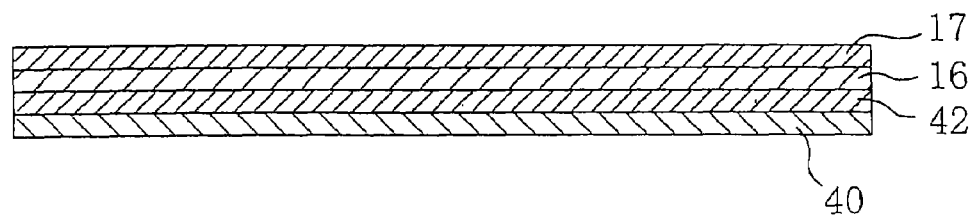
FIG. 14(a) is a diagram illustrating a modification of a fabrication method for an optical transmission channel board 100 according to Embodiment 2 of the present invention.
Figure 14B:
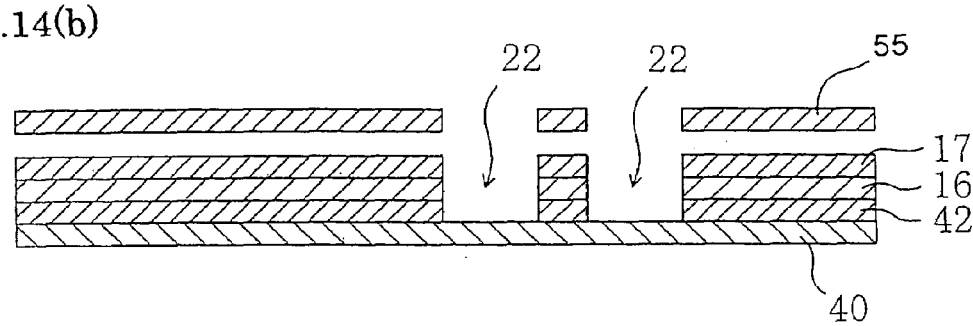
FIG. 14(b) is a diagram illustrating a modification of a fabrication method for an optical transmission channel board 100 according to Embodiment 2 of the present invention.
Figure 14C:
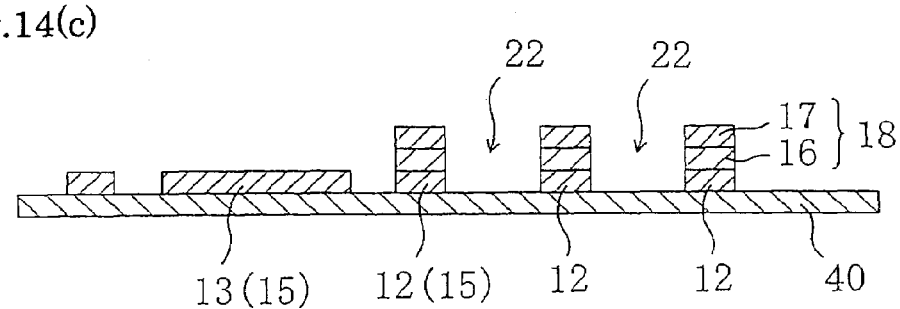
FIG. 14(c) is a diagram illustrating a modification of a fabrication method for an optical transmission channel board 100 according to Embodiment 2 of the present invention.
Figure 14D:
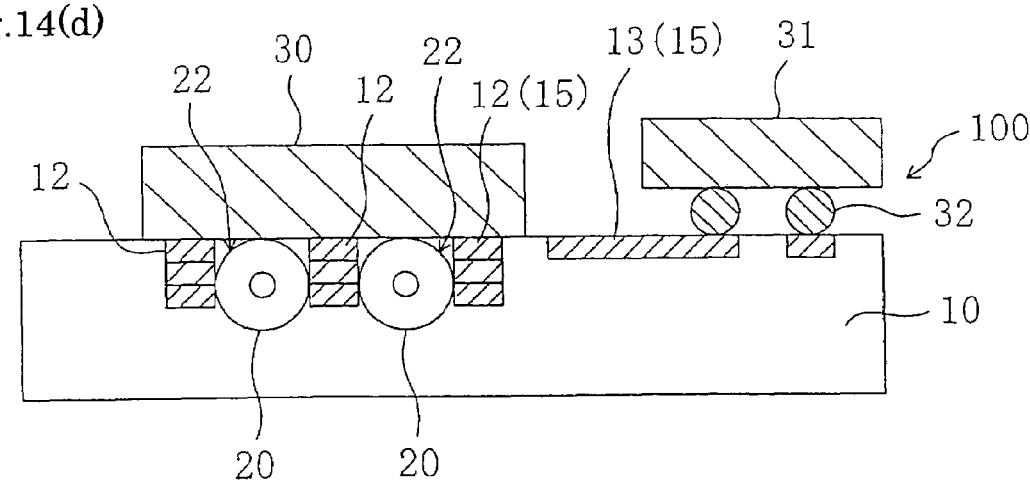
FIG. 14(d) is a diagram illustrating a modification of a fabrication method for an optical transmission channel board 100 according to Embodiment 2 of the present invention.

In Embodiment 2, the grooves 22 and the circuit patterns 15 are fabricated simultaneously using the mask 53 corresponding to the circuit patterns 15. However, as shown in FIGS. 14(a)-14(d), the circuit patterns 15 may be formed after the formation of the grooves 22. That is, as shown in FIG. 14(b), the grooves 22 are first formed using a mask 55 corresponding to the grooves 22. At the same time, an optical element marker for positioning the optical element is formed, although not illustrated. Then, etching is performed using a predetermined mask, so that the guide walls 18 and the circuit patterns 15 (including the wirings 12 and the wirings 13) are formed as shown in FIG. 14(c). Since FIG. 14(c) shows a configuration similar to that of FIG. 3(b), when the steps after FIG. 3(c) are performed, an optical transmission channel board 100 or optical module shown in FIG. 14(d) is obtained.

Further features and further modifications of the optical transmission channel board 100 are described below with reference to other drawings.

As described above, the steps shown in FIGS. 2(a)-4(a) described in Embodiment 1 are performed so that the circuit patterns 15 including the wirings 12 are formed, the uppermost portions of the optical fibers 20 are substantially in plane with the upper surface of the circuit patterns 15. However, a predetermined portion or the entirety of the circuit patterns 15 can be depressed relative to the resin surface (or composite material surface) of the board 10.

Figure 15:
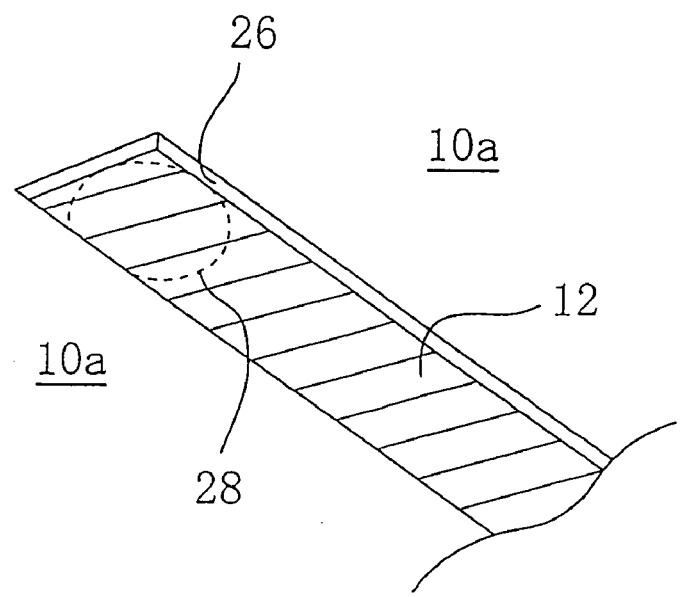
FIG. 15 is a main part enlarged perspective view which shows wirings 12 of an optical transmission channel board 100 according to Embodiments 1 and 2 of the present invention.

For example, as shown in FIG. 15, the upper surface of the wirings 12 can be depressed relative to the surface (resin surface) 10a of the board 10 by the following method, so that a level difference 26 can be formed.

That is, in the patterning in FIG. 2(b), in addition to the unnecessary portion of the metal layer 42, a carrier sheet 40 portion constituting the base for the circuit patterns 15 are also etched. Then, in a resin application step (that is, a step of applying a composite material) shown in FIG. 3(d), the resin goes deeper than the surface of the wirings 12 toward the carrier sheet 40. As a result, a level difference 26 is formed between the surface 10a of the board 10 and the upper surface of the wirings 12. Similarly in Embodiment 2, when a predetermined portion of the carrier sheet 40 is etched in the patterning in FIG. 13(b), a level difference 26 is formed.

Figure 16:
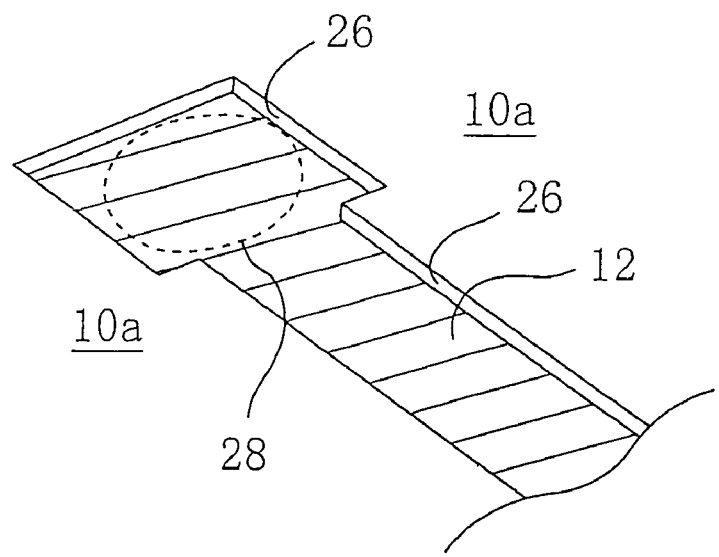
FIG. 16 is a main part enlarged perspective view which shows wirings 12 of an optical transmission channel board 100 according to Embodiments 1 and 2 of the present invention.

When a land 28 used as a mounting section for an optical element 30 is formed in a part of the wiring 12 (typically, in an end portion), the level difference 26 serves as a dam for retaining the solder. That is, the solder serves as a solder resist, or assists a solder resist. The land 28 portion is usually wider than the wiring section. Thus, the land 28 may be formed as shown in FIG. 16. In this case, when the guide walls 18 are designed such as not to be formed under the wiring 12 where the land 28 is located, a mounting region (a groove 22) for the optical fiber 20 is appropriately secured.

The land 28 shown in FIG. 16 is a rectangular land, but may be a circular land. Further, description has been made for the case of the wiring 12. However, a land having such a configuration may be fabricated in another wiring (such as a wiring 13) in the circuit patterns 15.

Figure 17:
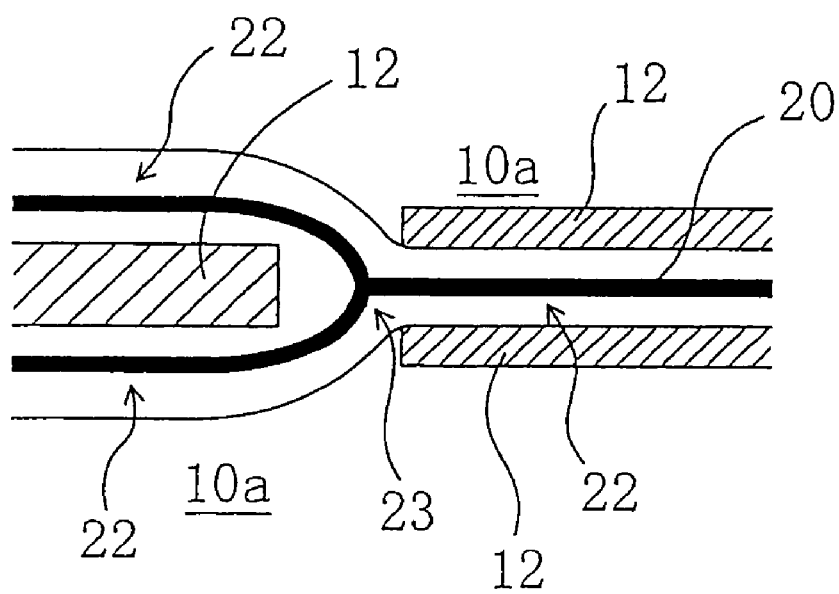
FIG. 17 is a plan view schematically showing a configuration of an optical fiber 20 which has a Y branching section 23 on an optical transmission channel board 100 according to Embodiments 1 and 2 of the present invention.

In the optical transmission channel board 100 of embodiments 1 and 2, the optical fibers 20 are embedded in the board 10. Thus, even in case that the optical fibers 20 have a Y branching section 23 as shown in FIG. 17 and hence are fragile, the present embedding enforces the optical fibers 20. More specifically, as shown in FIG. 17, the optical fiber 20 is embedded into the groove 22 (optical fiber mounting section) formed by the wirings 12 and the guide walls 18 under the wirings. When such optical fibers 20 having a Y branching section 23 are used, an optical module (board with built-in optical fiber) suitable for wavelength multiplexing is provided.

Figure 18:
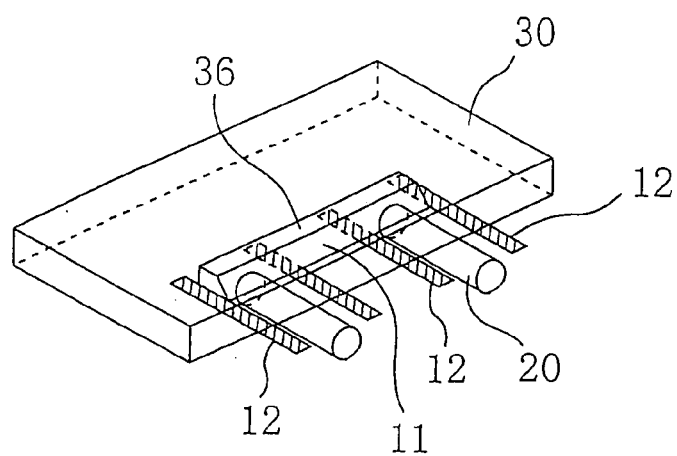
FIG. 18 is a partial enlarged perspective view showing an optical element 30 and a portion around optical fibers 20 of an optical transmission channel board 100 according to Embodiments 1 and 2 of the present invention.
Figure 19:
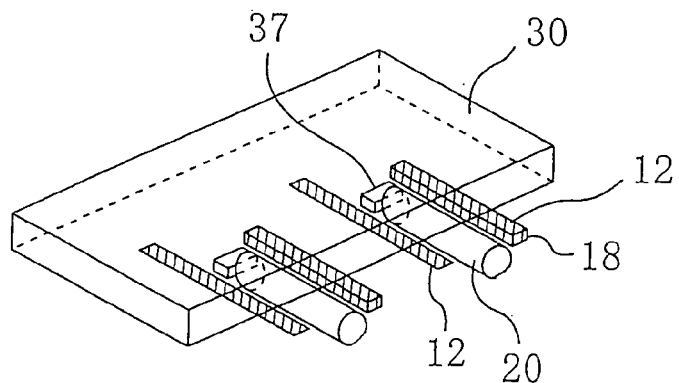
FIG. 19 is a partial enlarged perspective view showing an optical element 30 and a portion around optical fibers 20 of an optical transmission channel board 100 according to Embodiments 1 and 2 of the present invention.
Figure 20:
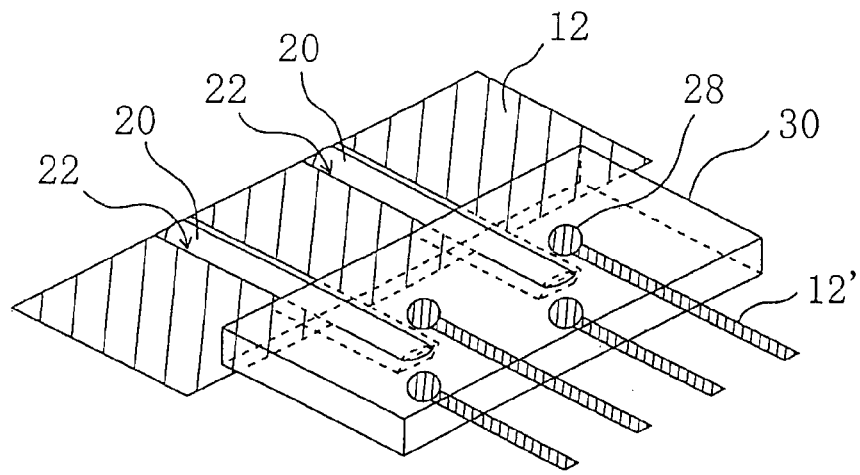
FIG. 20 is a partial enlarged perspective view showing an optical element 30 and a portion around optical fibers 20 of an optical transmission channel board 100 according to Embodiments 1 and 2 of the present invention.

Optical connection between the optical element 30 and the optical fibers 20 can be performed as shown in FIGS. 18-20. FIGS. 18, 19, and 20 are partial enlarged perspective views showing the surrounding portion of the optical element 30 and the optical fibers 20. For simplicity, a yet hidden portion in the optical element 30 is indicated as a shaded region.

In the configuration shown in FIG. 18, a mirror 36 having a reflection surface 11 is arranged under the optical element 30. The optical element 30 and the optical fibers 20 are optically connected via the mirror 36. In this example, the edges of both ends of the mirror 36 are defined by the inside lines of the wirings 12, so that the mirror 36 is positioned by the wirings 12.

In the configuration shown in FIG. 19, stoppers 37 for the optical fibers 20 are formed. In this example, as shown in FIG. 6, end faces of the optical fibers 20 are cut into 45°, so that optical connection between the optical fibers 20 and the optical element 30 is achieved. The stoppers 37 are formed under the optical element 30, and arranged in the grooves 22, for example. The stoppers 37 permit efficient arrangement of the optical fibers 20.

As shown in FIG. 20, the wirings to be connected electrically to the optical element 30 need not only be the wirings 12 extended from the optical fiber 20 side, but may also be the wirings 12' extended from the opposite direction. The wirings 12' are circuit patterns fabricated with the same positional precision as the wirings 12. In the example shown in FIG. 20, lands 28 are formed at the tips of the wirings 12', so that the optical element 30 is mounted on the lands 28.

Embodiments 1 and 2 have been described for the examples of an optical transmission channel board employing optical fibers. However, in place of optical fibers, optical waveguides composed of plane waveguides (PLCs) may be used as optical transmission channels 20. When optical waveguides composed of plane waveguides (PLCs) are used as optical transmission channels, a plurality of grooves formed on the plane waveguide (PLC) side are engaged with a plurality of the grooves 22. This improves manufacturability. When wirings 13 are formed on the plane waveguide (PLC) side, or when the optical element 30 is mounted on the plane waveguide (PLC) side, fabrication and the centering problem are further simplified. Nevertheless, from the perspective of cost, the use of optical fibers based on the fabrication method of the present embodiment can be advantageous over the use of the optical waveguides composed of plane waveguides (PLCs).

The present invention has been described above with reference to a preferred embodiment. This description is not a limitation, and hence various modifications can be made.

As described above, the fabrication method for a board with built-in optical transmission channel according to the present invention comprises: a step (a) of patterning a metal layer formed on a supporting board and thereby forming circuit patterns including a plurality of wirings; a step (b) of arranging an optical transmission channel between wirings of said circuit patterns; a step (c) of depositing a material containing resin onto said supporting board in such a manner that said circuit pattern and said optical transmission channel are covered; and a step (d) of removing said supporting board.

In a preferred embodiment, said step (a) includes: a step of preparing a supporting board and a metal layer formed on said supporting board; and a step of etching said metal layer using a mask corresponding to the circuit patterns.

In an example, a step of forming walls used as a guide for arranging an optical transmission channel, in at least a part of said circuit patterns is performed before said step (b).

In a preferred embodiment, at least a part of said walls is composed of metal.

In a preferred embodiment, at least a part of said walls is formed by sputtering.

In a preferred embodiment, said optical transmission channel is an optical fiber. The sum of the thickness values of said wall and said wiring located under the wiring is greater than the radius of said optical fiber.

In a preferred embodiment, in said step (b), said optical transmission channel is arranged such as to contact with said supporting board.

In a preferred embodiment, said optical transmission channel is arranged between said wirings so as to contact with said walls.

In an example, said material containing resin is preferably a composite material containing resin and inorganic filler.

In an embodiment, said optical transmission channel is an optical fiber. In said step (c), said material containing resin is deposited in a thickness of three times or more of the radius of said optical fiber.

In an embodiment, after said step (c) and before or after said step (d), the deposition film composed of said material is reversed in said step (c).

In a preferred embodiment, after said step (d), the uppermost portion of said optical transmission channel is substantially in plane with the upper surface of said circuit patterns.

In a preferred embodiment, a step of mounting electronic components electrically connected to said circuit pattern is further performed after said step (d).

In a preferred embodiment, at least one of said the electronic components is at least one optical element selected from a laser element and a photo receiving element. Said optical element is arranged above said optical transmission channel, or arranged such as to substantially contact with said optical transmission channel.

In an example, a board with built-in optical transmission channel according to the present invention comprises: a board composed of a material containing resin; circuit patterns formed on said board and including a plurality of wirings; and an optical transmission channel arranged between said wirings of said circuit patterns so as to substantially contact with said wirings when viewed from the above of said board.

In a preferred embodiment, the uppermost portion of said optical transmission channel is substantially in plane with the upper surface of said circuit patterns.

In a preferred embodiment, a portion lower than the upper surface of said board is present in at least a part of the upper surface of said circuit patterns.

In a preferred embodiment, the entirety of the upper surface of said circuit patterns is lower than the upper surface of said board.

In a preferred embodiment, said portion lower than the upper surface of said board in said circuit patterns is a land section.

In an example, said optical transmission channel may have a Y branching section arranged in said board.

In a preferred embodiment, a plurality of said optical transmission channels are provided, while said board is further provided with: a semiconductor element at least selected from a memory LSI and a logic LSI; a laser element; and a photo receiving element.

In a preferred embodiment, said optical transmission channel is an optical fiber.

In an embodiment, an optical module comprises: a board composed of a material containing resin; circuit patterns formed on said board and including a plurality of wirings; and an optical waveguide arranged between the wirings of said circuit patterns so as to substantially contact with said wirings when viewed from the above of said board.

In an example, a data processing apparatus according to the present invention comprises: an above-mentioned board with built-in optical transmission channel; and a semiconductor element mounted on said board with built-in optical transmission channel.

Embodiment 3

Figure 21:
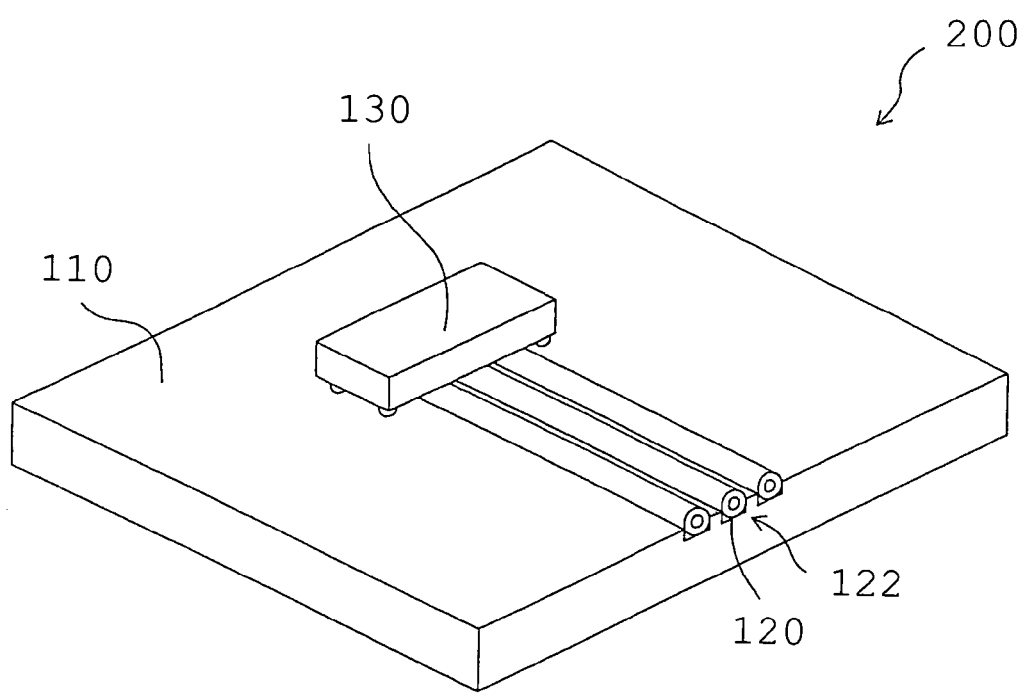
FIG. 21 is a perspective view schematically showing a configuration of an optical transmission channel board 200 according to Embodiment 3 of the present invention.

FIG. 21 is a perspective view schematically showing the configuration of an optical transmission channel board according to Embodiment 3.

As shown in FIG. 21, the optical transmission channel board 200 of Embodiment 3 comprises: a board 110 composed of a material containing resin; a plurality of grooves 122 formed in the surface of the board 110; and optical fibers 120 a portion of each of which is embedded in each groove 122. Circuit patterns (not shown) including a plurality of wirings are formed on the board 110. In the configuration of Embodiment 3, apart of the circuit patterns and the grooves 122 into which the optical fibers 120 are embedded are formed in self-conformity with each other. This self-conformal formation is described later in further detail in a fabrication method for the optical transmission channel board 200.

The optical transmission channels of the present invention are optical fibers 120 in Embodiment 3, and hence Embodiment 3 is described for the case of optical fibers. However, an "optical transmission channel" in the present specification indicates a line-shaped member capable of transmitting light.

Figure 50:
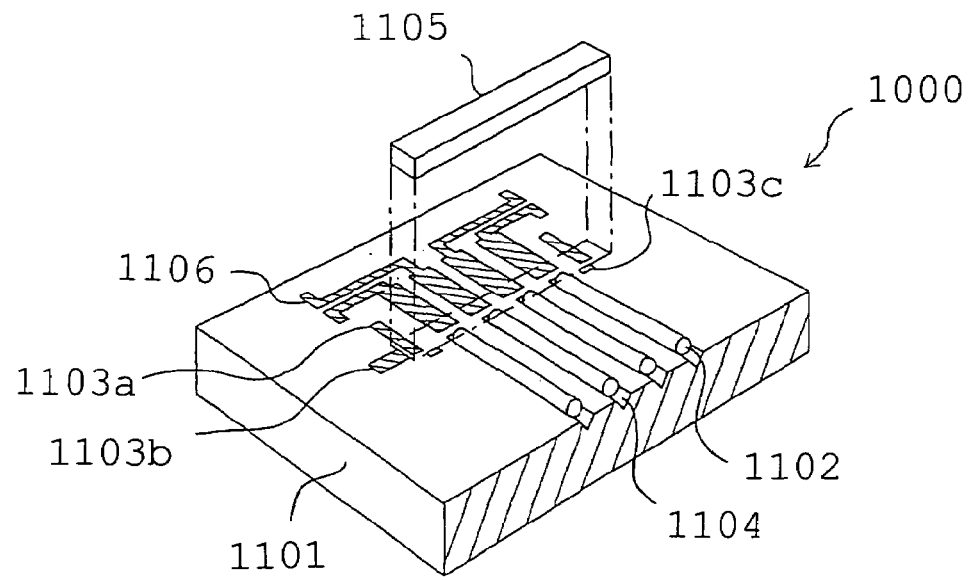
FIG. 50 is a perspective view showing a prior art optical module 1000.
Figure 51:
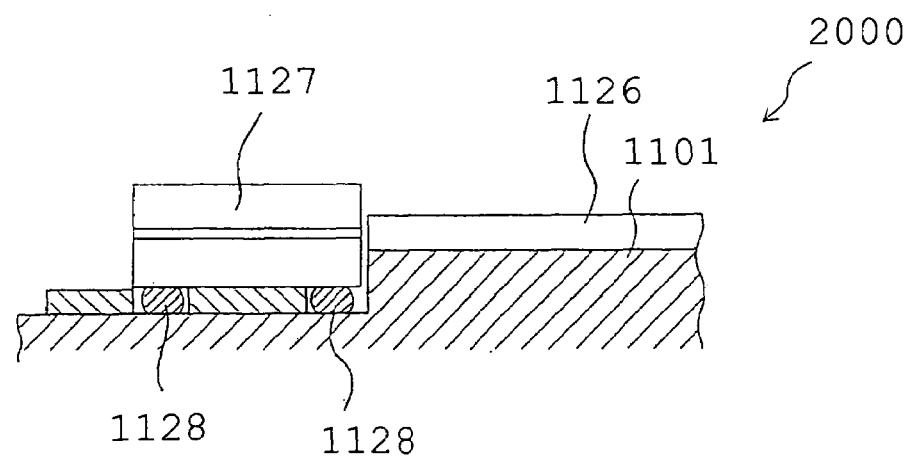
FIG. 51 is a sectional view showing a prior art optical module 2000.

In Embodiment 3, the board 110 is composed of a composite material containing resin and inorganic filler. The depth of the groove 122 formed in the board 110 is 1 μm through 5 mm or the like. Thickness of the board 110 is ½ or more of the radius of the optical fiber 120. An optical element 130 is mounted on the optical transmission channel board 100 shown in FIG. 21. The optical element 130 is optically connected to the optical fibers 120. The optical element 130 is electrically connected to a part of the circuit patterns (not shown) with reference to a marker (an optical element marker, hereafter) which is formed in conformity with the grooves 122 serving as mounting sections for the optical fibers 120 and which is used for positioning the optical element. The optical element marker is not illustrated, but typically composed of positioning reference planes 1103a, 1103b, and 1103c shown in FIG. 50 illustrating the prior art.

The optical element 130 is a laser element such as a semiconductor laser, or a photo receiving element such as a photo-diode. In Embodiment 3, the optical element 130 is arranged above the optical fibers 120. The phrase "arranged above an optical transmission channel" according to the present invention includes the state "arranged such as to substantially contact with the top of an optical transmission channel".

In Embodiment 3, an example of the electrically conductive material according to the present invention which constitutes the board 110 serving as an example of the retention board of the present invention is a composite material containing resin (such as a thermosetting resin and a thermoplastic resin) and inorganic filler. In this embodiment, a thermosetting resin is used as the resin for the composite material. Without using inorganic filler, the board 110 may be composed solely of thermosetting resin. The thermosetting resin is an epoxy resin or the like. When added, the inorganic filler is $Al_2O_3$, $SiO_2$, MgO, BN, AlN, or the like. The addition of inorganic filler permits the control of various physical properties (such as the thermal expansion coefficient). Thus, the board 10 is preferably composed of such a composite material containing inorganic filler. In Embodiment 3, inorganic filler of 100 weight units or more (preferably 140-180 weight units) is contained relative to the thermosetting resin of 100 weight units.

The role of inorganic filler is as follows. When $Al_2O_3$, BN, or AlN is added as inorganic filler, the thermal conductivity of the board 10 is improved. Further, when an appropriate inorganic filler is selected, the thermal expansion coefficient can be adjusted. In case that the thermal expansion coefficient is rather increased by the resin component, the addition of $SiO_2$, AlN, or the like can decrease the thermal expansion coefficient. In an appropriate case, when MgO is added, the thermal conductivity is improved while the thermal expansion coefficient is increased. Further, when $Si_2O$ (especially, amorphous $SiO_2$) is added, the thermal expansion coefficient is decreased while the dielectric constant is reduced.

A fabrication method for an optical transmission channel board according to Embodiment 3 is described below.

The optical transmission channel board 200 of Embodiment 3 is fabricated using a transfer method. More specifically, a metal layer formed on a supporting board is patterned so that circuit patterns are formed that include: wirings for constituting grooves; wirings used as an electric circuit; and wirings used as an optical element marker. Then, a material containing resin is deposited on the supporting board so as to cover the circuit patterns. The material including this deposited resin constitutes a board 110.

Then, the supporting board is removed so that the circuit patterns are exposed on the surface of the board 110. Then, a part of the circuit patterns (wirings for constituting the grooves) are removed so that the grooves 122 are formed in the surface of the board 110. Then, optical fibers 120 are arranged into the grooves 122. After that, an optical element 130 is mounted with reference to the optical element marker so that an optical transmission channel board 200 of Embodiment 3 is obtained.

As such, the circuit patterns 115 and the grooves 122 are formed in conformity. Further, a part of the circuit patterns are used as an optical element marker. This configuration permits automatic position adjustment with the optical fibers 120 optically connected to the optical element 130.

Thus, in comparison with the prior art case of FIG. 50 where the circuit patterns (including the position reference planes 1103a, 1103b, and 1103c) and the mounting sections (guide grooves 1104) for optical fibers are formed separately, alignment is achieved with self-conformity in Embodiment 3.

This resolves the problem of centering, and permits optical connection between the optical element 30 and the optical fibers 20. In a possible case that a centering process is to be performed in the optical transmission channel board 200 of Embodiment 3 in order to further improve the optical connection, rough centering has already been achieved with a precision better than that of the prior art configuration. Thus, fine centering solely is sufficient.

The optical element 130 is a semiconductor laser or the like, and is arranged above the optical fibers 120 in Embodiment 3. The optical element 130 may be a photo receiving element (such as a photo-diode). In Embodiment 3, the optical element 130 is connected to the wirings 113 via connection members (solder or bumps) 132. In the example shown in FIG. 24, the optical element 130 is solely mounted on the board 110. However, other electronic components (such as semiconductor elements) may be mounted on the board 110.

The above-mentioned fabrication method for an optical transmission channel board is described below in further detail with reference to FIGS. 22-24.

Figure 22A:
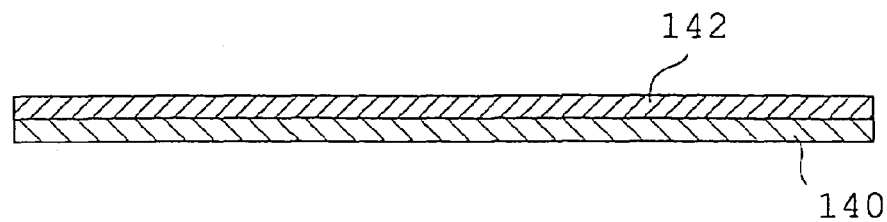
FIG. 22(a) is a process sectional view illustrating a fabrication method for an optical transmission channel board 200 according to Embodiment 3 of the present invention.

First, as shown in FIG. 22(a), a carrier sheet (transfer formation material) 140 on which a metal layer 142 is formed is prepared. The metal layer 142 is composed of copper or the like. The carrier sheet 140 serving as an example of the supporting board of the present invention is composed of a metallic foil (a copper or aluminum foil), a resin sheet, or the like.

Figure 22B:
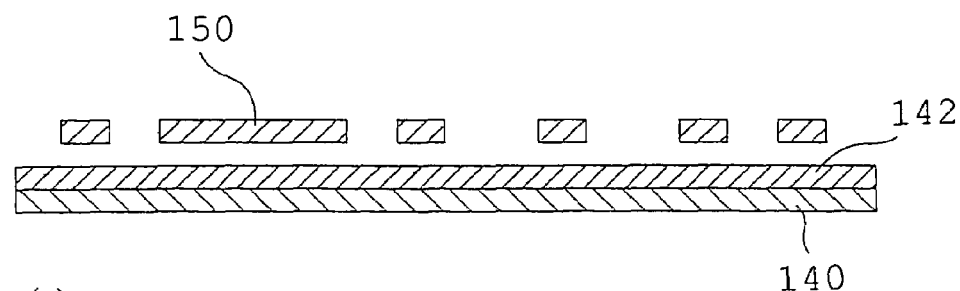
FIG. 22(b) is a process sectional view illustrating a fabrication method for an optical transmission channel board 200 according to Embodiment 3 of the present invention.
Figure 22C:
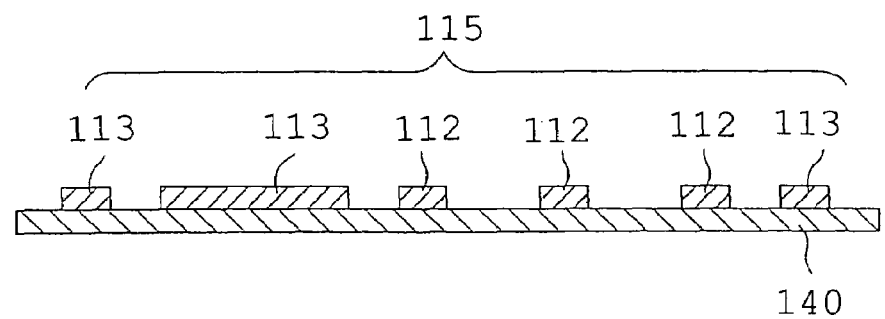
FIG. 22(c) is a process sectional view illustrating a fabrication method for an optical transmission channel board 200 according to Embodiment 3 of the present invention.

Then, as shown in FIG. 22(b), a mask 150 corresponding to the circuit patterns is arranged above the metal layer 142. Then, the metal layer 142 is etched. When the mask 150 is removed after the etching, circuit patterns 115 are formed as shown in FIG. 22(c). The circuit patterns 115 include: wiring portions used as a plurality of the wirings 113; groove portions (groove-use wirings) 112 to be used as the grooves 122; and wiring portions serving as an optical element marker (optical element marker wirings).

Figure 22D:
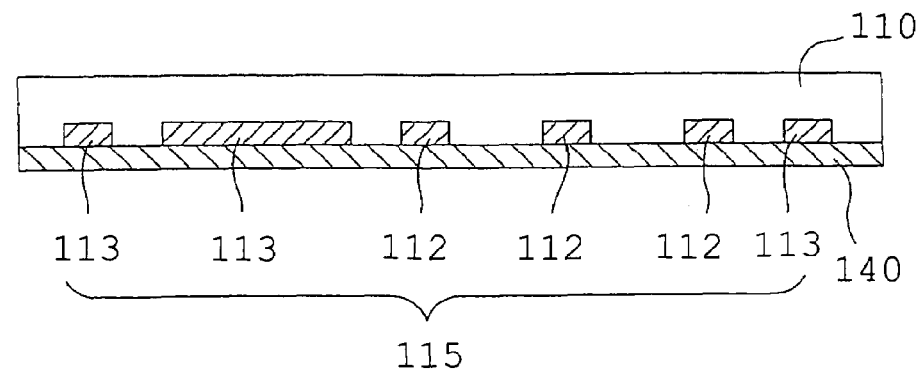
FIG. 22(d) is a process sectional view illustrating a fabrication method for an optical transmission channel board 200 according to Embodiment 3 of the present invention.

Then, as shown in FIG. 22(d), a material containing resin is deposited on the carrier sheet (supporting board) 140 so as to cover the circuit patterns 115. This deposited material containing resin constitutes a board 110 serving as an example of a retention board of the present invention.

Figure 23A:
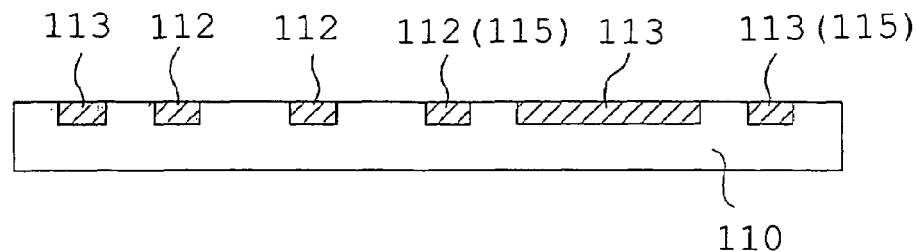
FIG. 23(a) is a process sectional view illustrating a fabrication method for an optical transmission channel board 200 according to Embodiment 3 of the present invention.

Then, as shown in FIG. 23(a), the board 110 composed of resin is reversed. Then, the carrier sheet 140 is removed. As a result, the circuit patterns 115 including the groove-use wirings 112, the wirings 113, and the optical element marker wirings are exposed on the surface of the board 110. At this time, the step of embedding the circuit patterns 115 in the board 110 which corresponds to a first step of the present invention is completed. Then, the circuit patterns 115 on the carrier sheet 140 are separated so that the transfer is completed. The board 110 may be reversed after the removal of the carrier sheet 140.

Figure 23B:
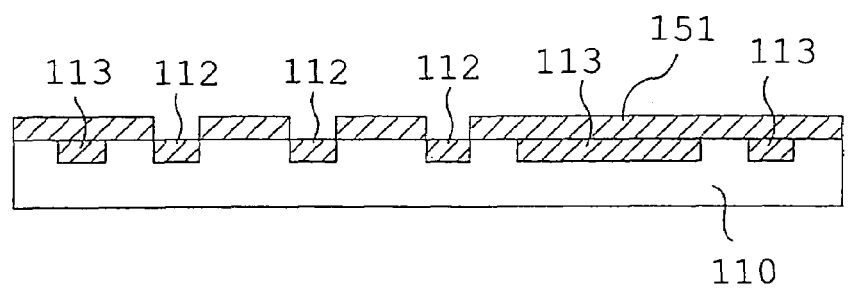
FIG. 23(b) is a process sectional view illustrating a fabrication method for an optical transmission channel board 200 according to Embodiment 3 of the present invention.
Figure 23C:
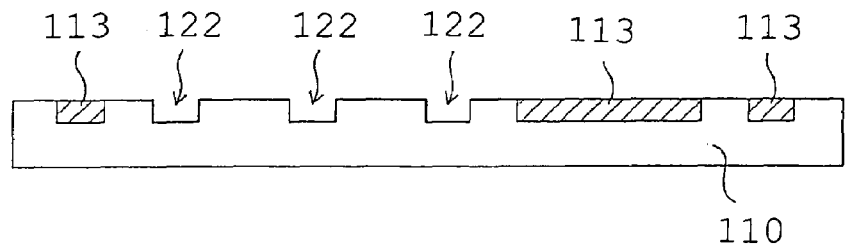
FIG. 23(c) is a process sectional view illustrating a fabrication method for an optical transmission channel board 200 according to Embodiment 3 of the present invention.

Then, as shown in FIG. 23(b), a mask 151 corresponding to the groove-use wirings 112 is arranged on the board 10. Then, the groove-use wirings 112 are etched and removed so that the grooves 122 are formed in the surface of the board 110 as shown in FIG. 23(c). At that time, the wirings 113 and the optical element marker wirings are covered by the mask 151. Thus, the groove-use wirings 112 are solely removed during the etching.

Figure 23D:
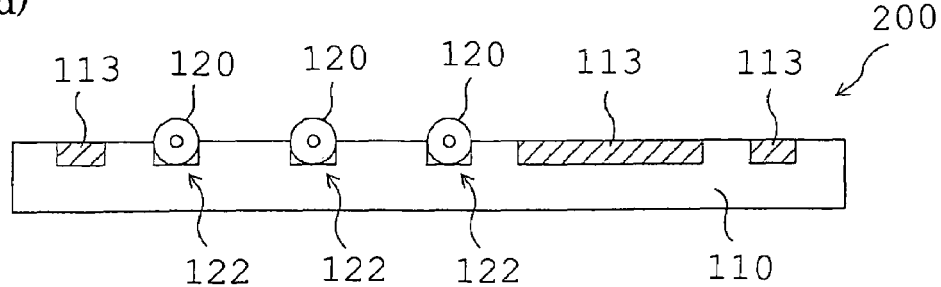
FIG. 23(d) is a process sectional view illustrating a fabrication method for an optical transmission channel board 200 according to Embodiment 3 of the present invention.

Then, when optical fibers 120 are arranged into the grooves 122 as shown in FIG. 23(d), an optical transmission channel board 200 of Embodiment 3 is obtained.

Figure 24:
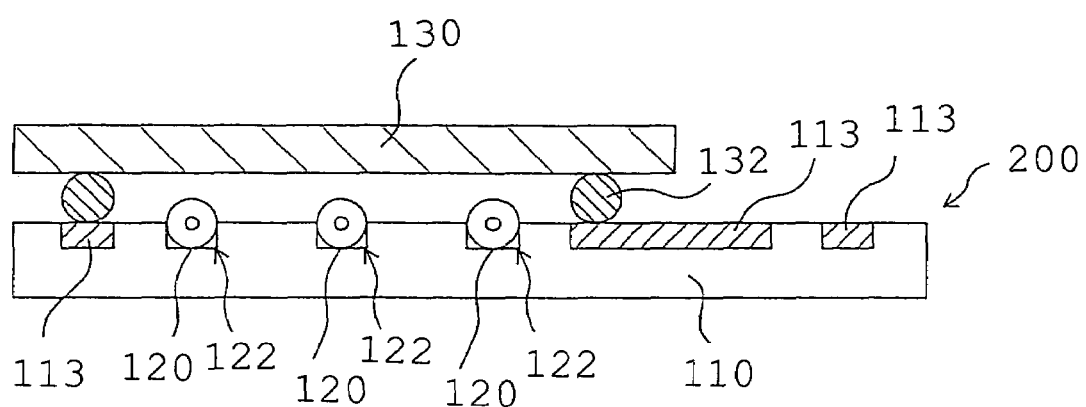
FIG. 24 is a process sectional view illustrating a fabrication method for an optical transmission channel board 200 according to Embodiment 3 of the present invention.

Then, as shown in FIG. 24, an electronic component (optical element) 130 is mounted on the wirings 113 exposed on the surface of the board 110, with reference to the optical element marker. As a result, an optical module is obtained. The optical element 130 electrically connected to the wirings 113 can be optically connected to the optical fibers 120 fixed in the grooves 122.

As described above, in the optical transmission channel board 200 of Embodiment 3, the wirings 112 constituting the grooves 22 for accommodating the optical fibers 120 and the wirings used as an optical element marker are fabricated using the same mask, as shown in FIGS. 22(b) and 22(c). Thus, the discrepancy between the optical element 130 and the optical fibers 120 can easily be suppressed within the tolerance.

In contrast, in the prior art configuration, the formation of an optical element marker formed together with the circuit patterns has been independent of the formation of optical fiber mounting sections. Thus, tolerance discrepancies in these processes have been affected each other, and hence the discrepancy between an optical element 130 and optical fibers 120 has been difficult to be suppressed within the tolerance. Thus, a centering was necessary.

On the other hand, in Embodiment 3, the circuit patterns 115 including the groove-use wirings 112 (grooves 122 used as the mounting sections for the optical fibers 120) and the optical element marker are formed using the single mask 150. Thus, conformity is kept through a series of the fabrication processes. Accordingly, what is necessary is to consider solely the tolerance discrepancy in the circuit patterns. Thus, the discrepancy between the optical element 130 and the optical fibers 120 can easily be suppressed within the tolerance.

The optical element marker of Embodiment 3 is a marker for positioning the optical element 130. However, this marker may serve also as the wirings used as an electric circuit.

A part of circuit patterns used as an electric circuit according to the present invention corresponds to the wirings 113 of Embodiment 3. A part of circuit patterns used as an optical transmission channel marker according to the present invention corresponds to the groove-use wirings 112 of Embodiment 3. However, these wirings may serve also as an optical element marker for positioning an optical element.

A first step of the present invention corresponds to the step shown in FIGS. 22(a)-22(d), for example. A second step of the present invention corresponds to the step shown in FIGS. 23(b)-23(c), for example. A third step of the present invention corresponds to the step shown in FIG. 23(d), for example. A fourth step of the present invention corresponds to the step shown in FIG. 24, for example. As shown in FIG. 22(a)-22(d) the first step has been described for the case that resin is deposited such as to cover the circuit patterns 115 fabricated on the supporting board 140 by etching, and that the supporting board 140 is then removed. However, the first step of the present invention is not limited to this. That is, another process may be used as long as wiring patterns can be embedded such as to form the groove-use wirings 112 and a plurality of the wirings 113 on the board 110.

A mask corresponding to a part of circuit patterns used as an optical transmission channel marker of the present invention corresponds to the mask 151 shown in FIG. 23(b) of Embodiment 3, for example. The mask 151 covers the entire surfaces of the board 110 and a plurality of the wirings 113 except for the portion serving as the groove-use wirings 112. However, it is sufficient that the portion of a plurality of the wirings 113 is covered. That is, a part of the surface of the board 110 need not be covered.

Figure 25:
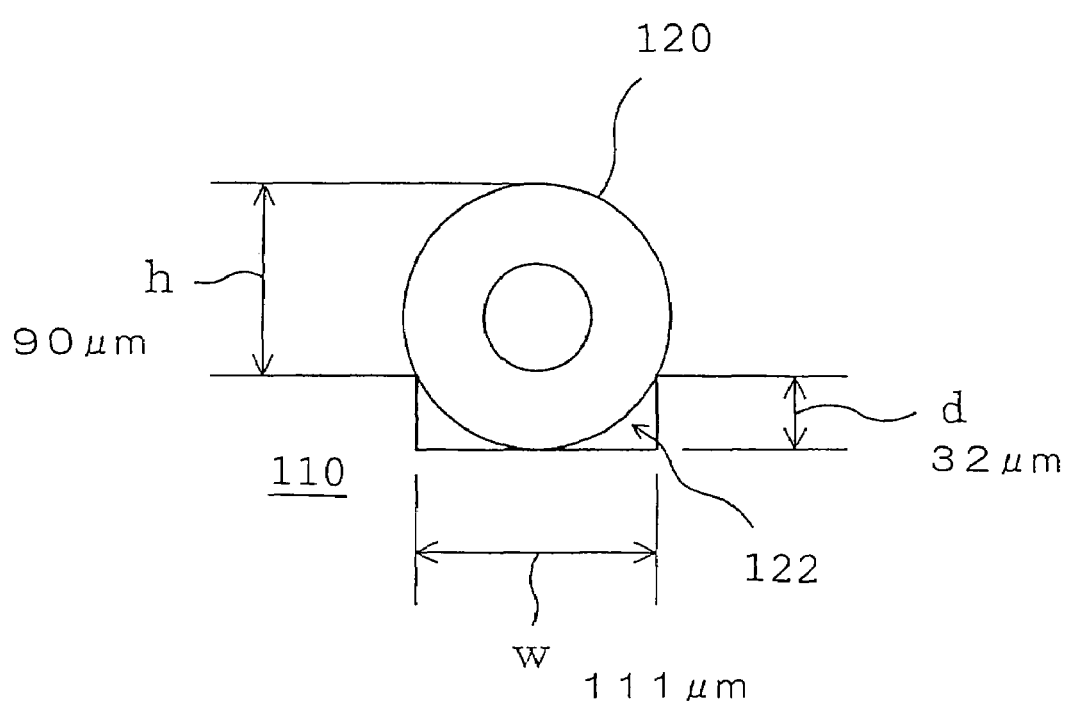
FIG. 25 is a main part enlarged sectional view showing a groove 122 and an optical fiber 120 of an optical transmission channel board 200 according to Embodiment 3 of the present invention.

FIG. 25 is a diagram illustrating the detail of a configuration of Embodiment 3. Part of the optical fiber 120 is located in the groove 122. The height h of the optical fiber 120 relative to the board 110 surface is 90 μm. The depth d of the groove 122 is 32 μm. The width w of the groove 122 is 111 μm. Depending on the dimensions and the type of the optical fibers 120, dimensions of 1 μm can be sufficient for the attaching of the optical fibers 120 in some cases. According to the configuration of Embodiment 3, the optical fibers 120 are embedded (built) in the board 110. Thus, the optical fibers 120 can easily be arranged by using the grooves 122 as a guide, rather than by placing the optical fibers 120 on the board plane.

Figure 26:
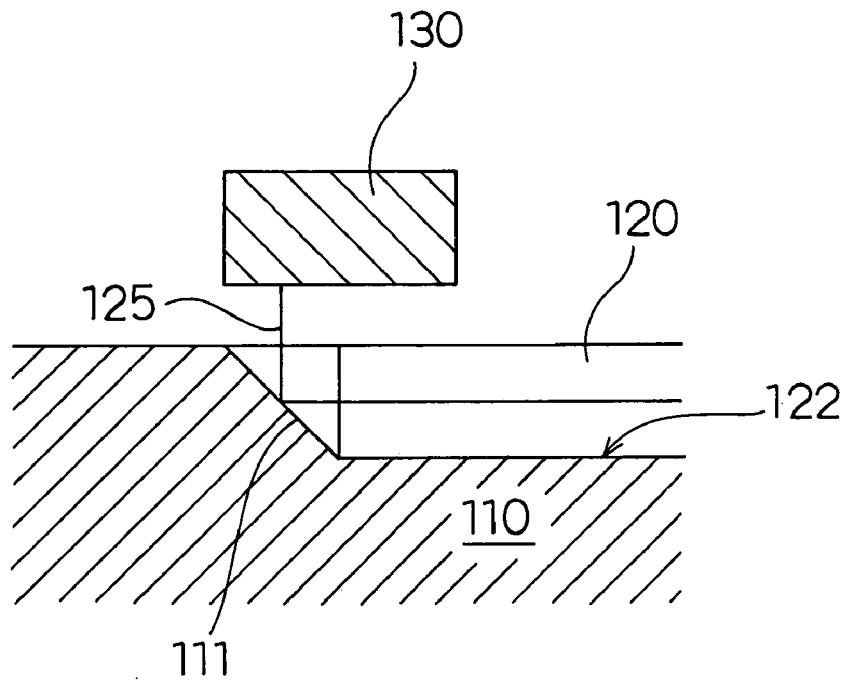
FIG. 26 is a sectional view illustrating optical connection between an optical element 130 and an optical fiber 120 of an optical transmission channel board 200 according to Embodiment 3 of the present invention.

The optical element 130 and the optical fiber 120 can be optically connected, for example, as shown in the schematic sectional view of FIG. 26. That is, as shown in FIG. 26, a reflection surface (inclined surface) 111 is formed in a part of the board 110. Then, optical connection by light (optical signals) 125 is achieved between the optical element 130 and the optical fiber 120 via the reflection surface 111. In an example, the reflection surface 111 is obtained by fabricating an inclined surface in the board 110 and then forming a metal layer (such as an Au layer) on the surface of the inclined surface. Alternatively, an optical component (mirror) having a reflection surface 111 may be placed on the board 110.

Figure 27:
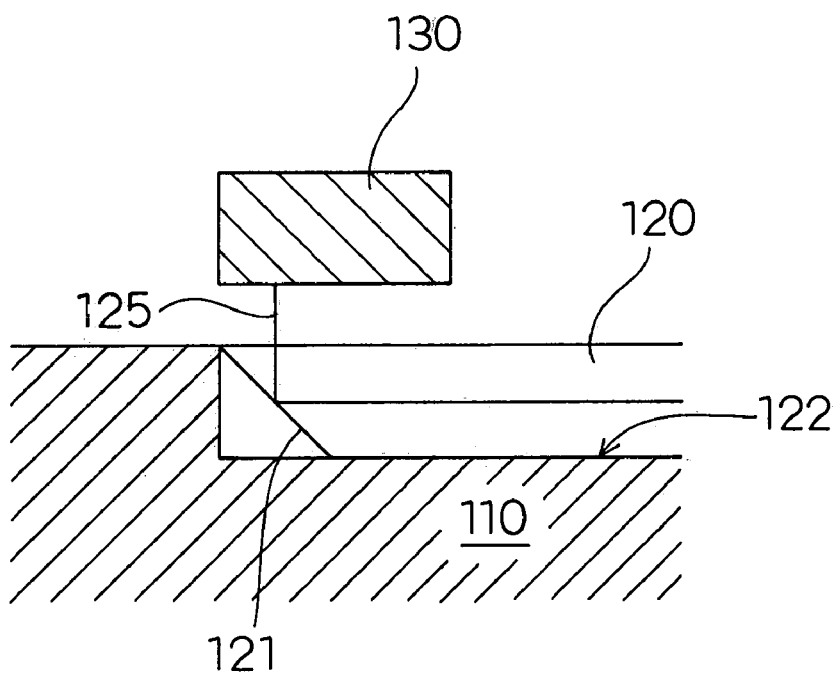
FIG. 27 is a sectional view illustrating optical connection between an optical element 130 and an optical fiber 120 of an optical transmission channel board 200 according to Embodiment 3 of the present invention.

Alternatively, as shown in the schematic sectional view of FIG. 27, an end face 121 of the optical fiber 120 may be cut aslant (such as a 45° cut) so that light 125 should be reflected in the end face 121. As a result, optical connection is achieved between the optical element 130 and the optical fiber 120. In the configuration shown in FIGS. 26 and 27, a transparent medium may be present in the path of the light 125 between the optical element 130 and the optical fiber 120. The transparent medium may be air, glass, transparent resin, or the like. Similarly to Embodiments 1 and 2, the transparent resin indicates a material permitting optical connection between the optical element 130 and the optical fiber 120, and capable of transmitting light of a wavelength of 850 nm, 1330 nm, and 1550 nm or the like. More specifically, the transparent resin may be polyimide, epoxy aramid, or the like. Alternatively, an optical component (such as a lens) may be arranged between the optical element 130 and the optical fiber 120.

When the optical element 130 is mounted on a portion corresponding to the wirings 113 of the circuit patterns, pad sections may be formed in the wirings 113 so that the pad sections may be connected to the element terminals of the optical element 130 by wire bonding. Nevertheless, such wire bonding connection is disadvantageous in high speed characteristics. Thus, as an example shown in FIG. 24, the connection between the optical element 130 and the wirings 113 is preferably realized by flip chip mounting or the like using connection members (such as bumps and solder balls) 132. In this case, lands are formed in the portions of the wirings 113 with which the connection members 132 contact.

Figure 28:
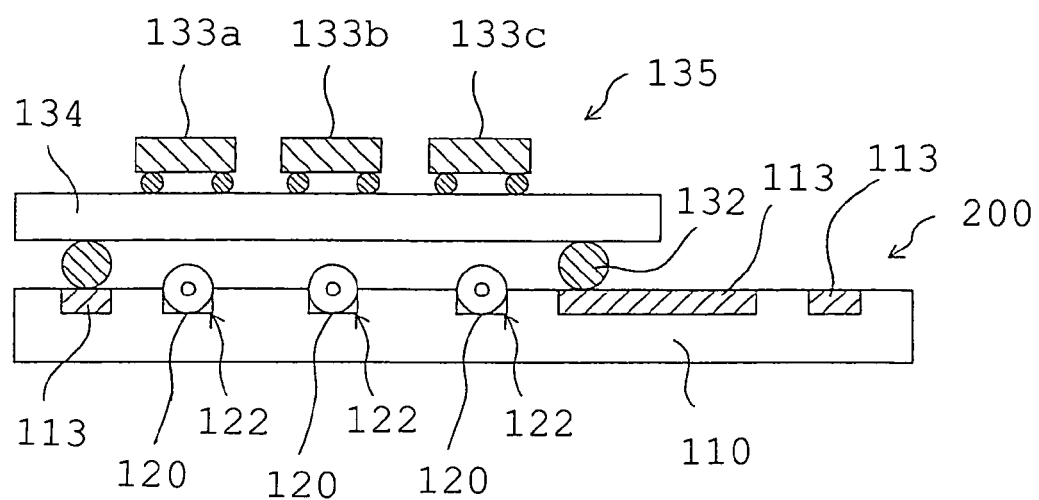
FIG. 28 is a sectional view schematically showing a configuration in which an MCM 135 is mounted on an optical transmission channel board 200 according to Embodiment 3 of the present invention.

As shown in FIG. 28, the optical fibers 120 may be optically connected to optical elements within an MCM (multi-chip module) 135, in place of a single optical element 130. As shown in FIG. 28, a plurality of electronic components 133a; 133b, and 133c are mounted on an interposer 134 so that an MCM 135 is constructed. At least one of the electronic components 133a, 133b, and 133c is an optical element. All the electronic components 133a, 133b, and 133c may be laser elements (semiconductor lasers), or may be photo receiving elements (photo-diodes). Alternatively, they may be a combination of laser elements and photo receiving elements. In an example, an opening is formed in a part of the interposer 134 corresponding to the optical path between the optical elements and the optical fibers. An optical component (such as a lens) may be arranged in the position of the opening. The electronic components 133a and 133b composed of optical elements may be mounted on the back side of the interposer 134.

In the prior art, position adjustment has been necessary between the grooves 122, the interposer 134, and the electronic components 133a, 133b, and 133c corresponding to the optical fibers 120. However, according to the fabrication method of Embodiment 3, the positions of the optical element marker and the grooves 122 are formed in self-conformity using a single mask. This simplifies the position adjustment between the interposer 134 on the wirings 113 and the optical fibers 120 in the grooves 122, and hence simplifies the centering process in comparison with the prior art.

Figure 29:
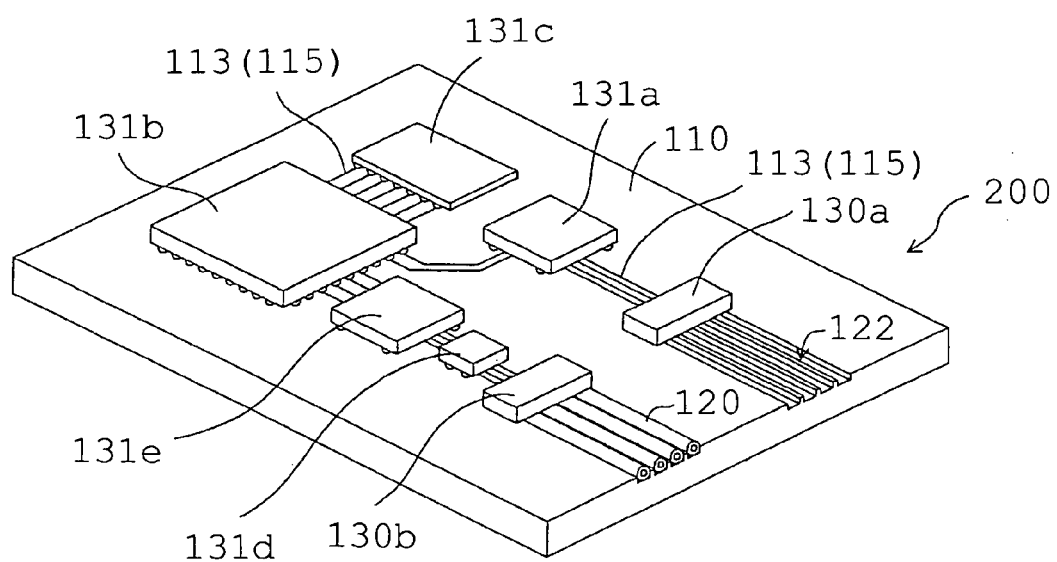
FIG. 29 is a perspective view schematically showing a configuration of an optical module (data processing apparatus) employing an optical transmission channel board 200 according to Embodiment 3 of the present invention.
Figure 30A:
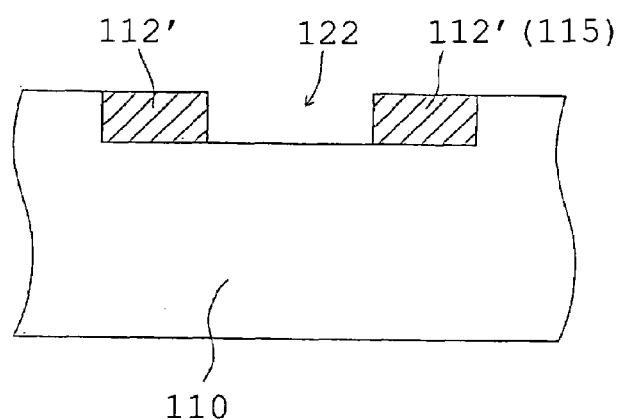
FIG. 30(a) is a main part enlarged view showing a groove 122 of an optical transmission channel board 200 according to Embodiment 4 of the present invention.
Figure 30B:
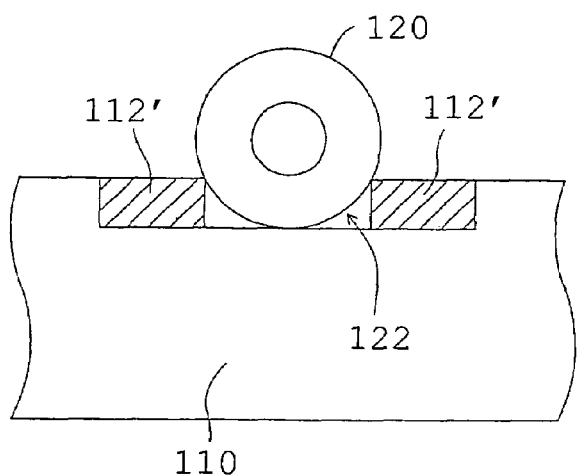
FIG. 30(b) is a main part enlarged view showing a state in which an optical fiber 120 is placed in a groove 122 of an optical transmission channel board 200 according to Embodiment 4 of the present invention.
Figure 30C:
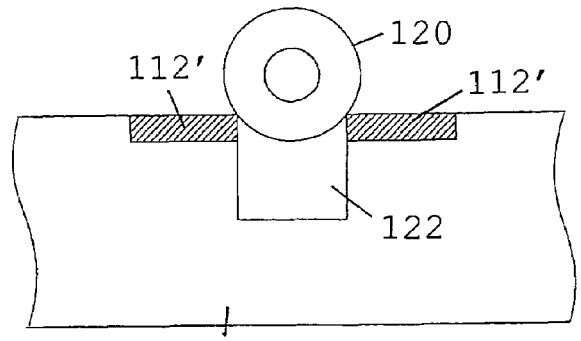
FIG. 30(c) is a main part enlarged view showing a state in which an optical fiber 120 is placed in a groove 122 of an optical transmission channel board 200 according to Embodiment 4 of the present invention.
Figure 30D:
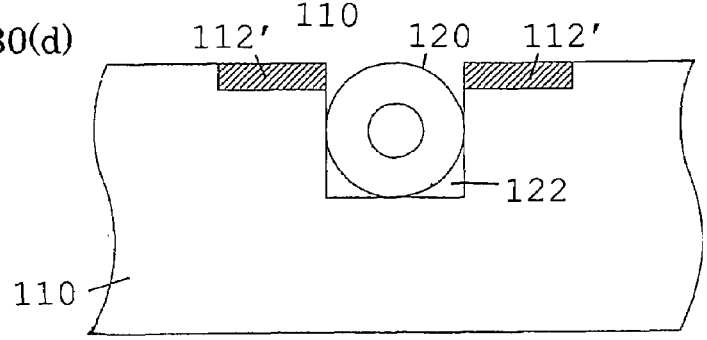
FIG. 30(d) is a main part enlarged view showing a state in which an optical fiber 120 is placed in a groove 122 of an optical transmission channel board 200 according to Embodiment 4 of the present invention.

In the optical transmission channel board 200 of Embodiment 3, the circuit patterns 115 including the wirings 113 with the groove-use wirings 112 are easily formed by a transfer method. Thus, even electronic components other than optical elements (semiconductor elements) can be mounted similarly to the case of a typical printed circuit board. FIG. 29 shows an optical module in which electronic components 131 (131a, 131b, 131c, 131d, and 131e) in addition to the optical elements 130a and 130b are mounted on an optical transmission channel board 200. The optical module shown in FIG. 29 can be used as a data processing apparatus. This module is described below in further detail.

The optical element 130a is a laser element, and may be a vertical-cavity surface-emitting laser (VCSEL). On the other hand, the optical element 130b is a photo receiving element, and may be a photo-diode unit having a plurality of photo-receiving sections. For the simplicity of understanding the configuration of Embodiment 3, grooves 122 are shown without optical fibers 120 to be optically connected to the optical element 130a.

A driver IC 131a is connected to the optical element 130a composed of a laser element. The driver IC 131a is connected to an LSI chip (such as a logic LSI like an image processing LSI) 131b. The LSI chip 131b is connected to a memory chip 131c. An optical element 130b composed of a photo receiving element is connected to the LSI chip 131b via an amplifier (preamplifier) 131d and an amplifier 131e. These electronic components 131 are mutually connected through the wirings 113 in the circuit patterns 115.

The problem of centering is resolved by the configuration of the groove-use wirings 112 for accommodating the optical fibers 120 and the optical element marker wirings. Thus, other wirings may be formed on the board 110 separately in a step other than a transfer process (for example, in an independent and later step). However, from the perspective of fabrication procedure, cost, and the like, it is efficient to fabricate other wirings not relevant to the optical element 130 in the same step as that of the circuit patterns 115, as in the fabrication method of Embodiment 3.

The optical module (data processing apparatus) shown in FIG. 29 can perform optical transmission through the optical fibers 120. Thus, mass data can be transmitted at a high speed. Further, this module fabricated by the method of Embodiment 3 has a low fabrication cost.

That is, in the prior art, the optical element markers and the optical fiber mounting sections have been fabricated in separate steps. This has caused a larger tolerance discrepancy and hence a higher fabrication cost. In contrast, in the present invention, the circuit patterns 115 including the groove-use wirings 112, the wirings 113, and the optical element marker wirings are integrally fabricated first. Then, the grooves 122 used as an optical fiber mounting sections are formed from the groove-use wirings 112. This reduces the fabrication cost. Thus, the cost can be reduced in optical modules presently used in optical communications (such as the Internet and telephone). This accelerates the spread of such optical modules.

Further, the cost reduction permits the use of economical optical transmission in within-the-board transmission (level 2) in the communication system apparatus 3000 shown in FIG. 52. This improves the speed of within-the-board transmission. As such, the present invention is applicable to the bookshelf type communication system apparatus 3000 shown in FIG. 52. Further, the optical transmission channel board or optical module 1000 of the present invention may be used as a main apparatus such as a next-generation high performance optical I/O module and a data processing apparatus (like an image processing apparatus).

Embodiment 4

Further features and further modifications of the optical transmission channel board 200 of Embodiment 3 are described below with reference to other drawings.

In Embodiment 3 described above, the grooves 122 have been formed by the groove-use wirings 112. However, the grooves 122 may be fabricated by etching a part of a board 110 in the state shown in FIG. 23. Nevertheless, when the grooves 122 are solely fabricated, the grooves 122 serving as optical fiber mounting sections and wirings 113 on which the optical element 130 is mounted are fabricated in separate parts.

Thus, in place of the mask 151 shown in FIG. 23(*b*) of Embodiment 3, a mask is used in which an opening is formed in the middle of the groove-use wiring 112. That is, in order that the above-mentioned fabrication in separate parts should be avoided, as shown in FIG. 30(*a*), it is preferable that the portion between a wiring 112' and a wiring 112' corresponding to the groove-use wiring 112 included in the circuit patterns 115 of Embodiment 3 is removed so that a groove 122 is formed. In this case, the groove 122 is formed in conformity with the circuit patterns 115.

A part of a board portion between adjacent ones of said electrode patterns of the present invention is, for example, the portion of the board 110 between the wiring 112' and the wiring 112' contained in the circuit patterns 115 shown in FIG. 30(*a*).

The optical element marker may serve also as the wirings used as an electric circuit, and further may serve also as the wirings used as an optical transmission channel marker.

A part of the circuit patterns used as an optical transmission channel marker of the present invention corresponds to the wirings 112' of Embodiment 4. The wirings 112' are lines for defining the groove 122. Unlike the groove-use wirings 112 (see FIG. 23) which disappear later, the wirings 112' remain also in the optical transmission channel board 200 serving as an end product. Thus, the wirings 112' may serve as wirings for a signal or for power supply, that is, as wirings used as an electric circuit of the present invention. When an optical fiber 120 is mounted, the configuration shown in FIG. 30(*b*) is obtained. The optical fiber 120 is an insulator. Thus, even when the optical fiber 120 contacts with the wirings 112', no problem arises in particular.

The mask corresponding to a part of a retention board of the present invention is the mask used for removing the portion between the wirings 112' of Embodiment 4, for example. The portions of the wirings 112' and the wirings 113 need not be covered. That is, sufficient is such a mask that the resin portion between the wirings 112' is open and that other resin portions are covered.

In Embodiment 4, positioning of the optical fiber 120 is regulated by the edge portions of the two wirings 112' on the surface side of the board 110. Thus, as shown in FIG. 30(*c*), the depth of the groove 122 may be deeper than the embedding position of the wirings 112'. That is, the optical fiber 120 need not contact with the bottom surface of the groove 122.

As shown in FIG. 30(*d*), the depth of the groove 122 and the spacing between the wirings 112' may be equal to the diameter of the optical fiber 120 so that the optical fiber 120 should not protrude above the surface of the board 110. The depth of the groove 122 may be further deeper.

Also in Embodiment 3, the size of the groove-use wirings 112 may be changed as described above. In these configurations, the optical fiber 120 does not contact with the bottom surface of the groove 122, or alternatively the optical fiber 120 does not protrude above the surface of the board 110.

Figure 31A:
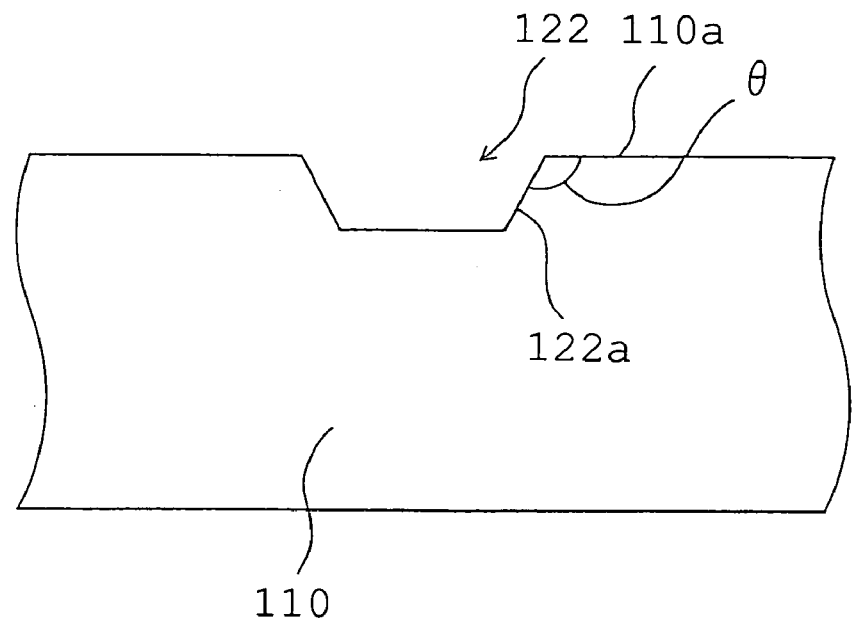
FIG. 31(a) is a main part enlarged view showing a groove 122 of an optical transmission channel board 200 according to a modification of the present invention.
Figure 31B:
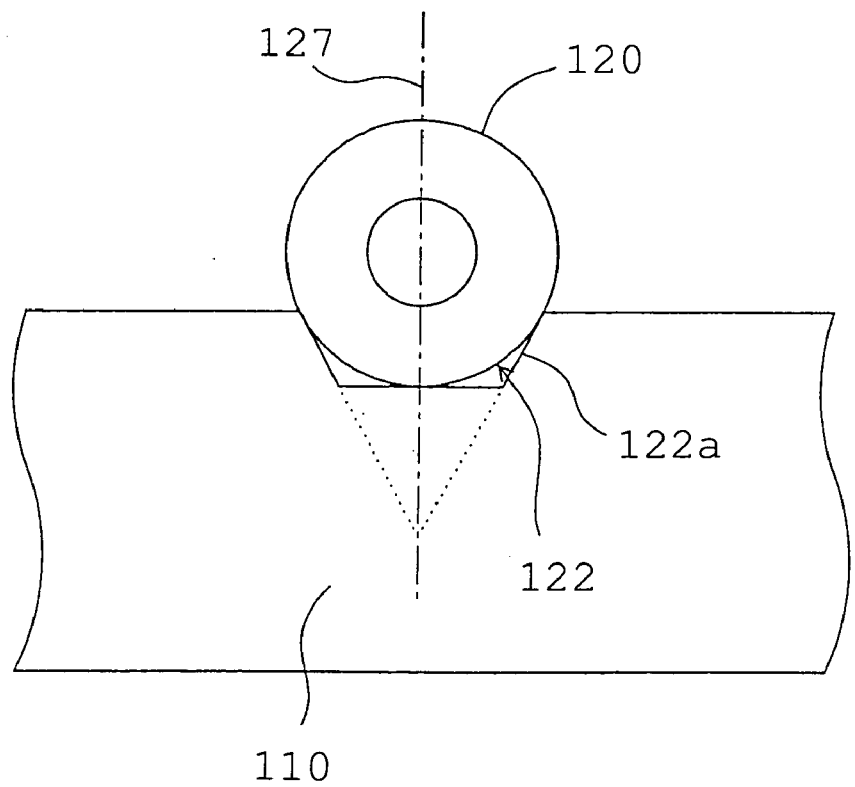
FIG. 31(b) is a main part enlarged view showing a state in which an optical fiber 120 is placed in a groove 122 of an optical transmission channel board 200 according to a modification of the present invention.

As shown in FIG. 31(*a*), the shape of the groove 122 described in Embodiments 3 and 4 may be changed so that the groove edges form a taper. More specifically, the angle θ between a side surface (wall) 122*a* for defining the groove 122 and the surface (upper surface) 110*a* of the board 110 is not limited to 90°, and may be an obtuse angle. In order that the groove 122 having obtuse angles θ, etching is performed from an acute angle direction, for example. When the edges of the groove 122 form a taper as shown in FIG. 31(*b*), the accuracy in the position adjustment of the center line 127 of the optical fiber 120 is improved by the inclined surfaces of the walls 122*a*.

Figure 32:
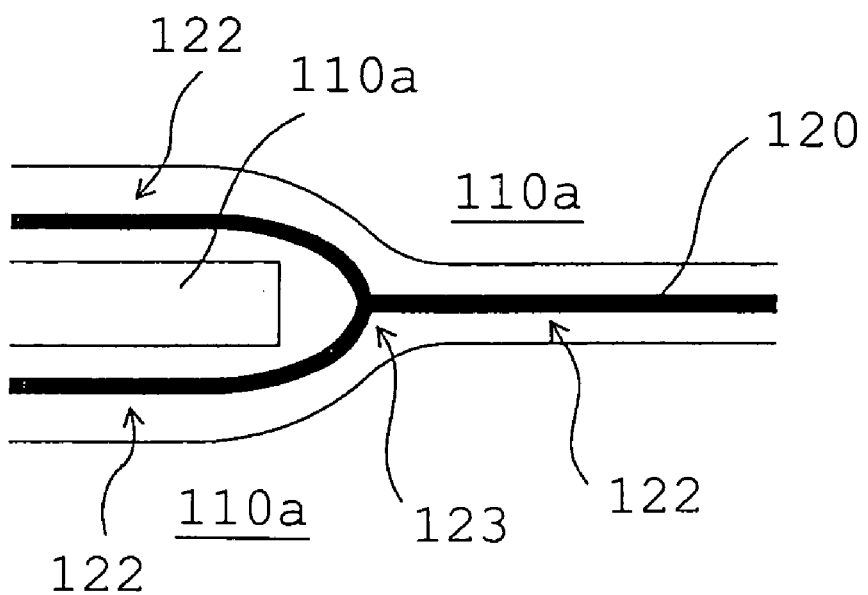
FIG. 32 is a plan view schematically showing a state in which an optical fiber 120 having a Y branching section 123 is placed on an optical transmission channel board 200 according to the present invention.

A Y branching section 123 as shown in FIG. 32 may be formed in the optical fiber 20 on the optical transmission channel board 200 of Embodiments 3 and 4. The use of such an optical fiber 120 having a Y branching section 123 provides an optical module (optical transmission channel board) suitable for wavelength multiplexing. When such an optical fiber 120 having a Y branching section 123 is used, it is sufficient that the groove 122 is formed into a form corresponding thereto, so that the optical fiber 120 is appropriately retained by the groove 122.

As for the optical connection between the optical element 130 and the optical fiber 120, a mirror having a reflection surface 111 (see FIG. 26) may be arranged under the optical element 130 so that optical connection between the optical element 130 and the optical fiber 120 may be performed using the mirror. A stopper for the optical fiber 120 may be arranged so as to position the optical fiber 120. The stopper is arranged under the optical element 130, and may be arrange in the groove 122, for example.

An optical element of the present invention corresponds to the optical element 130 in Embodiments 3 and 4, and is arranged above the optical fiber 120 as shown in FIG. 26. In case that this optical element is a light emitting element, the optical element 130 is a surface emitting type element (light is emitted from its bottom surface). In place of this surface emitting type element, an edge emitting type element (light is emitted from the end face of the optical element) may be arranged in a direction extended from of the optical fiber 120 (substantially provided on the same plane on which the optical fiber is provided).

Figure 33:
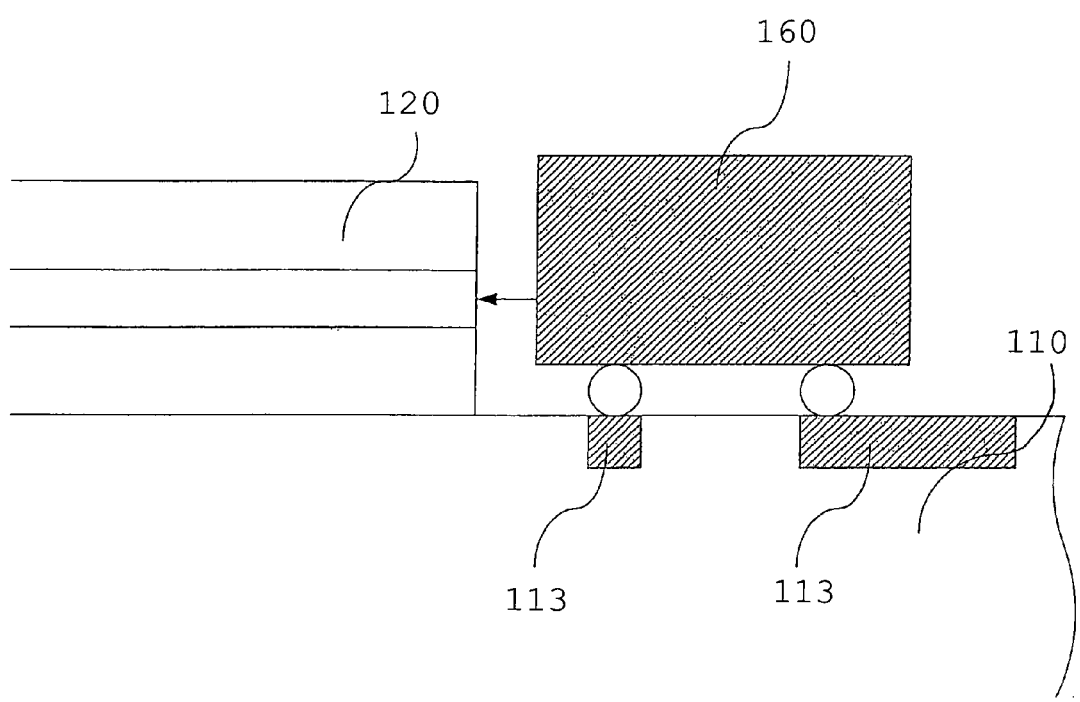
FIG. 33 is a sectional view showing relation between an optical fiber 120 and an edge emitting type element 160 which are placed and mounted on an optical transmission channel board 200 according to the present invention.

FIG. 33 is a side view of an optical transmission channel board employing an edge emitting type element 160. As shown in FIG. 33, in order that optical connection is established for the edge emitting type element, the depth of the groove for mounting the optical fiber 120 needs to be adjusted such as to match with the height of the edge emitting type element 160. In a prior art optical transmission channel board employing an edge emitting type element, position adjustment has been necessary in the depth direction (perpendicular to the plane of the board 110) and in a direction parallel to the plane of the board 110. However, in the fabrication method of Embodiments 3 and 4, position adjustment in the parallel direction is almost unnecessary. This simplifies the centering process, and hence reduces the fabrication cost in comparison with the prior art.

Embodiments 3 and 4 have been described for the case that the optical transmission channel board employs optical fibers. However, in place of the optical fibers 120, optical waveguides composed of plane waveguides (PLCs) may be used as optical transmission channels. When optical waveguides composed of plane wave guides (PLCs) are used as optical transmission channels, a plurality of grooves formed on the plane waveguide (PLC) side are engaged with a plurality of the grooves 122. This improves manufacturability. When wirings 13 are formed on the plane waveguide (PLC) side, or when the optical element 130 is mounted on the plane waveguide (PLC) side, fabrication and the centering problem are further simplified. Nevertheless, from the perspective of cost, the use of optical fibers based on the fabrication method of Embodiments 3 and 4 can be advantageous over the use of the optical waveguides composed of plane waveguides (PLCs).

The present invention has been described above with reference to a preferred embodiment. This description is not a limitation, and hence various modifications can be made. For example, in the above-mentioned embodiment, the circuit patterns for arranging the optical element 130 shown in FIG. 24 have also been embedded. However, the step of embedding the circuit patterns for the optical element marker may be omitted.

As described above, a fabrication method for an optical transmission channel board according to the present invention comprises: a step (a) of patterning a metal layer formed on a supporting board and thereby forming circuit patterns including a plurality of wirings; a step (b) of depositing a material containing resin on said supporting board so as to cover said circuit patterns; a step (c) of removing said supporting board and thereby exposing said circuit patterns in the surface of the resin film composed of said material containing resin; a step (d) of removing a part of said circuit patterns and thereby forming a groove in the surface of said resin film; and a step (e) of arranging an optical transmission channel into said groove.

In a preferred embodiment, said step (a) comprises: a step of preparing a supporting board and a metal layer formed on said supporting board; and a step of etching said metal layer using a mask corresponding to the patterns including said circuit patterns.

In a preferred embodiment, said circuit patterns include: a wiring portion serving as a plurality of said wirings; and a groove portion used as said groove.

In an example, said material containing resin is preferably a composite material containing resin and inorganic filler.

In an embodiment, the depth of said groove is 1 µm or more and 5 mm or less.

In an embodiment, in said step (b), said material containing resin is deposited in ½ or more of the thickness of the radius of said optical transmission channel.

In a preferred embodiment, in said step (d), said groove is formed such that the edges of said groove form a taper.

In a preferred embodiment, a step of mounting electronic components electrically connected to said circuit pattern is further performed after said step (e).

In a preferred embodiment, at least one of said the electronic components is at least one optical element of a laser element and a photo receiving element. Said optical element is arranged on or above said optical transmission channel.

In an embodiment, another fabrication method for an optical transmission channel board according to the present invention comprises: a step (a) of patterning a metal layer formed on a supporting board and thereby forming circuit patterns including a plurality of wirings; a step (b) of depositing a material containing resin on said supporting board such as to cover said circuit pattern; a step (c) of removing said supporting board and thereby exposing said circuit pattern in the surface of the resin film composed of said material containing resin; a step (d) of removing the resin present between the wirings of said circuit patterns and thereby forming a groove in the surface of said resin film; and a step (e) of arranging an optical transmission channel into said groove.

In a preferred embodiment, said optical transmission channel is an optical fiber.

In an embodiment, an optical transmission channel board according to the present invention comprises: a board composed of a material containing resin; and circuit patterns formed on said board and including a plurality of wirings. A plurality of grooves are formed in the surface of said board. A portion of an optical transmission channel is embedded in each of a plurality of said grooves.

In a preferred embodiment, said grooves in which said optical transmission channels are embedded and a part of said circuit patterns are formed in self-conformity with each other.

In a preferred embodiment, said optical transmission channel has a Y branching section arranged in said groove.

In a preferred embodiment, the edges of said groove form a taper.

In a preferred embodiment, said board is provided with: a semiconductor element at least selected from a memory LSI and a logic LSI; a laser element; and a photo receiving element.

In a preferred embodiment, said optical transmission channel is an optical fiber.

A data processing apparatus according to the present invention comprises: an above-mentioned optical transmission channel board; and a semiconductor element mounted on said optical transmission channel board.

Embodiment 5

Figure 34:
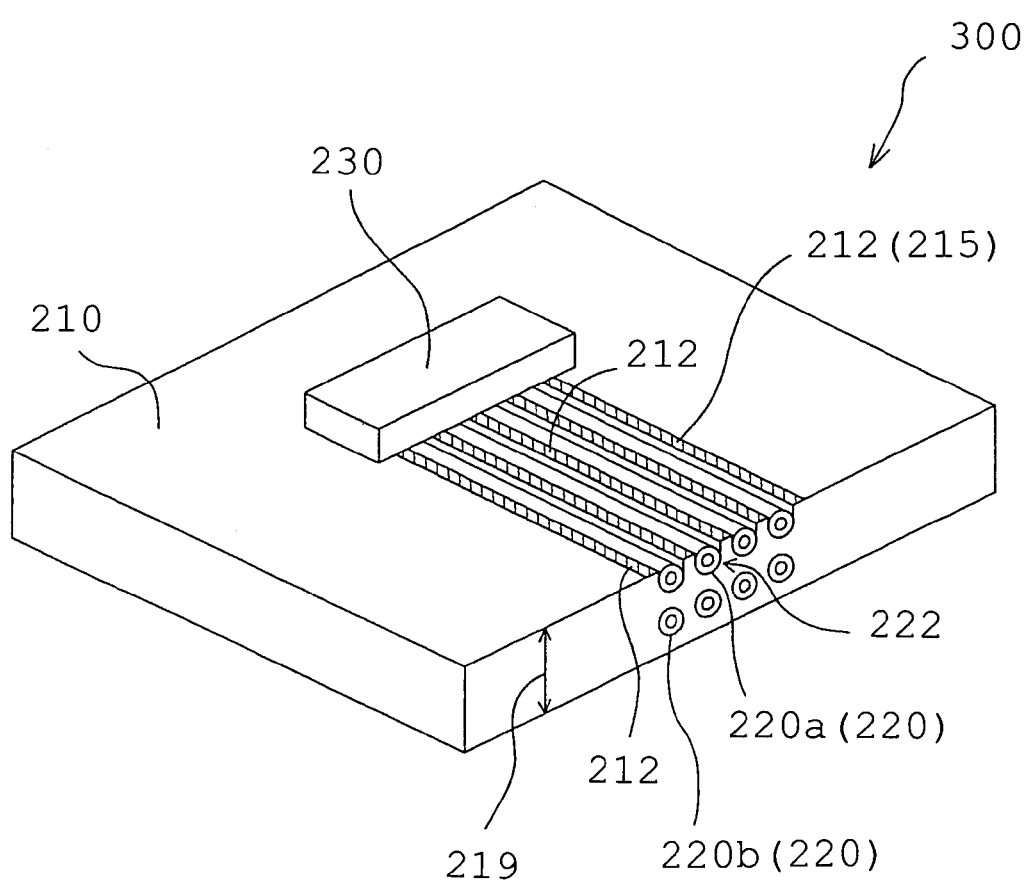
FIG. 34 is a perspective view schematically showing a configuration of a board with built-in optical transmission channel 300 according to Embodiment 5 of the present invention.

A board with built-in optical transmission channel 300 according to Embodiment 5 of the present invention is described below with reference to FIGS. 34-39. FIG. 34 is a perspective view schematically showing the configuration of the board with built-in optical transmission channel 300 of Embodiment 5.

The board with built-in optical transmission channel 300 of Embodiment 5 comprises: a board 210; circuit patterns 215 including a plurality of wirings 212 formed on the board 210; and a plurality of optical transmission channels 220 (220a, 220b) embedded in the board 210. The optical transmission channel 220a and the optical transmission channel 220b are arranged in different hierarchies in the depth direction 219 of the board 210. Thus, the optical transmission channels 220 are in multi-layer arrangement. An optical element 230 is arranged above the end portion of each optical transmission channel 220 (220a, 220b). A part (wirings 212) of the circuit patterns 215 formed on the upper surface of the board 210 are electrically connected to the optical element 230. A positioning marker (not shown) for the optical element 230 similar to the positioning reference planes 103a-103c described in FIG. 50 is formed on the board 210. The circuit patterns 215 includes also the positioning marker. The thickness direction of the board according to the present invention corresponds to the depth direction 219 of the board 210, for example.

In Embodiment 5, grooves 222 are formed between the wirings 212, while optical transmission channels 220 are arranged in the grooves 222. In the example shown in FIG. 34, the grooves 222 are shown that correspond to the optical fibers (optical waveguides) 220a in the upper row. However, other grooves may also be present that correspond to the optical fibers (optical waveguides) 220b in the lower row. This example shows a two stage configuration (220a, 220b). However, a three or more stage configuration may be used. The optical transmission channels 220 in Embodiment 5 are optical fibers, and hence Embodiment 5 is described for the case of optical fibers.

When viewed from the above of the board 210 (viewed from the normal direction of the board 210) 212, the optical fibers 220 are arranged between the wirings 212 and adhered with adhesives or the like, such as to contact with the wirings 212. As described above, in Embodiment 5, the optical fibers 220 are arranged in the grooves 222 formed between the wirings 212, and are built in the board 210. In other words, the grooves 222 formed between the wirings 212 serves as mounting sections for the optical fibers 220. In Embodiment 5, the uppermost portions of the optical fibers 220 are substantially in plane with the upper surface (that is, the upper surface of the wirings 212) of the circuit patterns 215.

An optical element 230 is mounted on the board with built-in optical transmission channel (board with built-in optical fiber) 300 shown in FIG. 34. This optical element is electrically connected to the wirings 212, and optically connected to the optical fibers 220 (220a, 220b). In Embodiment 5, the optical element 230 is arranged above the optical fibers 220 (220a, 220b) or alternatively such as to substantially contact with the optical fibers 220a in the uppermost row.

The optical element 230 is a laser element such as a semiconductor laser, or a photo receiving element such as a photo-diode. In this example, the optical element 230 is a vertical-cavity surface-emitting laser (VCSEL). The light-emitting surface of the optical element (VCSEL) 230 is opposing to the surface of the board 210. The light-emitting surface has a plurality of light emission points. In case that the optical element 230 is a photo receiving element, the photo receiving surface of the optical element 230 is opposing to the surface of the board 210. The photo receiving surface has a plurality of photo reception points.

The board 210 is composed of a material containing resin. In Embodiment 5, the material constituting the board 210 is composed of a composite material containing resin (such as a thermosetting resin and a thermoplastic resin) and inorganic filler. In this embodiment, a thermosetting resin is used as the resin for the composite material.

Without using inorganic filler, the board 210 may be composed solely of thermosetting resin. The thermosetting resin is an epoxy resin or the like. When added, the inorganic filler is $Al_2O_3$, $SiO_2$, MgO, BN, AlN, or the like. The addition of inorganic filler permits the control of various physical properties (such as the thermal expansion coefficient). Thus, the board 210 is preferably composed of such a composite material containing inorganic filler. In Embodiment 5, inorganic filler of 100 weight units or more (preferably 140-180 weight units) is contained relative to the thermosetting resin of 100 weight units.

The role of inorganic filler is as follows. When $Al_2O_3$, BN, or AlN is added as inorganic filler, the thermal conductivity of the board 210 is improved.

Further, when an appropriate inorganic filler is selected, the thermal expansion coefficient can be adjusted. In case that the thermal expansion coefficient is rather increased by the resin component, the addition of $SiO_2$, AlN, or the like can decrease the thermal expansion coefficient.

In an appropriate case, when MgO is added, the thermal conductivity is improved while the thermal expansion coefficient is increased.

Further, when $Si_2O$ (especially, amorphous $SiO_2$) is added, the thermal expansion coefficient is decreased while the dielectric constant is reduced.

Figure 35:
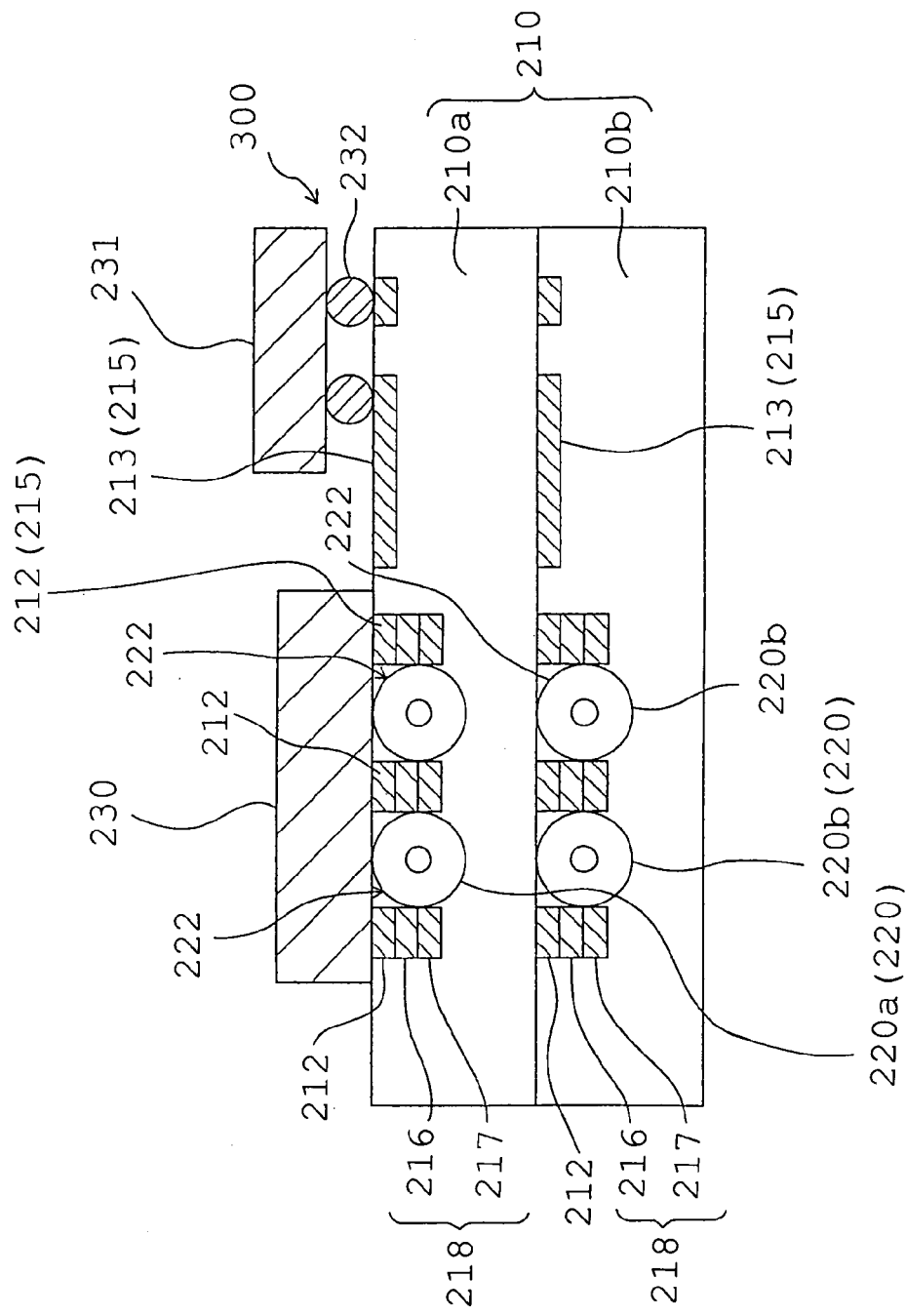
FIG. 35 is a sectional view schematically showing a configuration of a board with built-in optical transmission channel 300 according to Embodiment 5 of the present invention.

FIG. 35 is a sectional view schematically showing an example of the configuration of the board with built-in optical transmission channel (board with built-in optical fiber) 300 of Embodiment 5.

The board with built-in optical transmission channel 300 shown in FIG. 35 is formed from a board 210 obtained by stacking a sub-board 210a with a sub-board 210b. Grooves 222 are formed both in the sub-boards 210a and 210b. Optical fibers 220 (220a, 220b) are arranged in the grooves 222. Guide walls 218 formed by guide layers 216 and 217 are arranged under the wirings 212 included in the circuit patterns 215. The optical fibers 220 are arranged between the guide walls 218. A gap between each of the right and left guide walls 218 and the optical fiber 220 is preferably 0.1 μm or less, specifically.

Guiding means of the present invention corresponds to the guide wall 218, for example.

The wirings 212 on the sub-board 210a are electrically connected to the optical element 230. In this example, wirings 213 other than the wirings 212 are also formed in the circuit patterns 215. An electronic components (such as a semiconductor element) 231 is electrically connected to the wiring 213 on the sub-board 210a.

The electronic component 231 is connected to the wirings 213 via solder balls 232. The wirings 213 in the sub-board 210b can be connected to the circuit patterns 215 on the sub-board 210a through via holes (not shown). In this case, the board 210 composed of the sub-boards 210a and 210b can be used as a multi-layered board. The wirings 213 on the sub-board 210b may be omitted.

In the board with built-in optical transmission channel 300 of Embodiment 5, the optical transmission channels (optical fibers) 220 are accommodated and fixed in the grooves 222. Thus, the optical element 230 can easily be positioned with the optical fibers 220 (220a, 220b). This is because the grooves 222 are formed with reference to a part (212) of the circuit patterns 215, and because the optical element 230 can also be aligned with the reference. In the configuration shown in FIG. 35, the sub-boards 210a and 210b are fabricated by stacking. Thus, a multi-stage optical transmission channel board having two, three, or more stages can be fabricated easily. At the same time, a multi-layer electricity wiring board can be fabricated.

Figure 36:
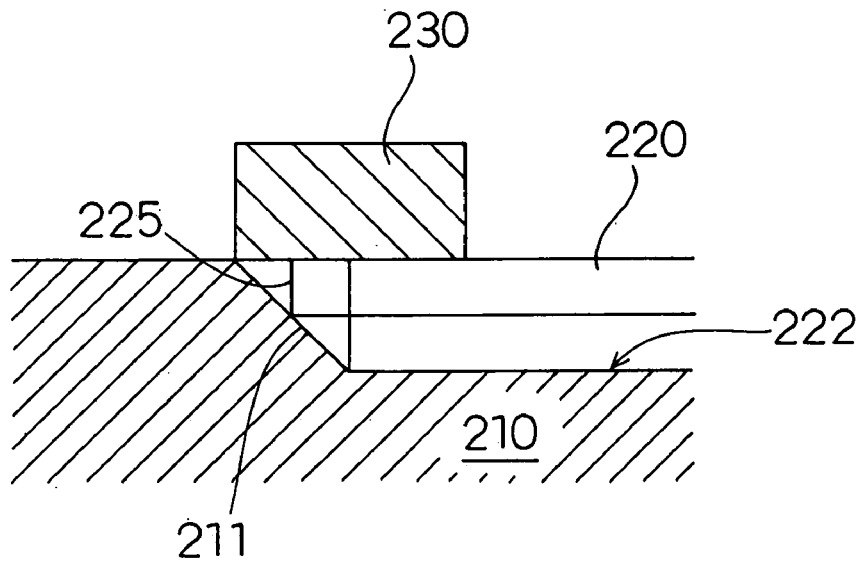
FIG. 36 is a sectional view illustrating optical connection between an optical element 230 and an optical transmission channel 220.

The optical element 230 and the optical fibers 220 can be optically connected to each other, for example, as shown in FIG. 36 which is a schematic partial sectional view of the configuration of FIG. 35. That is, as shown in FIG. 36, a reflection surface (inclined surface) 211 is formed in a part of the board 210. Then, optical connection by light (optical signals) 225 is achieved between the optical element 230 and the optical fibers 220 via the reflection surface 211. In an example, the reflection surface 211 is obtained by fabricating an inclined surface in the board 210 and then forming a metal layer (such as an Au layer) in the surface of the inclined surface. Alternatively, an optical component (mirror) having a reflection surface 211 may be placed on the board 210.

Figure 45A:
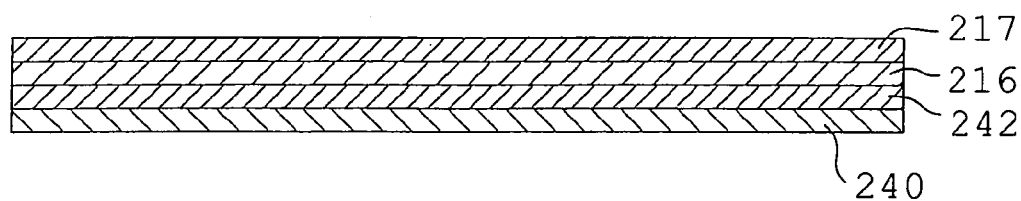
FIG. 45(a) is a process sectional view illustrating another fabrication method for a board with built-in optical transmission channel 300.

More specifically, the reflection surface 211 can be formed as follows. In an example, an inclined surface is fabricated in advance by etching, machining, or the like. Then, a new step of forming a metal layer (such as an Au layer) on the surface of the inclined surface is added before the step of FIG. 41(c) described later or between the steps of FIGS. 45(a)-45(c), or alternatively performed at the same time as these steps.

Figure 37:
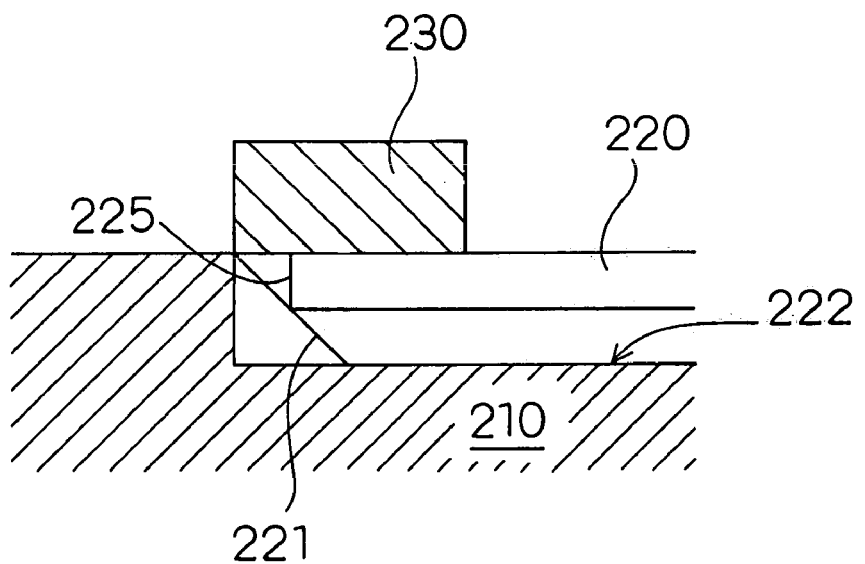
FIG. 37 is a sectional view illustrating optical connection between an optical element 230 and an optical transmission channel 220.

Alternatively, as shown in FIG. 37 which is a schematic partial sectional view of the configuration of FIG. 35, an end face 221 of the optical fiber 220 is cut aslant (such as a 45° cut). Then, light 225 is reflected in the end face 221 so that optical connection is achieved between the optical element 230 and the optical fiber 220. In this case, as shown in this figure, the end face 221 of the optical fiber 220 is in an opposite direction relative to the upper surface of the board 210 where the optical element 230 is mounted.

In the configuration shown in FIGS. 36 and 37, the optical element 230 and the optional fiber 220 are closely contacted, but a transparent medium may be present in the path of the light 225 between the optical element 230 and the optical fiber 220. The transparent medium may be air, glass, transparent resin, or the like. Similarly to Embodiments 1-4, the transparent resin is a material permitting optical connection between the optical element 230 and the optical fiber 220 and transmitting light having a wavelength of 850 nm, 1330 nm, and 1550 nm, or the like. More specifically, the transparent resin may be polyimide, epoxy aramid, or the like. Alternatively, an optical component (such as a lens) may be arranged between the optical element 230 and the optical fiber 220.

Figure 38:
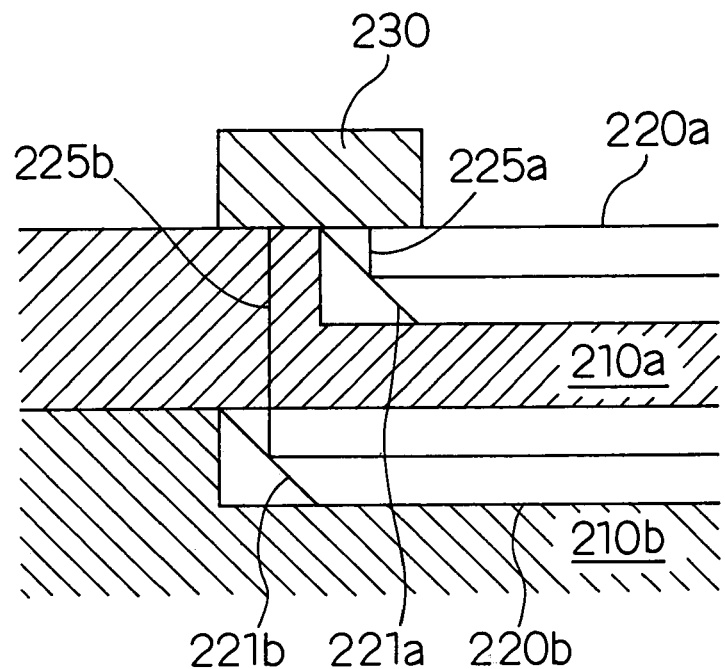
FIG. 38 is a sectional view illustrating optical connection between an optical element 230 and a plurality of optical transmission channels 220a and 220b.

In the case of multi-stage optical transmission channels, the configuration is as shown in FIG. 38 which is a schematic sectional view showing the configuration of FIG. 35. Here, the optical fibers 220a in the upper row are optically connected to the optical element 230 by light 225a. On the other hand, the optical fibers 220b in the lower row is optically connected to the optical element 230 by light 225b. In this case, as shown in the figure, the end faces 221a and 221b of the optical fibers 220 are in an opposite direction relative to the upper surface of the board 210 where the optical element 230 is mounted.

The end faces 221a and 221b of the optical fibers 220 can be positioned with a sufficient accuracy as follows. In an example shown in FIG. 42(b), when the patterns 214 on the lower layer sub-board 210b are optically aligned with the patterns 214 on the upper sub-board 210a, accurate stacking is achieved. In another example shown in FIG. 46, when the upper and lower optical fibers 220a and 220b are closely adhered with each other in advance, accurate positioning is achieved in the end faces 221a and 221b.

Figure 39:
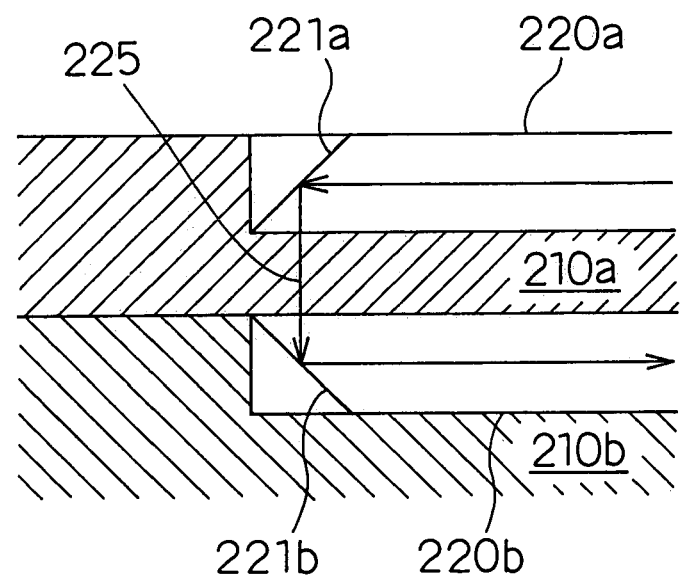
FIG. 39 is a sectional view illustrating optical connection between an optical transmission channel 220a and an optical transmission channel 220b.

Further, as shown in FIG. 39 which is a schematic sectional view showing the configuration of FIG. 35, in place of the optical connection with the optical element 230, optical connection between the optical fibers 220a in the upper row and the optical fibers 220b in the lower row is also achieved.

Although detail is described later, in the fabrication of the board with built-in optical transmission channel (board with built-in optical fiber) 300 of Embodiment 5, prepared are sub-boards 210a and 210b on the surface of each of which circuit patterns 215 including a plurality of wirings 212 are formed and in each of which optical transmission channels (optical fibers) 220 are arranged in the grooves 222 formed between the wirings 212. Then, the sub-boards 210a and 210b are stacked with each other. Each of the sub-boards 210a and 210b can be fabricated using a transfer method. More specifically, a metal layer formed on a supporting board (see numeral 240 in FIG. 40) is patterned so that the circuit patterns 215 including a plurality of the wirings 212 are formed. Then, optical fibers 220 (220a or 220b) are arranged between the wirings 212 of the circuit patterns 215. After that, a material containing resin is deposited on the supporting board so as to cover the circuit patterns 215 and the optical fibers 220 (220a or 220b). Then, when the supporting board is removed, the circuit patterns 215 are exposed in the surface so that each of the sub-boards 210a and 210b is obtained.

A fabrication method for the board with built-in optical fiber 300 according to Embodiment 5 of the present invention is described below in detail.

First, as shown in FIG. 40(a), a carrier sheet (transfer formation material) 240 on which a metal layer 242 is formed is prepared. The metal layer 242 is composed of copper or the like. The carrier sheet 240 serves as a supporting board, and is composed of a metallic foil (a copper or aluminum foil) or a resin sheet. The thickness of the metal layer 242 and the thickness of the carrier sheet 240 are approximately 3-50 μm and approximately 25-200 μm, respectively.

Figure 40:
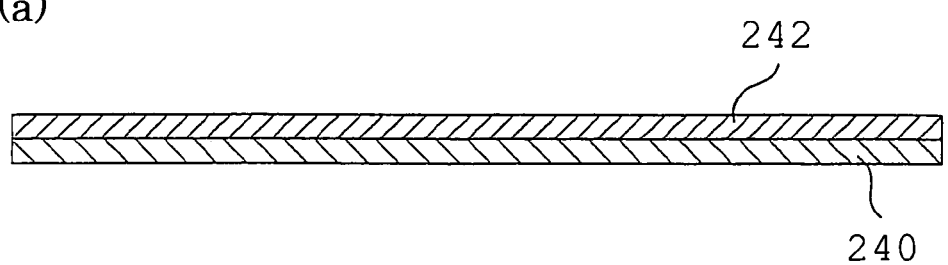
FIG. 40(a) is a process sectional view illustrating a fabrication method for a board with built-in optical transmission channel 300.
FIG. 40(b) is a process sectional view illustrating a fabrication method for a board with built-in optical transmission channel 300.
FIG. 40(c) is a process sectional view illustrating a fabrication method for a board with built-in optical transmission channel 300.
FIG. 40(d) is a process sectional view illustrating a fabrication method for a board with built-in optical transmission channel 300.
Figure 40B:
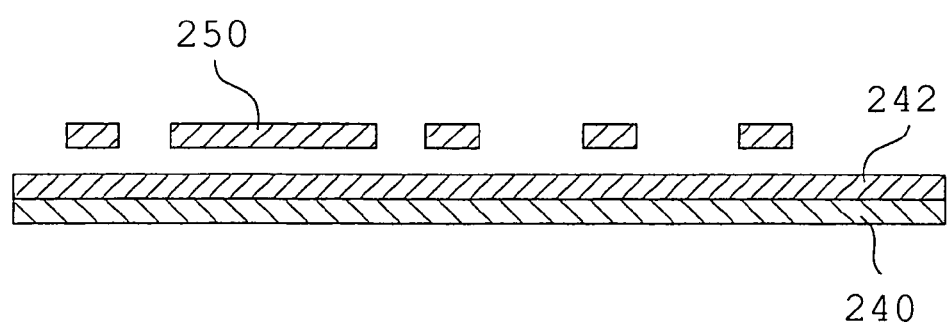
Figure 40C:
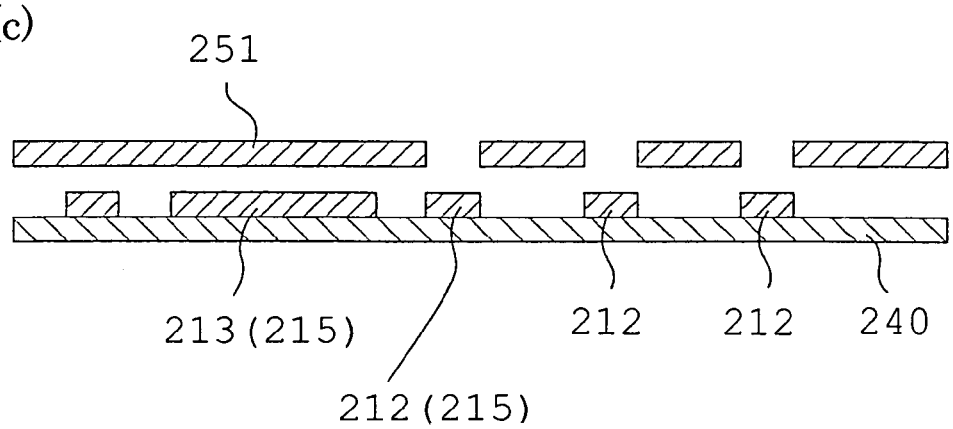

Then, as shown in FIG. 40(b), a mask 250 corresponding to the circuit patterns 215 is arranged above the metal layer 242, and then the metal layer 242 is etched. As a result, as shown in FIG. 40(c), the circuit patterns 215 including the wirings 212 are formed. In the example shown in the figure, in addition to the wirings 212 located in the surrounding portion of the optical fibers 220, other wirings 213 are shown as wirings included in the circuit patterns 215.

After the patterning by the above-mentioned etching, walls used as a guide for arranging the optical fibers 220 are formed in at least a part of the circuit patterns 215. In Embodiment 5, the guide walls are formed on the wirings 212.

Figure 40D:
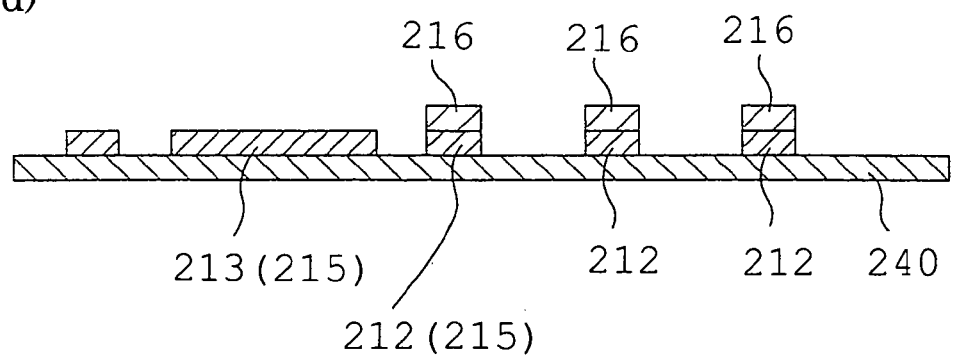

More specifically, as shown in FIG. 40(c), the mask 251 having an opening in the portion of the wirings 212 is arranged above the carrier sheet 240. Then, as shown in FIG. 40(d), a layer (guide layer) 216 for constituting the guide walls is deposited on the wirings 212. The guide layer 216 is composed of metal or the like and formed by sputtering. In place of the sputtering, vapor deposition, plating, a deposition method, or the like may be used. In Embodiment 5, the reason why the guide layer 216 is formed by sputtering is that this method has good shape reproducibility.

Figure 41A:
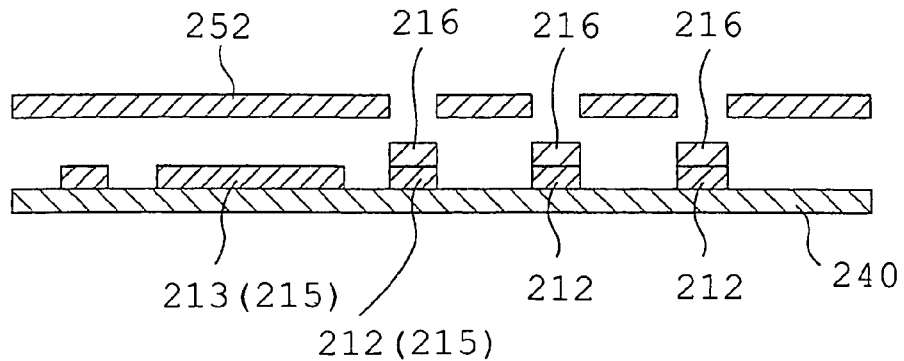
FIG. 41(a) is a process sectional view illustrating a fabrication method for a board with built-in optical transmission channel 300.

In case that the height of the guide walls for supporting the optical fibers 220 is insufficient even after the guide layer 216 is deposited, a mask 252 is arranged above the guide layer 216 as shown in FIG. 41(a), and then another guide layer 217 is deposited on the guide layer 216 serving as a base. The mask 252 may be the same as the previous mask 251. The material constituting the guide layer 217 may be the same as, or different from, the material constituting the guide layer 216. The material constituting the guide layers 216 and 217 is not limited to a metal, and may be another material (such as a resin).

Figure 41B:
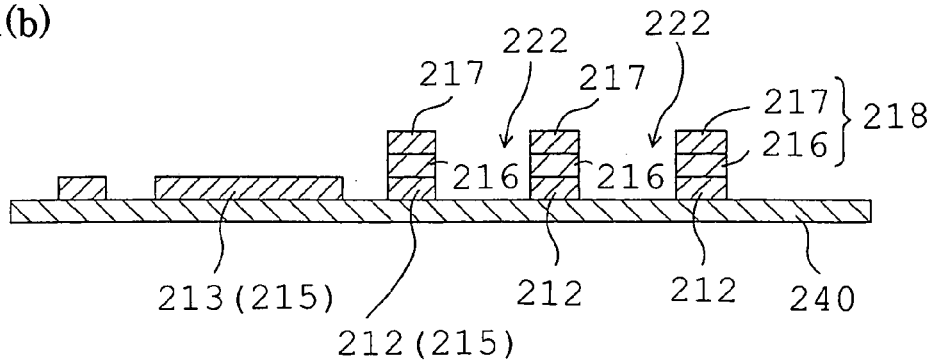
FIG. 41(b) is a process sectional view illustrating a fabrication method for a board with built-in optical transmission channel 300.
Figure 41C:
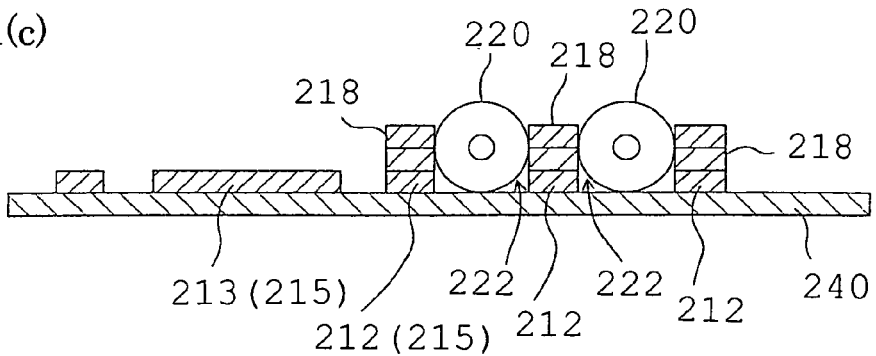
FIG. 41(c) is a process sectional view illustrating a fabrication method for a board with built-in optical transmission channel 300.
Figure 41D:
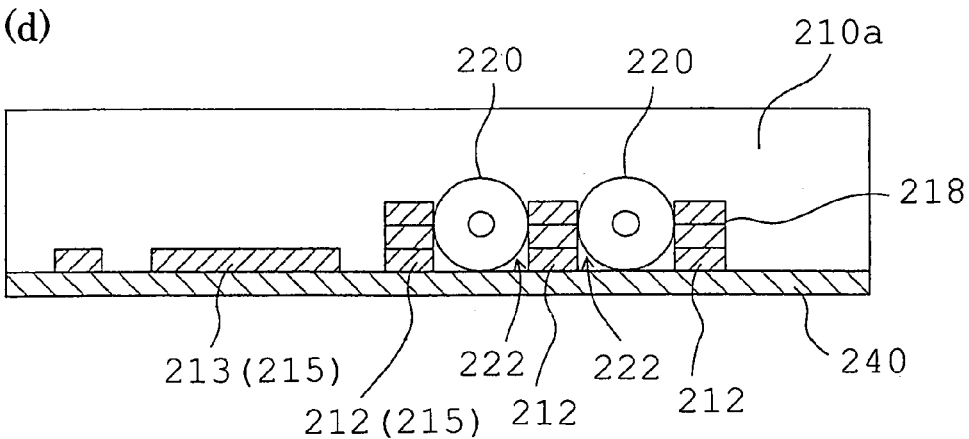
FIG. 41(d) is a process sectional view illustrating a fabrication method for a board with built-in optical transmission channel 300.

As such, as shown in FIG. 41(b), the guide walls 218 formed by the guide layer 216 and the guide layer 217 are fabricated on the wirings 212. The guide walls 218 form grooves 222 (optical fiber mounting sections) in which optical fibers 220 are mounted. In Embodiment 5, the sum of the thickness values of the wiring 212 and the guide wall 218 (guide layers 216 and 217) is greater than the radius of the optical fiber 220 arranged between the guide walls 218. This simplifies fabrication and improves accuracy.

Then, as shown in FIG. 41(*c*), the optical fibers 220 are arranged between the guide walls 218 (between the wirings 212). In other words, the optical fibers 220 are arranged into the grooves 222 formed between the guide walls 218 (or the wirings 212). In Embodiment 5, the optical fibers 220 are arranged such as to contact with the carrier sheet (supporting board) 240. Further, the optical fibers 220 are arranged between the wirings 212 such as to contact with the guide walls 218.

Then, as shown in FIG. 41(*d*), the material containing resin is deposited on the carrier sheet 240 so that a sub-board (insulating board) 210*a* is formed. This deposition is performed such that the circuit patterns 215 and the optical fibers 220 are covered. That is, the material constituting the sub-board 210*a* covers: the circuit patterns 215 including the wirings 212 and 213; the guide walls 218; and the optical fibers 220.

Figure 42A:
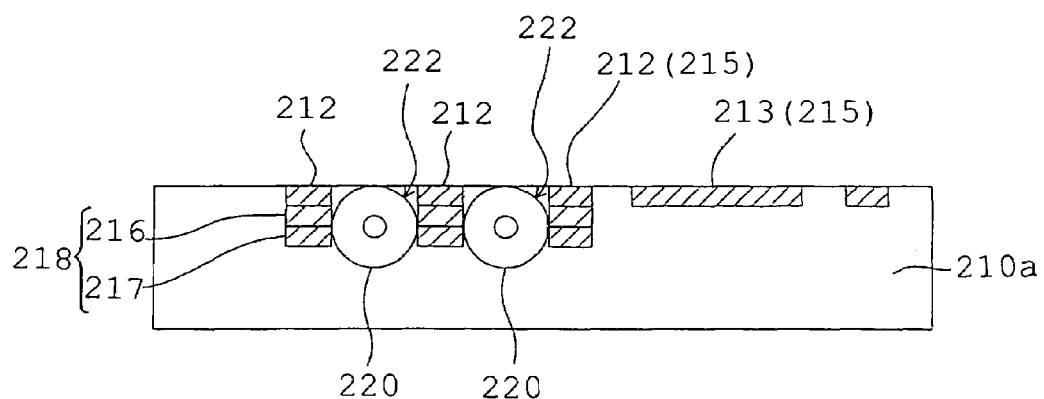
FIG. 42(a) is a process sectional view illustrating a fabrication method for a board with built-in optical transmission channel 300.
Figure 42B:
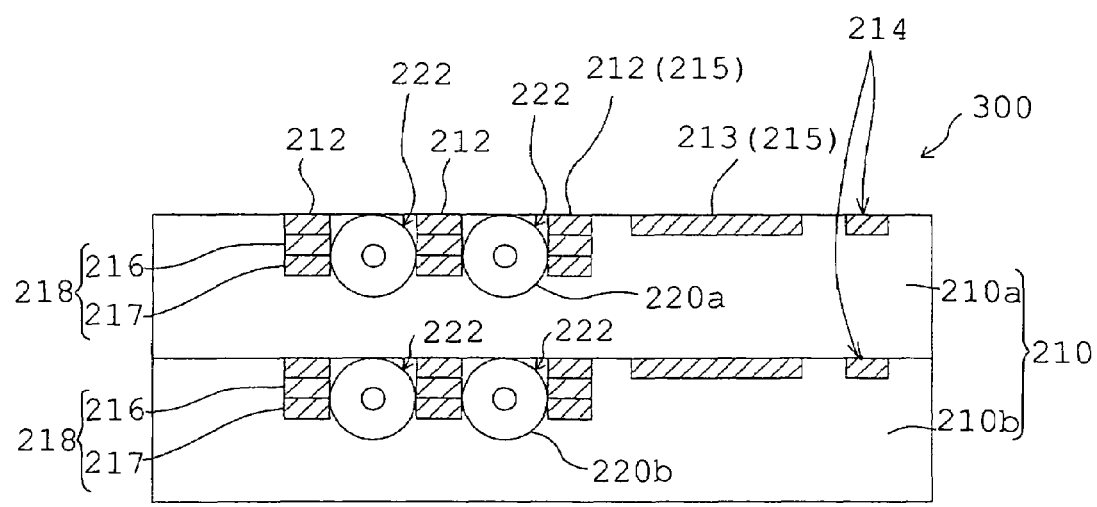
FIG. 42(b) is a process sectional view illustrating a fabrication method for a board with built-in optical transmission channel 300.

Then, as shown in FIG. 42(*a*), the sub-board 210*a* is reversed, and then the carrier sheet 240 is removed. That is, the circuit patterns 215 on the carrier sheet 240 are separated so that the transfer is completed. Alternatively, the sub-board 210*a* may be reversed after the removal of the carrier sheet 240. According to the same fabrication process, the sub-board 210*b* is also fabricated. Then, the sub-board 210*a* and the sub-board 210*b* are stacked with each other, so that a board with built-in optical transmission channel 300 of Embodiment 5 is obtained as shown in FIG. 42(*b*).

These steps shown in FIGS. 40, 41, and 42(*a*) correspond substantially to the steps of FIGS. 2, 3, and 4(*a*) described In Embodiment 1. That is, each of the sub-boards 210*a* and 210*b* can be fabricated by the fabrication method for an optical transmission channel board of Embodiment 1.

On completion of the board with built-in optical transmission channel 300, an optical element 230 is mounted on the wirings 212 of the sub-board 210*a*, while an electronic component 231 is mounted on the wirings 213. As a result, the configuration shown in FIG. 35 is obtained.

The optical element 230 is a semiconductor laser or the like. In Embodiment 5, this optical element is arranged above the optical fibers 220, or alternatively such as to substantially contact with the optical fibers 220. The optical element [? 30?] 230 may be a photo receiving element (such as a photo-diode) The electronic component 231 mounted on the portion of the wirings 213 of the circuit patterns 215 is a semiconductor element (such as a logic LSI). The electronic component (semiconductor element) 231 is electrically connected to the wirings 213 through solder balls 232. A first step of the present invention corresponds to the step shown in FIGS. 40(*a*)-40(*c*), for example. A second step of the present invention corresponds to the step shown in FIGS. 40(*d*)-41(*b*), for example. A third step of the present invention corresponds to the step shown in FIGS. 41(*c*)-42(*a*), for example. A fourth step of the present invention corresponds to the step shown in FIG. 42(*b*), for example.

The step shown in FIGS. 40(*a*)-40(*c*) is described for an exemplary case that "all of the circuit patterns are formed" in the first step of the present invention. The step shown in FIGS. 40(*d*)-41(*b*) is described for an exemplary case that "the guiding means is formed using said circuit patterns" in the second step of the present invention.

In the fabrication method of Embodiment 5, in the state shown in FIG. 41(*d*), the circuit patterns 215 and the optical fibers 220 contact with the carrier sheet 240. Thus, in the state shown in FIG. 42(*a*), the upper surface of the circuit patterns 215 and the uppermost portions of the optical fibers 220 are substantially in plane. Further, the resin surface (accurately, the surface composed of a composite material) of the sub-board 210*a*, the upper surface of the circuit patterns 215, and the uppermost portions of the optical fibers 220 are substantially in plane. Thus, the sub-board 210*a* and the sub-board 210*b* are easily stacked with each other in the step shown in FIG. 42(*b*).

Further, according to the fabrication method of Embodiment 5, the optical fibers 220 can easily be embedded (built) in the board 210 (or the sub-boards 210*a* and 210*b*). Thus, the optical fibers 220 are protected more appropriately in comparison with the case that the optical fibers 220 are formed on the surface of the board 210.

When the optical element 230 is mounted on the portion of the wirings 212 of the circuit patterns 215, pad sections may be formed in the wirings 212 so that the pad sections may be connected to the element terminals of the optical element 230 by wire bonding. Nevertheless, the wire bonding connection is disadvantageous in high-speed characteristics.

Figure 43:
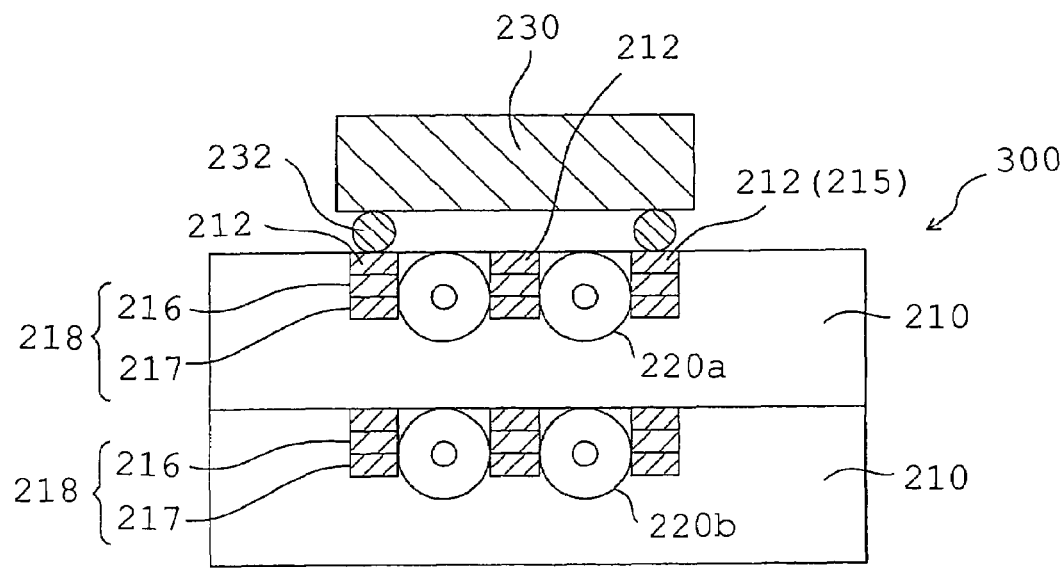
FIG. 43 is a sectional view schematically showing a configuration of a board with built-in optical transmission channel 300 on which an optical element 230 is mounted.

Accordingly, as shown in FIG. 43, the connection between the optical element 230 and the wirings 212 is preferably achieved by flip chip mounting or the like using connection members (such as bumps and solder balls) 232. In this case, lands are formed in the portions of the wirings 212 contacting with the connection members 232.

Figure 44:
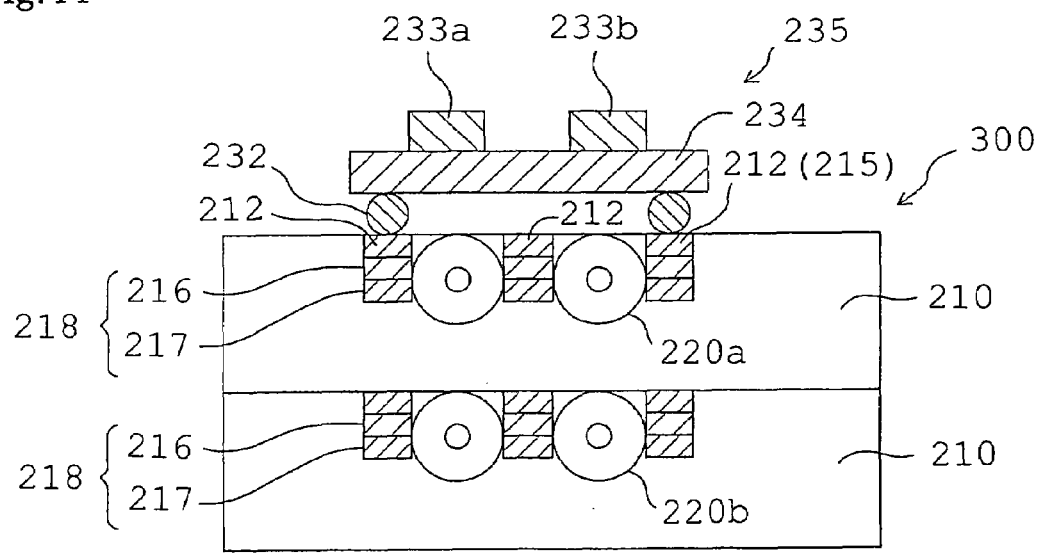
FIG. 44 is a sectional view schematically showing a configuration of a board with built-in optical transmission channel 300 on which an MCM 235 is mounted.

As shown in FIG. 44, the optical fibers 220 may be optically connected to optical elements within an MCM (multi-chip module) 235, in place of a single optical element 230.

In this example, a plurality of electronic components 233*a* and 233*b* are mounted on an interposer 234 so that an MCM 235 is constructed. At least one of the electronic components 233*a* and 233*b* is an optical element. Both of the electronic components 233*a* and 233*b* may be laser elements (semiconductor lasers), or alternatively photo receiving elements (photo-diodes). Alternatively, these electronic components may be a combination of a laser element and a photo receiving element. An opening is formed in the part of the interposer 234 corresponding to the optical path between the optical element and the optical fiber. An optical component (such as a lens) may be arranged in the position of the opening. The optical elements 233*a* and 233*b* may be mounted on the back side of the interposer 234.

A board with built-in optical transmission channel 300 according to Embodiment 5 of the present invention may be fabricated in alternative steps shown in FIGS. 45(*a*)-45(*c*). This method is described below in detail.

First, starting from the state shown in FIG. 40(*a*), guide layers 216 and 217 are stacked on a metal layer 242 so that the state shown in FIG. 45(*a*) is achieved. Then, as shown in FIG. 45(*b*), using a mask 253 for defining the shape of grooves 222, these layers (217, 216, 242) are etched so that grooves 222 are formed.

Then, etching is performed using a predetermined mask, so that guide walls 218 and circuit patterns 215 (including wirings 212 and wirings 213) are formed as shown in FIG. 45(*c*). FIG. 45(*c*) is similar to FIG. 41(*b*). Thus, after the steps following FIG. 41(*c*) are performed, a board with built-in optical transmission channel 300 shown in FIGS. 42(*b*) and 35 is obtained.

Figure 45B:
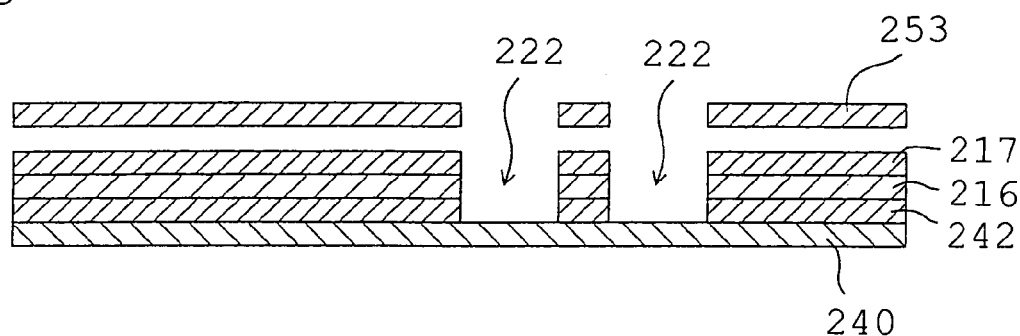
FIG. 45(b) is a process sectional view illustrating another fabrication method for a board with built-in optical transmission channel 300.

"A first step of forming a part of circuit patterns" and "a second step of forming together with at least a part of the circuit patterns" according to the present invention correspond to the step shown in FIG. 45(b) as an example, and are performed substantially at the same time.

Figure 45C:
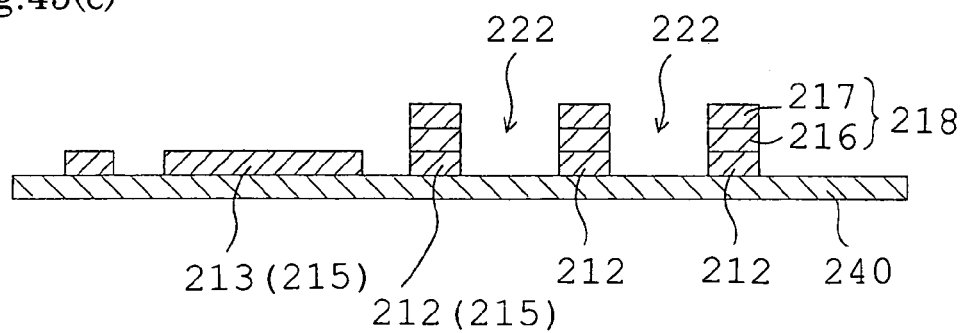
FIG. 45(c) is a process sectional view illustrating another fabrication method for a board with built-in optical transmission channel 300.

In this example, the grooves 222 have been formed first, and then the circuit patterns 215 has been formed. However, in the state of FIG. 45(b), the grooves 222 and the circuit patterns 215 may be simultaneously formed (in the same step) using a mask corresponding to the circuit patterns 215. Then, unnecessary portions of the guide layers 216 and 217 may be removed so that the guide wall 218 may be fabricated as shown in FIG. 45(c). At that time, unnecessary portions of the guide layers 216 and 217 need not be removed, and may be kept embedded in the board 210. As described above, these two guide layers 216 and 217 need not be used. Instead, the guide layers 216 and 217 may be formed from the same material as a single guide layer.

Figure 46:
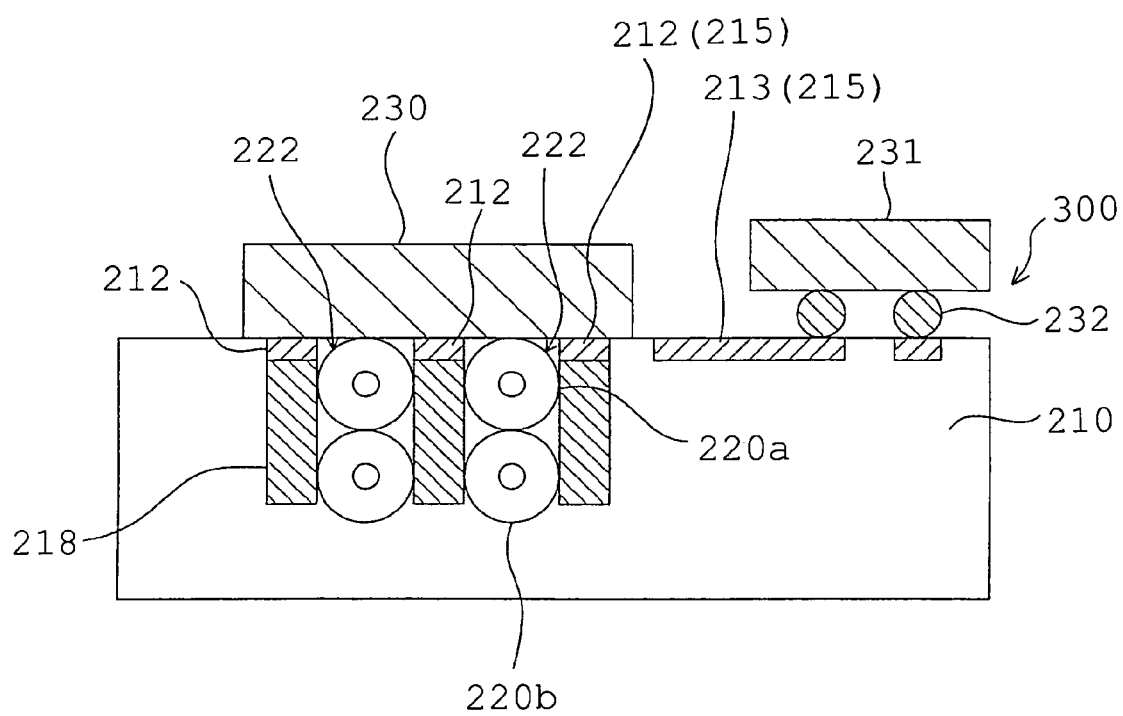
FIG. 46 is a sectional view schematically showing another configuration of a board with built-in optical transmission channel 300.

Another fabrication method may be used in which the depth of the groove 222 is increased (that is, the height of the guide wall 218 is increased) so that two optical fibers 220 are inserted in the groove 222 in the vertical direction. As a result, a board with built-in optical transmission channel 300 shown in FIG. 46 is obtained. This another fabrication method according to an embodiment of the present invention, together with a board with built-in optical transmission channel according to an embodiment of the present invention, is described below with reference mainly to FIG. 46.

The difference of the fabrication method shown in FIG. 46 from the previous one mentioned above is that a plurality of optical fibers 220a and 220b are stacked between the guide walls 218 in the thickness direction of the board 210. By virtue of this, in the board with built-in optical transmission channel 300 shown in FIG. 46, the distance to the optical element is reduced so that the optical loss is advantageously reduced. FIG. 46 shows the case that two optical fibers are stacked and embedded. However, the present invention is not limited to this. Three or more optical fibers may be stacked. In this case, the height of the guide wall 218 is adjusted appropriately.

Figure 47:
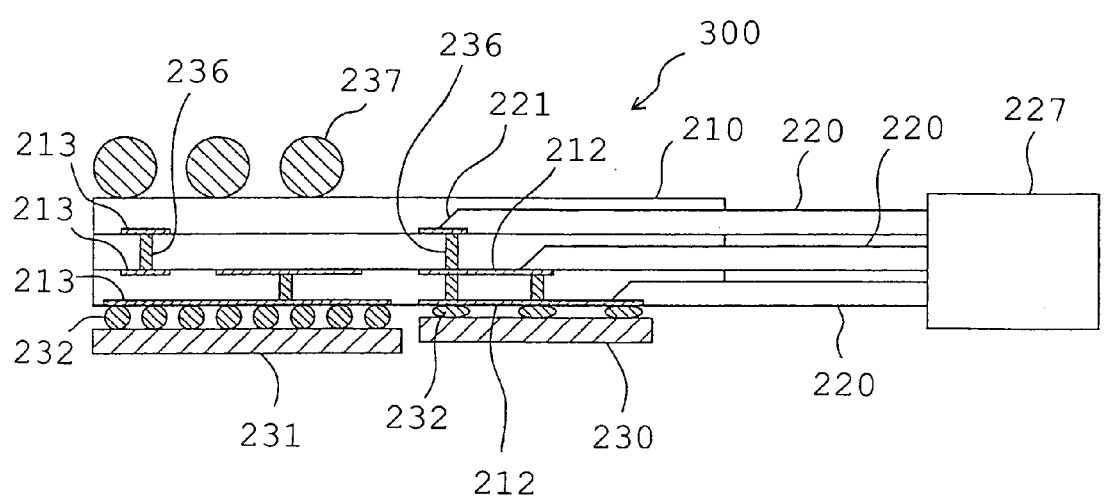
FIG. 47 is a sectional view schematically showing a configuration of a board with built-in optical transmission channel 300.

FIG. 47 is a sectional view schematically showing another configuration of a board with built-in optical transmission channel (optical module) 300 of Embodiment 5.

The board with built-in optical transmission channel 300 shown in FIG. 47 serves as a multi-layered circuit board as well as a multi-stage optical transmission channel board. Optical transmission channels (optical fibers) 220 extended from the board 310 are connected to an optical connector 227. Each wiring layer 212 or 213 in the board 210 is electrically connected through interlayer connection members (via holes) 236. An optical element (VCSEL) 230 and a semiconductor element (LSI chip) 231 are mounted on one surface of the board 210 through connection members 232. An electric input and output section (electric I/O) 237 is formed in the other surface of the board 210. As described above, a transparent medium (such as air, glass, transparent resin, or an optical member) is present between the optical fibers 220 (more specifically, end faces 221 of the optical fibers 220) and the optical element 230.

Figure 48:
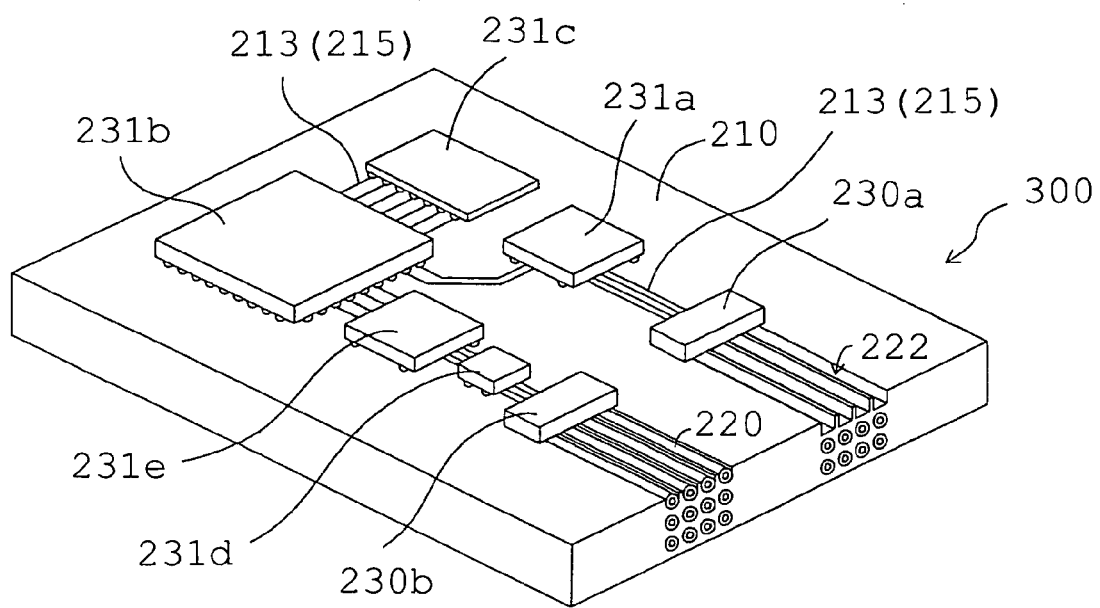
FIG. 48 is a perspective view schematically showing a configuration of an optical module (data processing apparatus) employing a board with built-in optical transmission channel 300.

In the board with built-in optical transmission channel 300 of Embodiment 5, other wirings (such as the wiring layer 213) can be formed together with the wirings 212 easily by a transfer method. Thus, electronic components other than optical elements (semiconductor elements) can be mounted similarly to the case of a typical printed circuit board. FIG. 48 shows an optical module in which electronic components 231 (231a, 231b, 231c, 231d, 231e) in addition to optical elements 230a and 230b are mounted on a board with built-in optical transmission channel 300. The board with built-in optical transmission channel (optical module) shown in FIG. 48 can be used as a data processing apparatus. This module is described below in further detail.

The optical element 230a is a laser element and more specifically a vertical-cavity surface-emitting laser (VCSEL) On the other hand, the optical element 230b is a photo receiving element and more specifically a photo-diode having a plurality of photo-receiving sections. For the simplicity of understanding the configuration of Embodiment 5, grooves 222 are shown without optical fibers 220 in the uppermost row optically connected to the optical element 230a. The wirings 212 are also omitted.

A driver IC 231a is connected to the laser element 230a. The driver IC 231a is connected to an LSI chip (such as a logic LSI like an image processing LSI) 231b. The LSI chip 231b is connected to a memory chip 231c. A photo receiving element 230b is connected to the LSI chip 231b via an amplifier (preamplifier) 231d and an amplifier 231e. These electronic components 231 are mutually connected through the wirings 213 in the circuit patterns 215. The optical fibers 220 in the configuration shown in FIG. 48 can also be connected to the optical connector 227 as shown in FIG. 47.

The wirings 213 may be fabricated on the board 210 in a step other than the transfer process (such as in a separate and later step). Nevertheless, from the perspective of fabrication procedure, cost, and the like, it is efficient to fabricate the wirings 213 in the same step as the wirings 212, as in the fabrication method of Embodiment 5.

The optical module (data processing apparatus) 300 shown in FIG. 48 can perform optical transmission through the optical fibers 220. Thus, mass data can be transmitted at a high speed. Further, the method of Embodiment 5 allows such an optical module (data processing apparatus) 300 to be fabricated in a simple process. This reduces the fabrication cost. Thus, the cost can be reduced in optical modules presently used in optical communications (such as the Internet and telephone). This accelerates the spread of such optical modules.

Further, the cost reduction permits the use of economical optical transmission in within-the-board transmission (level 2) in the communication system apparatus 3000 shown in FIG. 52. This improves the speed of within-the-board transmission. As such, the present invention is applicable to the bookshelf type communication system apparatus 3000 shown in FIG. 52. Further, the optical transmission channel board or optical module 100 of the present invention may be used as a main apparatus such as a next-generation high performance optical I/O module and a data processing apparatus (like an image processing apparatus).

Figure 49:
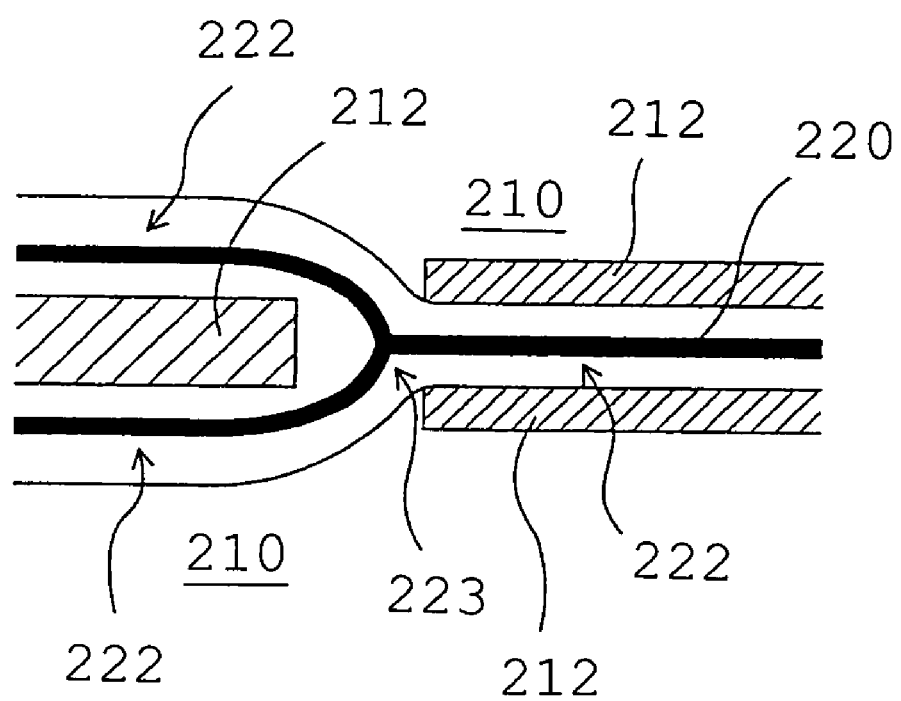
FIG. 49 is a plan view schematically showing a configuration of an optical fiber 220 having a Y branching section 223.

In the board with built-in optical transmission channel 300 of Embodiment 5, the optical fibers 220 are embedded in the board 210. Thus, even in case that the optical fibers 220 have a Y branching section 23 as shown in FIG. 49 and hence are fragile, the present embedding enforces the optical fibers 220. More specifically, as shown in FIG. 49, the optical fiber 20 is embedded into the groove 222 (optical fiber 220 mounting section) formed by the wirings 212 and the guide walls 218 under the wirings. When such optical fibers 220 having a Y branching section 23 are used, an optical module suitable for wavelength multiplexing is provided.

Embodiment 5 has been described for an exemplary case of a board with built-in optical transmission channel employing optical fibers. However, in place of the optical fibers, optical waveguides composed of plane waveguides (PLCs) may be used as optical transmission channels 220. When optical waveguides composed of plane waveguides (PLCs) are used as optical transmission channels, a sub-board provided with a plurality of grooves and a sub-board 210*a* shown in FIG. 42(*a*) are prepared on the plane waveguide (PLC) side. Then, these sub-boards are stacked with each other by a predetermined method such as by using a positioning marker (see FIG. 42(*b*)). This improves manufacturability. When wirings 213 are formed on the plane waveguide (PLC) side, or when the optical element 230 is mounted on the plane waveguide (PLC) side, fabrication and the centering problem are further simplified. Nevertheless, from the perspective of cost, the use of optical fibers based on the fabrication method of Embodiment 5 would be advantageous over the use of the optical waveguides composed of plane waveguides (PLCS).

Embodiment 5 has been described for the case that a single optical transmission channel is arranged in the thickness direction in each sub-board. However, the present invention is not limited to this. A plurality of optical transmission channels may be arranged in the thickness direction of the board. In this case, each sub-board has a configuration, for example, shown in FIG. 46.

Embodiment 5 has been described for the case that a plurality of optical transmission channels are arranged also in the direction substantially perpendicular to the thickness direction of the board. However, the present invention is not limited to this. A single optical transmission channel may be arranged in the above-mentioned perpendicular direction.

Embodiment 5 has been described mainly for the case that guide walls are used as guiding means. However, the present invention is not limited to this. Recesses such as grooves may be formed on a sub-board formed in advance so that optical transmission channels may be arranged in the recesses. In this case, in comparison with the configuration of Embodiment 5 employing guide walls, accuracy can be somewhat poor in the centering for the optical connection. In spite of this disadvantage, without using the guiding means of the present invention, optical transmission channels may be arranged in predetermined sections such as grooves formed independently of the formation of the circuit patterns. In this case, the sub-boards are stacked with each other using a positioning marker or the like.

Embodiment 5 has been described for the case that the guide layers 216-217 are stacked on the wirings 212 so that the guide walls 218 are formed as shown in FIGS. 40 and 41. However, the present invention is not limited to this. For example, the steps of FIGS. 40(*d*)-41(*b*) may be omitted. In this case, the wirings 212 serve also as the guide layer 218, and has a thickness sufficient for positioning the optical fibers 220.

Embodiment 5 has been described for the case that a part of the circuit patterns and the guide walls 218 are formed simultaneously in FIG. 45(*b*), and further that the guide layer 218 and the wirings 213 are formed in FIG. 45(*c*). However, the present invention is not limited to this. For example, all the circuit patterns and all guide walls 218 may be formed in FIG. 45(*b*). In this case, the circuit patterns and the guide walls have the same thickness.

Embodiment 5 has been described for the case that the board with built-in optical transmission channel of the present invention is provided with optical elements or the like. However, the present invention is not limited to this. For example, optical elements or the like need not be mounted, and such a structure is sufficient that permits mounting.

Embodiment 5 has been described mainly for the case that the optical element is a surface type light emitting or receiving element or a photo receiving element. However, the present invention is not limited to this. An edge-emitting or receiving element may be used.

The positioning markers (included in the circuit patterns) and the guide walls are preferably formed using the same mask.

As described above, in an example, a board with built-in optical transmission channel of the present invention comprises: a board; circuit patterns formed on said board and having a plurality of wirings; and a plurality of optical transmission channels embedded in said board. A plurality of said optical transmission channels are arranged in different hierarchies in the depth direction of said board. An optical element is arranged above an end portion of each of said optical transmission channels.

In an example, a part of said circuit patterns formed on said board and said optical element are preferably connected electrically to each other.

In a preferred embodiment, a groove is formed between said wirings so that said optical transmission channel is arranged in said groove.

In a preferred embodiment, said optical transmission channels in said different hierarchies is arranged within a single groove.

In a preferred embodiment, said board is formed by stacking a plurality of sub-boards. A groove is formed in each of said sub-boards. Said optical transmission channel is arranged in said groove.

In a preferred embodiment, a plurality of said optical transmission channels are optical fibers.

In an example, said board is preferably composed of a composite material containing resin and inorganic filler.

Said optical element is preferably a vertical-cavity surface-emitting laser.

In a preferred embodiment, the light-emitting surface of said vertical-cavity surface-emitting laser is opposing to the surface of said board. Said light-emitting surface has a plurality of light emission points.

In a preferred embodiment, said end of said optical transmission channel is cut into an angle of approximately 45 degrees.

In a preferred embodiment, an inclined surface for optically connecting said end of said optical transmission channel to said optical element is provided in the vicinity of said end of said optical transmission channel.

Space or a transparent medium is present between said optical element and an end portion of said optical transmission channel.

In an example, a data processing apparatus according to the present invention comprises: an above-mentioned board with built-in optical transmission channel; and a semiconductor element mounted on said board with built-in optical transmission channel.

In an example, a fabrication method for a board with built-in optical transmission channel according to the present invention comprises: a step of preparing sub-boards on the surface of which circuit patterns including a plurality of wirings are formed and in which optical transmission channels are arranged in a groove formed between said wirings; and a step of stacking said sub-boards.

In an example, another fabrication method for a circuit board with built-in optical transmission channel according to the present invention comprises: a step of forming a plurality of grooves in the surface of a board; and a step of arranging at least two optical transmission channels in the depth direction in each of said grooves.

In a preferred embodiment, said optical transmission channels are optical fibers.

In an embodiment, performed are: a step (a) of patterning a metal layer formed on a supporting board and thereby forming circuit patterns including a plurality of wirings; a step (b) of arranging an optical transmission channel (such as an optical fiber) between the wirings of said circuit pattern; a step (c) of depositing a material containing resin on said supporting board such as to cover said circuit patterns and said optical transmission channel; and a step (d) of removing said supporting board.

In a preferred embodiment, said step (a) includes: a step of preparing a supporting board and a metal layer formed on said supporting board; and a step of etching said metal layer using a mask corresponding to the circuit patterns.

In an embodiment, a step of forming walls used as a guide for arranging an optical transmission channel, in at least a part of said circuit patterns is further performed before said step (b).

In an embodiment, in said step (b), said optical transmission channel is arranged such as to contact with said supporting board.

In a preferred embodiment, said optical transmission channel is arranged between said wiring such as to contact with said walls.

In an embodiment, said material containing resin is a composite material containing resin and inorganic filler.

In an embodiment, the uppermost portion of said optical fiber is substantially in plane with the upper surface of said circuit patterns after said step (d).

In an embodiment, a step of mounting an electronic component electrically connected to said circuit patterns is further performed after said step (d).

The present invention has been described above with reference to the preferred embodiments. This description does not limit the scope of the present invention, and hence various modifications can be made.

An optical transmission channel board and a fabrication method for an optical transmission channel board according to the present invention simplifies the fabrication process. That is, a centering process between an optical element and an optical transmission channel is advantageously simplified or even avoided. Thus, the present invention is useful as a data processing apparatus or the like employing an optical transmission channel board. Further, in an optical transmission channel board according to the present invention, a centering process between an optical element and an optical transmission channel is advantageously simplified or even avoided. This reduces the fabrication cost advantageously. Thus, the present invention is useful as a fabrication method for an optical transmission channel board or the like. Furthermore, a board with built-in optical transmission channel according to the present invention permits optical connection with an optical element, and advantageously realizes efficient arrangement of a large number of optical transmission channels. Thus, the present invention is useful as a board with built-in optical transmission channel, a data processing apparatus, a fabrication method for a board with built-in optical transmission channel, or the like.

What is claimed is:

1. An optical transmission channel board comprising:
   an optical transmission channel;
   a retention board for retaining said optical transmission channel; and
   circuit patterns which are formed on said retention board and a part of which is used as an electric circuit,
   wherein said optical transmission channel is positionally regulated by said part of said circuit patterns,
   said circuit patterns are formed in a predetermined thickness along a thickness direction of said retention board, and
   said optical transmission channel is arranged in a middle of said circuit patterns serving as guide walls.

2. The optical transmission channel board according to claim 1, wherein said optical transmission channel is arranged between said guide walls formed by said circuit patterns.

3. The optical transmission channel board according to claim 1 or 2, wherein said optical transmission channel is arranged such as to contact substantially with said guide walls.

4. The optical transmission channel board according to claim 1, wherein said optical transmission channel is embedded in said retention board, while an uppermost part of said optical transmission channel is substantially arranged in plane with an upper surface of said retention board.

5. The optical transmission channel board according to claim 1, wherein said circuit pattern has a portion lower than an upper surface of said retention board.

6. The optical transmission channel board according to claim 5, wherein said portion lower than an upper surface of said retention board is a land part.

7. The optical transmission channel board according to claim 1, wherein said optical transmission channel is an optical fiber.

8. A data processing apparatus comprising:
   an optical transmission channel board according to claim 1;
   at least one semiconductor element selected from a memory LSI and a logic LSI mounted on said optical transmission channel board; and
   a laser element and/or a photo receiving element mounted on said part of circuit patterns; wherein
   said optical transmission channel board has a plurality of said optical transmission channels.

* * * * *